US012620443B2

(12) United States Patent
Shiino et al.

(10) Patent No.: US 12,620,443 B2
(45) Date of Patent: May 5, 2026

(54) SEMICONDUCTOR MEMORY DEVICE WITH OPERATION-SPECIFIC PASS VOLTAGES

(71) Applicant: Kioxia Corporation, Tokyo (JP)

(72) Inventors: Yasuhiro Shiino, Fujisawa Kanagawa (JP); Kenrou Kikuchi, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 213 days.

(21) Appl. No.: 18/446,106

(22) Filed: Aug. 8, 2023

(65) Prior Publication Data

US 2024/0079065 A1      Mar. 7, 2024

(30) Foreign Application Priority Data

Sep. 7, 2022    (JP) .................................. 2022-142343

(51) Int. Cl.
  *G11C 16/10*      (2006.01)
  *G11C 16/08*      (2006.01)
  *G11C 16/16*      (2006.01)
  *G11C 16/26*      (2006.01)

(52) U.S. Cl.
  CPC ............ *G11C 16/102* (2013.01); *G11C 16/08* (2013.01); *G11C 16/16* (2013.01); *G11C 16/26* (2013.01)

(58) Field of Classification Search
  CPC ....... G11C 16/102; G11C 16/08; G11C 16/16; G11C 16/26; G11C 5/025; G11C 11/5628; G11C 16/10; G11C 16/0483; G11C 16/3459
  See application file for complete search history.

(56) References Cited

U.S. PATENT DOCUMENTS

| | | | |
|---|---|---|---|
| 10,249,372 B2 | 4/2019 | Chen | |
| 2017/0084340 A1* | 3/2017 | Lee ......................... | G11C 16/16 |
| 2020/0013470 A1 | 1/2020 | Nishikawa | |
| 2021/0012840 A1* | 1/2021 | Shim .................. | G11C 16/3427 |
| 2021/0264984 A1 | 8/2021 | Yamabe | |
| 2022/0036954 A1* | 2/2022 | Yu ........................ | G11C 11/5628 |

FOREIGN PATENT DOCUMENTS

| | | | | |
|---|---|---|---|---|
| JP | 2018160301 A | 10/2018 | | |
| JP | 2020009511 A | 1/2020 | | |
| JP | 2021047939 A | 3/2021 | | |
| WO | WO-2022125142 A1 * | 6/2022 | ......... | G11C 16/3459 |

* cited by examiner

*Primary Examiner* — Amir Zarabian
*Assistant Examiner* — Bradley S Coon
(74) *Attorney, Agent, or Firm* — Kim & Stewart LLP

(57)      ABSTRACT

According to one embodiment, a semiconductor memory device includes a first memory sub-block and a second memory sub-block arranged in a first direction and a control circuit. The first memory sub-block includes a first memory cell and a first word line connected to the first memory cell. The second memory sub-block includes a second memory cell and a second word line connected to the second memory cell. The control circuit executes a first and a second write operation on the first memory cell. In the first write operation, the control circuit applies a program voltage to the first word line and a first unselect write voltage to the second word line. In the second write operation, the program voltage is applied to the first word line and a second unselect write voltage is applied to the second word line.

7 Claims, 44 Drawing Sheets

Ch $SGD_U(V_{SS})$          $SGD_S(V_{SG})$ $WL_U(V_{READ})$ $WL_U(V_{READ})$ $WL_U(V_{READ})$ $WL_U(V_{READ})$ $WL_U(V_{READ})$ $WL_U(V_{READ})$ $L_{MCA2}$          $WL_U(V_{READ})$ $WL_U(V_{READ})$ $WL_U(V_{READ})$ $WL_U(V_{READ})$ $WL_U(V_{READK})$          PG $WL_S(V_{CGR})$ $L_{MCA1}$          $WL_U(V_{READK})$ $WL_U(V_{READ})$ $WL_U(V_{READ})$ $SGS(V_{SG})$ $112(V_{SRC})$

SUe      SUd      SUc      SUb      SUa $BLK_{t,b}$

BL_W(V_SRC)

Cb

Ch

SGD_U(V_SS)

SGD_S(V_SGD)

WL_U(V_PASS)

WL_U(V_PASS)

WL_U(V_PASS)

WL_U(V_PASS)

WL_U(V_PASS)

WL_U(V_PASS)

WL_U(V_PASS)

WL_U(V_PASS2)

WL_U(V_PASS2)

WL_U(V_PASS3)

WL_S(V_PGM)

WL_U(V_PASS3)

WL_U(V_PASS1)

WL_U(V_PASS1)

SGS(V_SS)

112(V_SRC)

L_MCA2

L_MCA1

PG

SUe    SUd    SUc    SUb    SUa

BLK_tb

FIG. 16

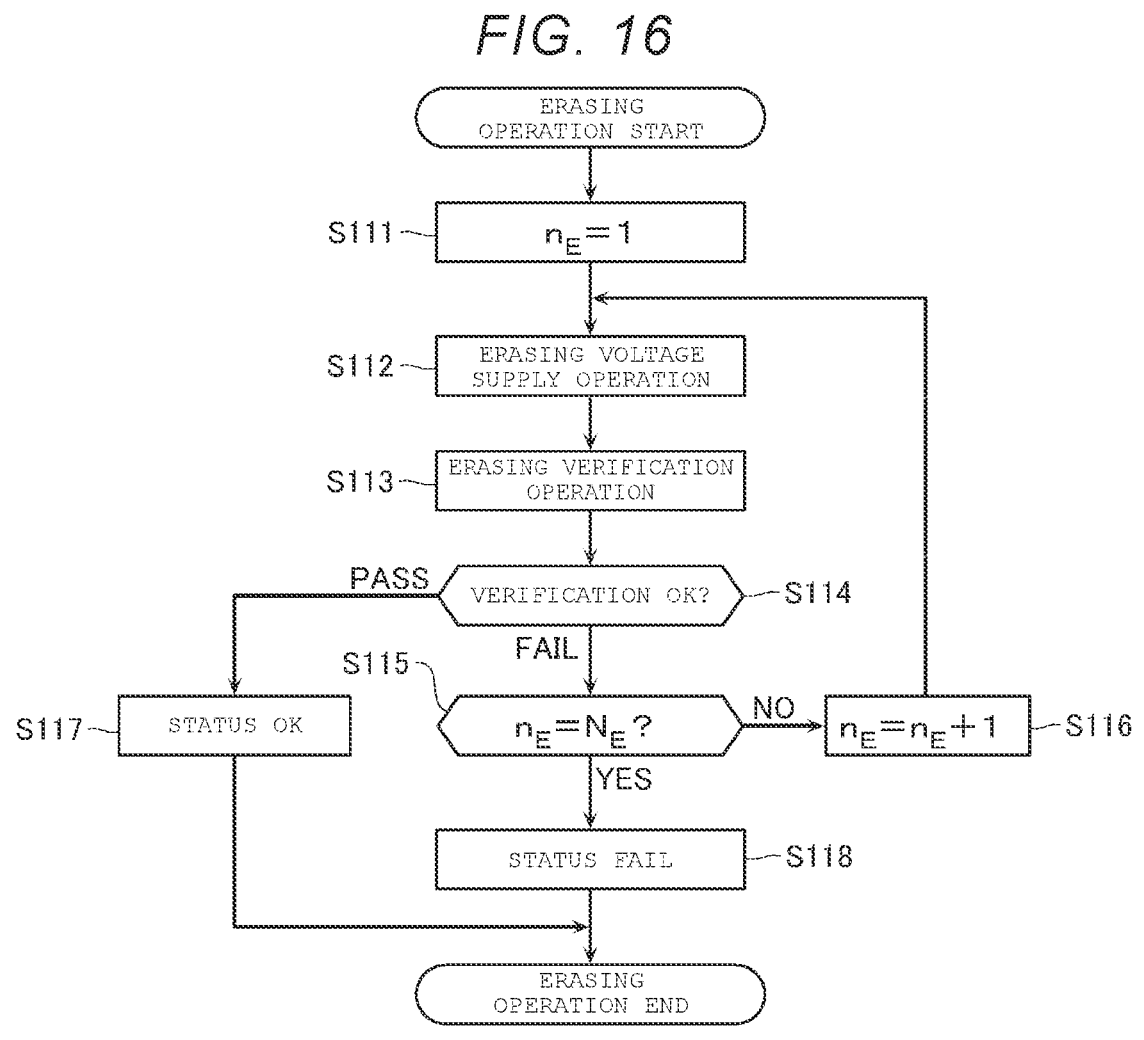

```
                ┌─────────────────────┐
                │      ERASING        │
                │  OPERATION START    │
                └─────────────────────┘
                          │
                          ▼
  S111 ──┐     ┌─────────────────────┐
         └────▶│      n_E = 1        │
               └─────────────────────┘
                          │
                          ▼◀──────────────────────────────┐
  S112 ──┐     ┌─────────────────────┐                    │
         └────▶│  ERASING VOLTAGE    │                    │
               │  SUPPLY OPERATION   │                    │
               └─────────────────────┘                    │
                          │                               │
                          ▼                               │
  S113 ──┐     ┌─────────────────────┐                    │
         └────▶│ ERASING VERIFICATION│                    │
               │     OPERATION       │                    │
               └─────────────────────┘                    │
                          │                               │
           PASS           ▼                               │
  ◀────────────────< VERIFICATION OK? >── S114            │
  │                       │                               │
  │                      FAIL                             │
  │         S115 ──┐      ▼                               │
  │                └──< n_E = N_E? >──NO──▶┌─────────────┐│
  │  ┌───────────┐      │                 │ n_E=n_E+1   ├┘── S116
  └─▶│ STATUS OK │      │                 └─────────────┘
     └───────────┘     YES
  S117                   ▼
  │            ┌─────────────────────┐
  │            │    STATUS FAIL      ├── S118
  │            └─────────────────────┘
  │                       │
  └───────────────────────┤
                          ▼
                ┌─────────────────────┐
                │      ERASING        │
                │  OPERATION END      │
                └─────────────────────┘
```

BL(V$_{ERA}$)

Cb

Ch

SGD(V$_{ERA}$−V$_t$)

WL(V$_{SS}$)

WL(V$_{SS}$)

WL(V$_{SS}$)

WL(V$_{SS}$)

WL(V$_{SS}$)

WL(V$_{SS}$)

WL(V$_{SS}$)

WL(V$_{SS}$)

WL(V$_{SS}$)

WL(V$_{SS}$)

WL(V$_{SS}$)

WL(V$_{SS}$)

WL(V$_{SS}$)

WL(V$_{SS}$)

SGS(V$_{ERA}$−V$_t$)

112(V$_{ERA}$)

L$_{MCA2}$

L$_{MCA1}$

SUe    SUd    SUc    SUb    SUa

BLK$_{tb}$

● electron
○ hole

BL

Cb

Ch $SGD_U(V_{SS})$     $SGD_S(V_{SG})$ $WL(V_{VFYEr})$ $WL(V_{VFYEr})$ $WL(V_{VFYEr})$ $WL(V_{VFYEr})$ $WL(V_{VFYEr})$ $WL(V_{VFYEr})$ $WL(V_{VFYEr})$ $L_{MCA2}$ $WL(V_{VFYEr})$ $WL(V_{VFYEr})$ $WL(V_{VFYEr})$ $WL(V_{VFYEr})$ $WL(V_{VFYEr})$ $L_{MCA1}$ $WL(V_{VFYEr})$ $WL(V_{VFYEr})$ $SGS(V_{SG})$ $112(V_{SRC})$

SUe    SUd    SUc    SUb    SUa $BLK_{tb}$

*FIG. 21* electron
hole

BL

Cb

Ch

SGD$_U$(V$_{SS}$)

SGD$_S$(V$_{SG}$)

WL(V$_{VFYEr}$)

WL(V$_{VFYEr}$)

WL(V$_{VFYEr}$)

WL(V$_{VFYEr}$)

WL(V$_{VFYEr}$)

WL(V$_{VFYEr}$)

WL(V$_{VFYEr}$)

WL(V$_{READ}$)

WL(V$_{READ}$)

WL(V$_{READ}$)

WL(V$_{READ}$)

WL(V$_{READ}$)

WL(V$_{READ}$)

WL(V$_{READ}$)

SGS(V$_{SG}$)

112(V$_{SRC}$)

L$_{MCA2}$
SBLK$_S$

L$_{MCA1}$
SBLK$_U$

SUe     SUd     SUc     SUb     SUa

BLK$_{tb}$

SBLK$_S$

SBLK$_U$

FIG. 26A

SBLK$_U$

NOP

Er — WL111
Er — WL110
Er

Er
Er — WL57
Er — WL56

DWL
DWL

SBLK$_S$

ROP

SBLK$_U$

NOP

Er — WL111
Er — WL110
Er

R
R — WL57
R — WL56

DWL
DWL

SBLK$_S$

ROP

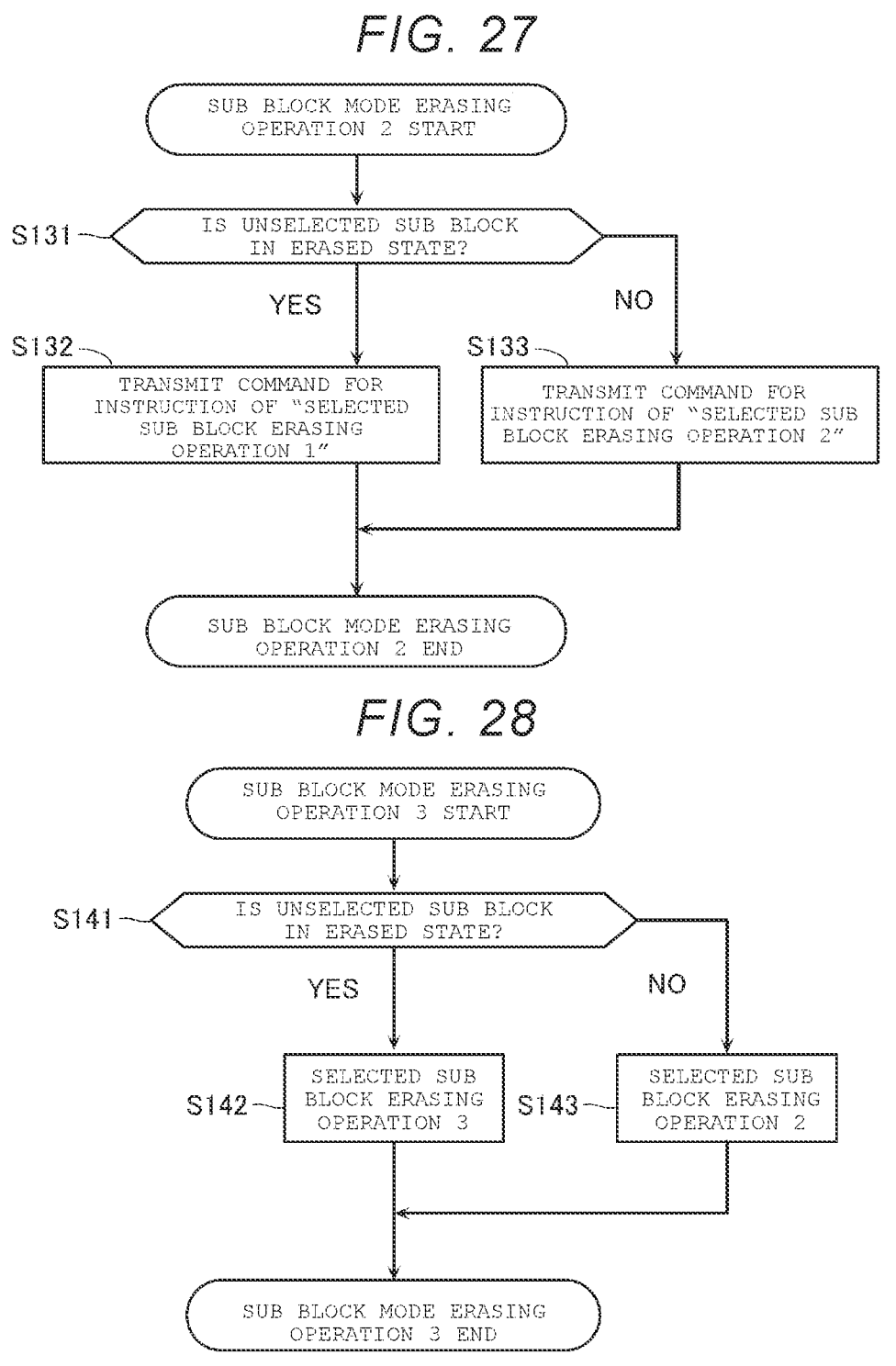

```
        ┌─────────────────────────────┐
        │   SUB BLOCK MODE ERASING     │
        │    OPERATION 2 START         │
        └─────────────────────────────┘
                      │
                      ▼
S131 ─◇─────────────────────────────◇────────┐
      │  IS UNSELECTED SUB BLOCK     │        │
      │     IN ERASED STATE?         │        │
      ◇─────────────────────────────◇        │
              │ YES               NO │        │
              ▼                      ▼        │
S132  ┌───────────────────┐  S133 ┌───────────────────┐
      │ TRANSMIT COMMAND  │       │ TRANSMIT COMMAND  │
      │ FOR INSTRUCTION   │       │ FOR INSTRUCTION   │
      │ OF "SELECTED SUB  │       │ OF "SELECTED SUB  │
      │ BLOCK ERASING     │       │ BLOCK ERASING     │
      │ OPERATION 1"      │       │ OPERATION 2"      │
      └───────────────────┘       └───────────────────┘
              │                      │
              │◄─────────────────────┘
              ▼
        ┌─────────────────────────────┐
        │   SUB BLOCK MODE ERASING     │
        │    OPERATION 2 END           │
        └─────────────────────────────┘
```

FIG. 28

```
        ┌─────────────────────────────┐
        │   SUB BLOCK MODE ERASING     │
        │    OPERATION 3 START         │
        └─────────────────────────────┘
                      │
                      ▼
S141 ─◇─────────────────────────────◇────────┐
      │  IS UNSELECTED SUB BLOCK     │        │
      │     IN ERASED STATE?         │        │
      ◇─────────────────────────────◇        │
              │ YES               NO │        │
              ▼                      ▼        │
S142  ┌───────────────┐  S143 ┌───────────────┐
      │ SELECTED SUB  │       │ SELECTED SUB  │
      │ BLOCK ERASING │       │ BLOCK ERASING │
      │ OPERATION 3   │       │ OPERATION 2   │
      └───────────────┘       └───────────────┘
              │                      │
              │◄─────────────────────┘
              ▼
        ┌─────────────────────────────┐
        │   SUB BLOCK MODE ERASING     │
        │    OPERATION 3 END           │
        └─────────────────────────────┘
```

● electron
○ hole

*FIG. 31*

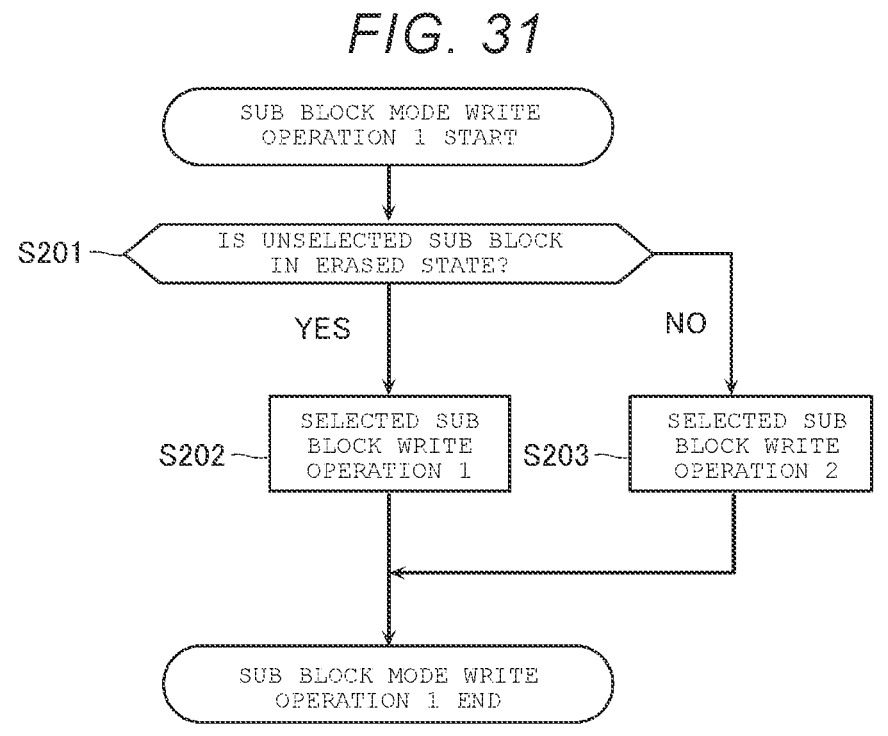

```
         ╭──────────────────────────╮
         │  SUB BLOCK MODE WRITE     │
         │    OPERATION 1 START      │
         ╰──────────────────────────╯
                      │
                      ▼
S201 ─── ◁═══════════════════════════▷
         │  IS UNSELECTED SUB BLOCK   │
         │    IN ERASED STATE?        │
         ◁═══════════════════════════▷───────────┐
                                                  │
              YES                          NO     │
                      │                           │
                      ▼                           ▼
        ┌─────────────────────┐      ┌─────────────────────┐
S202 ───│  SELECTED  SUB      │ S203 │  SELECTED  SUB      │
        │  BLOCK WRITE        │──────│  BLOCK WRITE        │
        │  OPERATION 1        │      │  OPERATION 2        │
        └─────────────────────┘      └─────────────────────┘
                      │                           │
                      │◄──────────────────────────┘
                      ▼
         ╭──────────────────────────╮
         │  SUB BLOCK MODE WRITE     │
         │    OPERATION 1 END        │
         ╰──────────────────────────╯
```

BL$_W$(V$_{SRC}$)

Cb

Ch

SGD$_U$(V$_{SS}$)

SGD$_S$(V$_{SGD}$)

WL$_U$(V$_{PASSL}$)

WL$_U$(V$_{PASSL}$)

WL$_U$(V$_{PASSL}$)

WL$_U$(V$_{PASSL}$)

WL$_U$(V$_{PASSL}$)

WL$_U$(V$_{PASSL}$)

WL$_U$(V$_{PASSL}$)

WL$_U$(V$_{PASS2}$)

WL$_U$(V$_{PASS2}$)

WL$_U$(V$_{PASS3}$)

WL$_S$(V$_{PGM}$)

WL$_U$(V$_{PASS3}$)

WL$_U$(V$_{PASS1}$)

WL$_U$(V$_{PASS1}$)

SGS(V$_{SS}$)

112(V$_{SRC}$)

L$_{MCA2}$
SBLK$_U$

L$_{MCA1}$
SBLK$_S$

PG

Er
Er
Er
Er
Er
Er
Er

SUe SUd SUc SUb SUa

BLK$_{tb}$

Z
X → Y

BL_W(V_SRC)

Cb

Ch

SGD_U(V_SS)

SGD_S(V_SGD)

WL_U(V_PASS4)

WL_U(V_PASS4)

WL_U(V_PASS4)

WL_U(V_PASS4)

WL_U(V_PASS4)

WL_U(V_PASS4)

WL_U(V_PASS4)

WL_U(V_PASS2)

WL_U(V_PASS2)

WL_U(V_PASS3)

WL_S(V_PGM)

WL_U(V_PASS3)

WL_U(V_PASS1)

WL_U(V_PASS1)

SGS(V_SS)

112(V_SRC)

L_MCA2 SBLK_U

L_MCA1 SBLK_S

PG

R R R R R R R

SUe   SUd   SUc   SUb   SUa

BLK_tb

SBLK$_S$

SBLK$_U$

*FIG. 36*

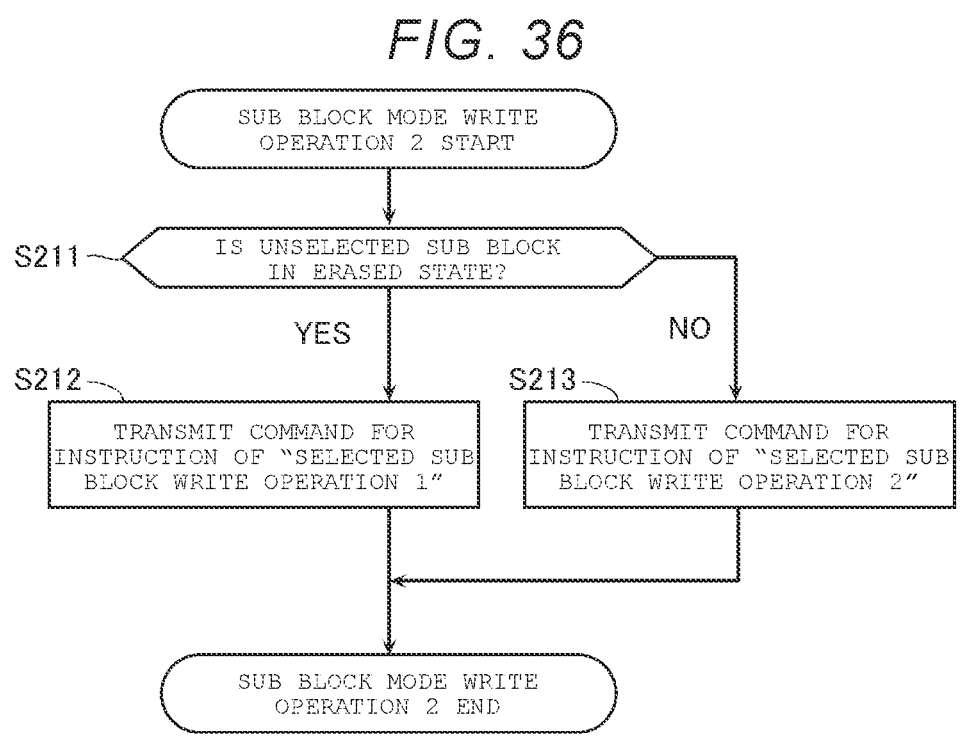

```
        ┌──────────────────────────────┐
        │   SUB BLOCK MODE WRITE       │
        │     OPERATION 2 START        │
        └──────────────────────────────┘
                      │
                      ▼
 S211 ─◁──────────────────────────────▷
         IS UNSELECTED SUB BLOCK
           IN ERASED STATE?
         │                          │
        YES                        NO
         │                          │
 S212    ▼              S213        ▼
 ┌───────────────────┐   ┌───────────────────┐
 │ TRANSMIT COMMAND  │   │ TRANSMIT COMMAND  │
 │ FOR INSTRUCTION   │   │ FOR INSTRUCTION   │
 │ OF "SELECTED SUB  │   │ OF "SELECTED SUB  │
 │ BLOCK WRITE       │   │ BLOCK WRITE       │
 │ OPERATION 1"      │   │ OPERATION 2"      │
 └───────────────────┘   └───────────────────┘
         │                          │
         ◀──────────────────────────┘
         ▼
 ┌──────────────────────────────┐
 │   SUB BLOCK MODE WRITE       │
 │     OPERATION 2 END          │
 └──────────────────────────────┘
```

*FIG. 37*

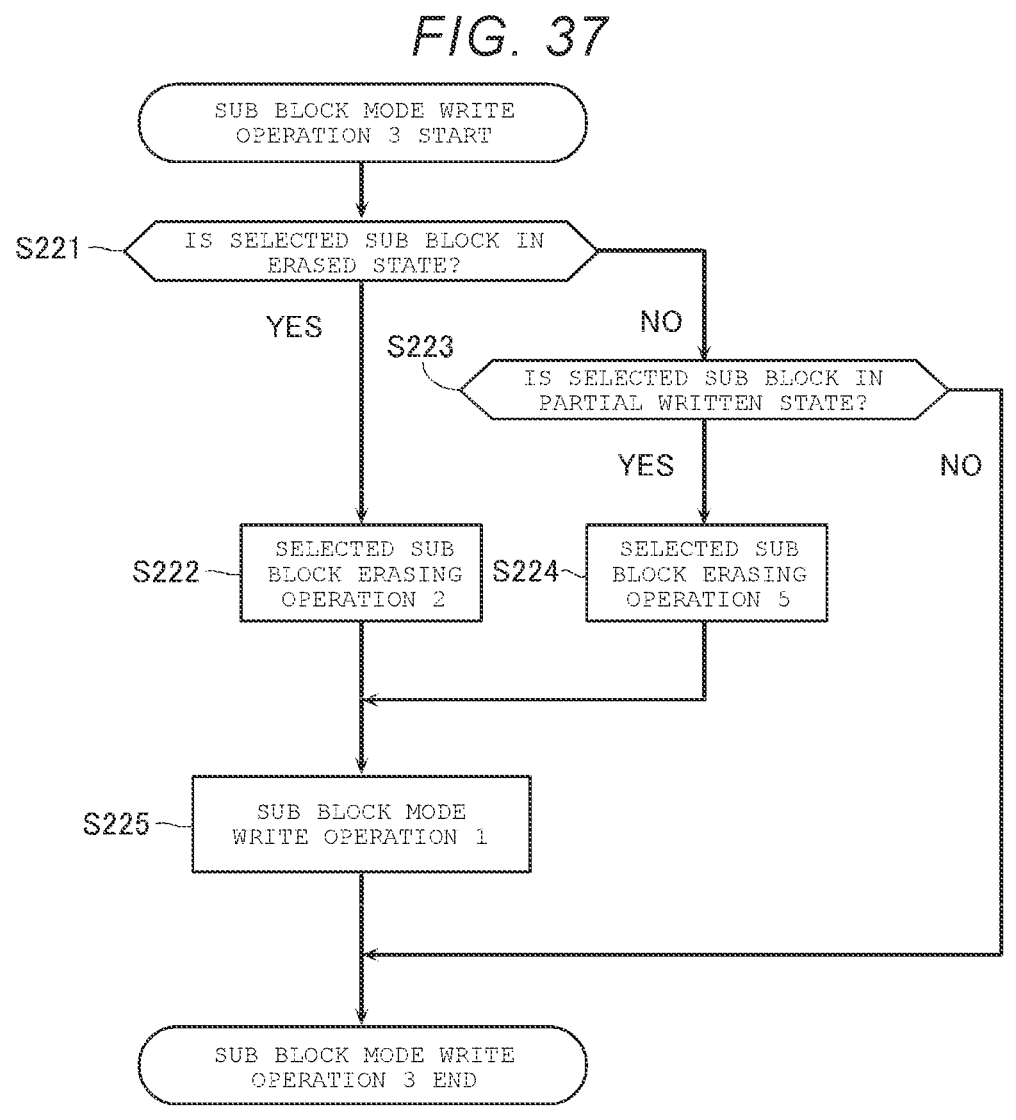

```
        ┌─────────────────────────────┐
        │    SUB BLOCK MODE WRITE      │
        │    OPERATION 3 START         │
        └─────────────────────────────┘
                     │
                     ▼
S221 ──◁ IS SELECTED SUB BLOCK IN ▷──────────────┐
         ERASED STATE?                            │
                     │                            │ NO
              YES    │                            ▼
              │   S223 ──◁ IS SELECTED SUB BLOCK IN ▷──┐
              │         PARTIAL WRITTEN STATE?         │
              │                 │                      │ NO
              │            YES  │                      │
              ▼                 ▼                      │
     ┌──────────────┐   ┌──────────────┐              │
S222 │ SELECTED SUB │S224│ SELECTED SUB │              │
     │ BLOCK ERASING│   │ BLOCK ERASING│              │
     │ OPERATION 2  │   │ OPERATION 5  │              │
     └──────────────┘   └──────────────┘              │
              │                 │                      │
              │◀────────────────┘                      │
              ▼                                         │
     ┌──────────────┐                                  │
S225 │ SUB BLOCK MODE│                                 │
     │ WRITE OPERATION 1                               │
     └──────────────┘                                  │
              │◀─────────────────────────────────────┘
              ▼
        ┌─────────────────────────────┐
        │    SUB BLOCK MODE WRITE      │
        │    OPERATION 3 END           │
        └─────────────────────────────┘
```

$\bullet$ electron
$\circ$ hole

*FIG. 39*

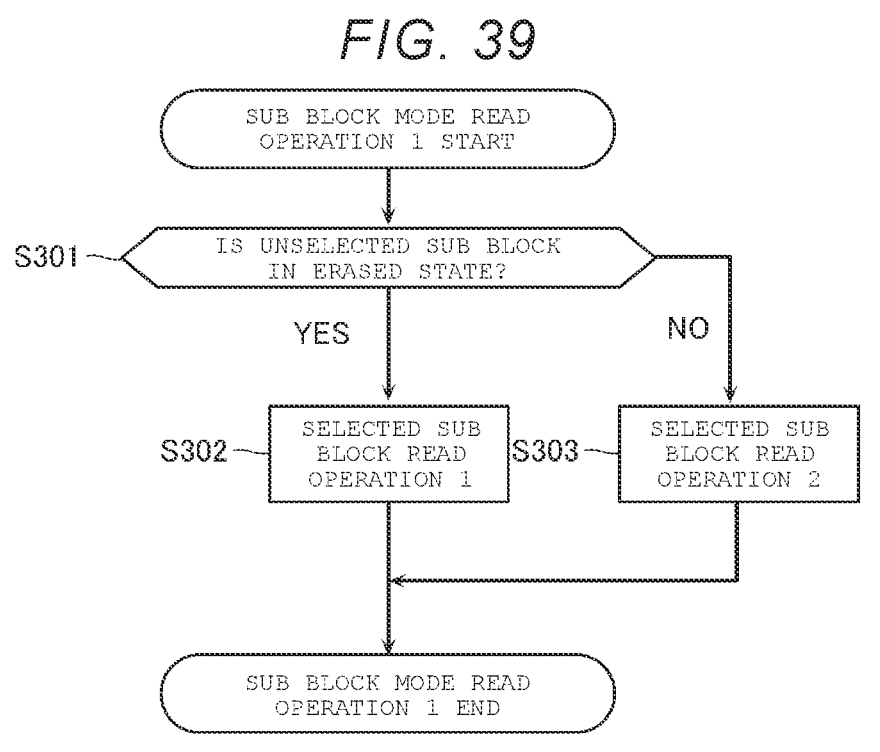

```
        ┌──────────────────────────────┐
        │    SUB BLOCK MODE READ       │
        │    OPERATION 1 START         │
        └──────────────────────────────┘
                      │
                      ▼
          ╱────────────────────────────╲
  S301 ──╱   IS UNSELECTED SUB BLOCK     ╲───────┐
         ╲      IN ERASED STATE?         ╱       │
          ╲────────────────────────────╱        │
              │ YES                    NO │
              ▼                           ▼
  ┌────────────────────┐      ┌────────────────────┐
  │  SELECTED SUB      │ S303 │  SELECTED SUB      │
S302│ BLOCK READ       │      │  BLOCK READ        │
  │  OPERATION 1       │      │  OPERATION 2       │
  └────────────────────┘      └────────────────────┘
              │                           │
              ◄───────────────────────────┘
              ▼
        ┌──────────────────────────────┐
        │    SUB BLOCK MODE READ       │
        │    OPERATION 1 END           │
        └──────────────────────────────┘
```

SGD$_U$(V$_{SS}$)

SGD$_S$(V$_{SG}$)

WL$_U$(V$_{READL}$)

WL$_U$(V$_{READL}$)

WL$_U$(V$_{READL}$)

WL$_U$(V$_{READL}$)

WL$_U$(V$_{READL}$)

WL$_U$(V$_{READL}$)

L$_{MCA2}$
SBLK$_U$

WL$_U$(V$_{READL}$)

WL$_U$(V$_{READ}$)

WL$_U$(V$_{READ}$)

WL$_U$(V$_{READK}$)

PG

WL$_S$(V$_{CGR}$)

L$_{MCA1}$
SBLK$_S$

WL$_U$(V$_{READK}$)

WL$_U$(V$_{READ}$)

WL$_U$(V$_{READ}$)

SGS(V$_{SG}$)

112(V$_{SRC}$)

SUe    SUd    SUc    SUb    SUa

BLK$_{tb}$

BL
Cb
Ch $SGD_U(V_{SS})$
$SGD_S(V_{SG})$
$WL_U(V_{READ})$
$WL_U(V_{READ})$
$WL_U(V_{READ})$
$WL_U(V_{READ})$
$WL_U(V_{READ})$
$WL_U(V_{READ})$ $L_{MCA2}$
$SBLK_U$ $WL_U(V_{READ})$
$WL_U(V_{READ})$
$WL_U(V_{READ})$
$WL_U(V_{READ})$
$WL_U(V_{READK})$
$WL_S(V_{CGR})$
$WL_U(V_{READK})$ $L_{MCA1}$
$SBLK_S$

PG $WL_U(V_{READ})$
$WL_U(V_{READ})$
SGS($V_{SG}$)

112($V_{SRC}$)

SUe    SUd    SUc    SUb    SUa $BLK_{tb}$

SBLK$_S$

NUMBER OF CELLS

Er    A    B    C    D    E    F    G

THRESHOLD VOLTAGE

SBLK$_U$

NUMBER OF CELLS

Er

THRESHOLD VOLTAGE

*FIG. 45*

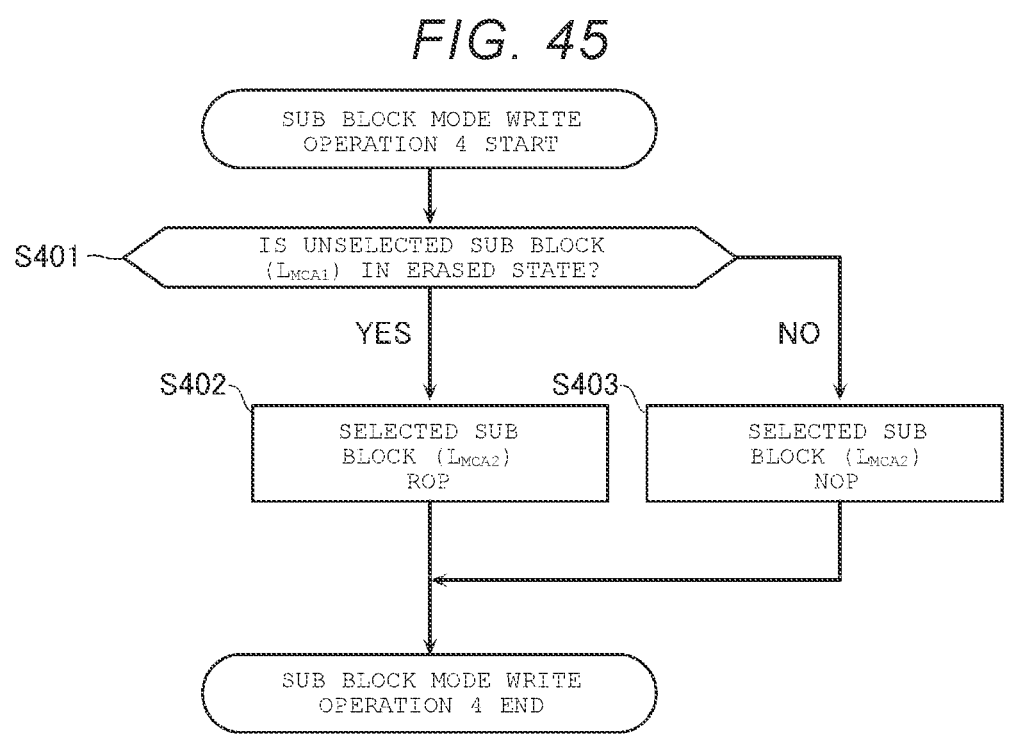

```
      ┌─────────────────────────────┐
      │   SUB BLOCK MODE WRITE      │
      │   OPERATION 4 START         │
      └─────────────────────────────┘
                   │
                   ▼
```

S401 — IS UNSELECTED SUB BLOCK ($L_{MCA1}$) IN ERASED STATE?

YES                                    NO

S402 — SELECTED SUB BLOCK ($L_{MCA2}$) ROP

S403 — SELECTED SUB BLOCK ($L_{MCA2}$) NOP

```
      ┌─────────────────────────────┐
      │   SUB BLOCK MODE WRITE      │
      │   OPERATION 4 END           │
      └─────────────────────────────┘
```

|  | PATTERN 1 | PATTERN 2 | PATTERN 3 |
|---|---|---|---|
| $L_{MCA3}$ | ERASED STATE | ERASED STATE | WRITTEN STATE |
| $L_{MCA2}$ | SELECT | SELECT | SELECT |
| $L_{MCA1}$ | ERASED STATE | WRITTEN STATE | WRITTEN STATE |

SEMICONDUCTOR MEMORY DEVICE WITH OPERATION-SPECIFIC PASS VOLTAGES

CROSS-REFERENCE TO RELATED APPLICATION

This application is based upon and claims the benefit of priority from Japanese Patent Application No. 2022-142343, filed Sep. 7, 2022, the entire contents of which are incorporated herein by reference.

FIELD

Embodiments described herein relate generally to a semiconductor memory device.

BACKGROUND

A semiconductor memory device is known that includes a substrate, memory blocks aligned with the substrate in a first direction intersecting a surface of the substrate, and a control circuit that controls the memory blocks.

BRIEF DESCRIPTION OF THE DRAWINGS

FIG. 9 is a schematic cross-sectional view illustrating aspects of a semiconductor memory device according to the first embodiment.

FIG. 16 is a flowchart illustrating an operation method of a semiconductor memory device according to the first embodiment.

FIG. 21 is a timing chart illustrating aspects of an operation method of a semiconductor memory device according to the first embodiment.

FIGS. 26A and 26B are schematic views illustrating aspects of an operation method of a semiconductor memory device according to the first embodiment.

FIG. 27 is a flowchart illustrating Modification 1 of a semiconductor memory device according to the first embodiment.

FIG. 28 is a flowchart illustrating Modification 2 of a semiconductor memory device according to the first embodiment.

FIG. 31 is a flowchart illustrating a semiconductor memory device according to a second embodiment.

FIG. 36 is a flowchart illustrating Modification 1 of a semiconductor memory device according to the second embodiment.

FIG. 37 is a flowchart illustrating Modification 2 of a semiconductor memory device according to the second embodiment.

FIG. 39 is a flowchart illustrating aspects of a semiconductor memory device according to a third embodiment.

FIG. 40 is a timing chart illustrating aspects of a semiconductor memory device according to the third embodiment.

FIG. 42 is a schematic cross-sectional view illustrating aspects of a semiconductor memory device according to the third embodiment.

FIG. 45 is a flowchart illustrating aspects of a semiconductor memory device according to a fourth embodiment.

FIGS. 46A and 46B are schematic views illustrating aspects of a semiconductor memory device according to the fourth embodiment.

DETAILED DESCRIPTION

Figure 1:
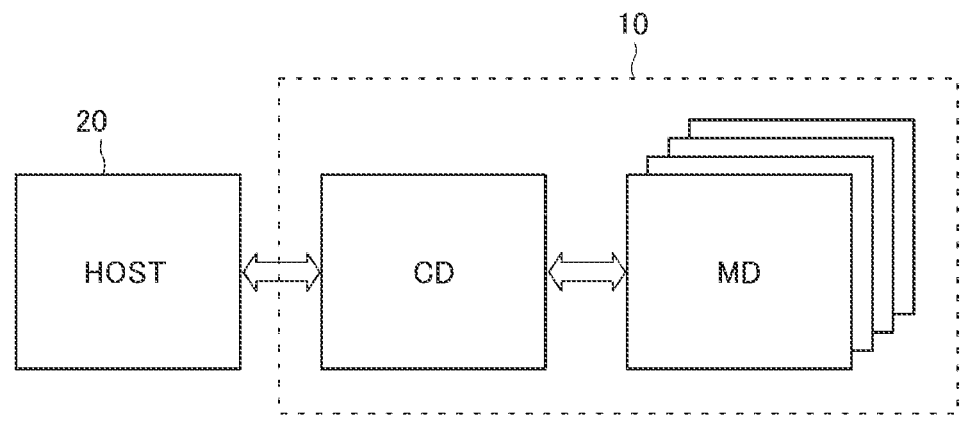
FIG. 1 is a schematic block diagram illustrating a semiconductor memory device according to a first embodiment.

Embodiments provide a semiconductor memory device with improved performance.

In general, according to one embodiment, a semiconductor memory device includes a substrate, a first sub memory block and a second sub memory block that are arranged in a first direction intersecting a surface of the substrate, and a control circuit that controls the first sub memory block and the second sub memory block. The first sub memory block includes a first memory cell and a first word line that is electrically connected to the first memory cell. The second sub memory block includes a second memory cell and a second word line that is electrically connected to the second memory cell. The control circuit is configured to execute a first write operation with respect to the first memory cell and a second write operation with respect to the first memory cell, applies a program voltage to the first word line and applies a first unselect write voltage, which is lower than the program voltage, to the second word line in the first write operation, and applies the program voltage to the first word line and applies a second unselect write voltage, which is lower than the first unselect write voltage, to the second word line in the second write operation.

Next, a semiconductor memory device according to certain example embodiment will be described with reference to the drawings. The following examples are not intended to limit the present disclosure.

The term "semiconductor memory device" as used in the present specification may mean a memory die (a memory chip) or may mean a memory system including a controller die such as a memory card or a solid-state disk (SSD). The term "semiconductor memory device" may also mean a configuration incorporating a host computer such as a smartphone, a tablet terminal, and a personal computer.

In the present specification, when a first component is said to be "electrically connected" to a second component, the first component may be directly connected to the second component, or the first component may be connected to the second component via a wiring, a semiconductor member, a transistor, or the like. For example, when three transistors are connected in series, the first transistor can be said to be "electrically connected" to the third transistor even though the second transistor may be in an OFF state.

In the present specification, a case where a first component is said to be "connected between" a second component and a third component may mean that the first component, the second component, and the third component are connected in series and/or that the second component is connected to the third component via the first configuration.

In the present specification, a case where a circuit or the like is said to cause two wirings (or other components) to be "electrically connected" may refer the circuit or the like including a transistor or the like, and that the transistor or the like is provided on a current path between the two wirings, and the transistor and the like are turned into an ON state.

First Embodiment

Memory System 10

FIG. 1 is a schematic block diagram illustrating a configuration of a memory system 10 according to a first embodiment.

The memory system 10 reads, writes, and erases user data according to signals transmitted from a host computer 20. The memory system 10 is, for example, a memory card, SSD, or other system capable of storing user data. The memory system 10 includes a plurality of memory dies MD that store user data, and a controller die CD connected to the plurality of memory dies MD and the host computer 20. The controller die CD includes, for example, a processor and a RAM, and performs processing such as conversion between a logical address and a physical address, bit error detection/correction, garbage collection (compaction), and wear leveling.

Figure 2:
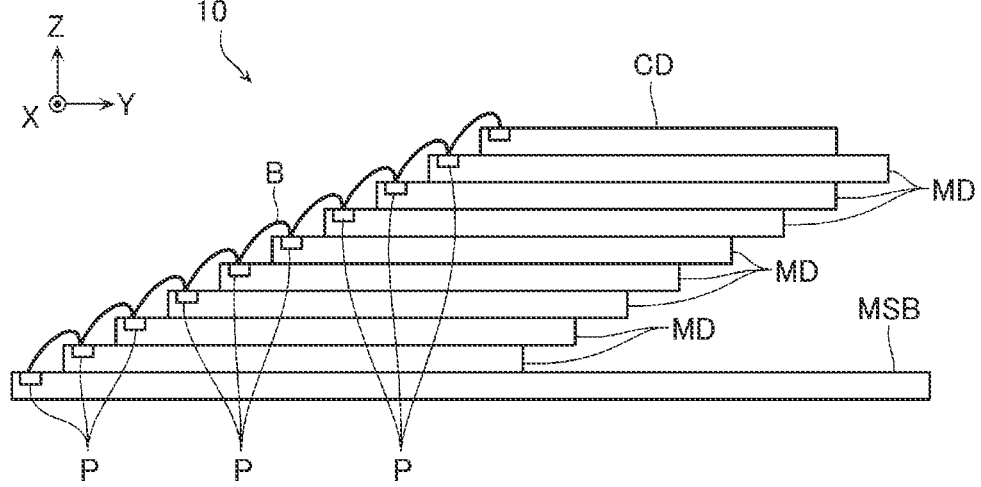
FIG. 2 is a schematic side view illustrating a semiconductor memory device according to the first embodiment.
Figure 3:
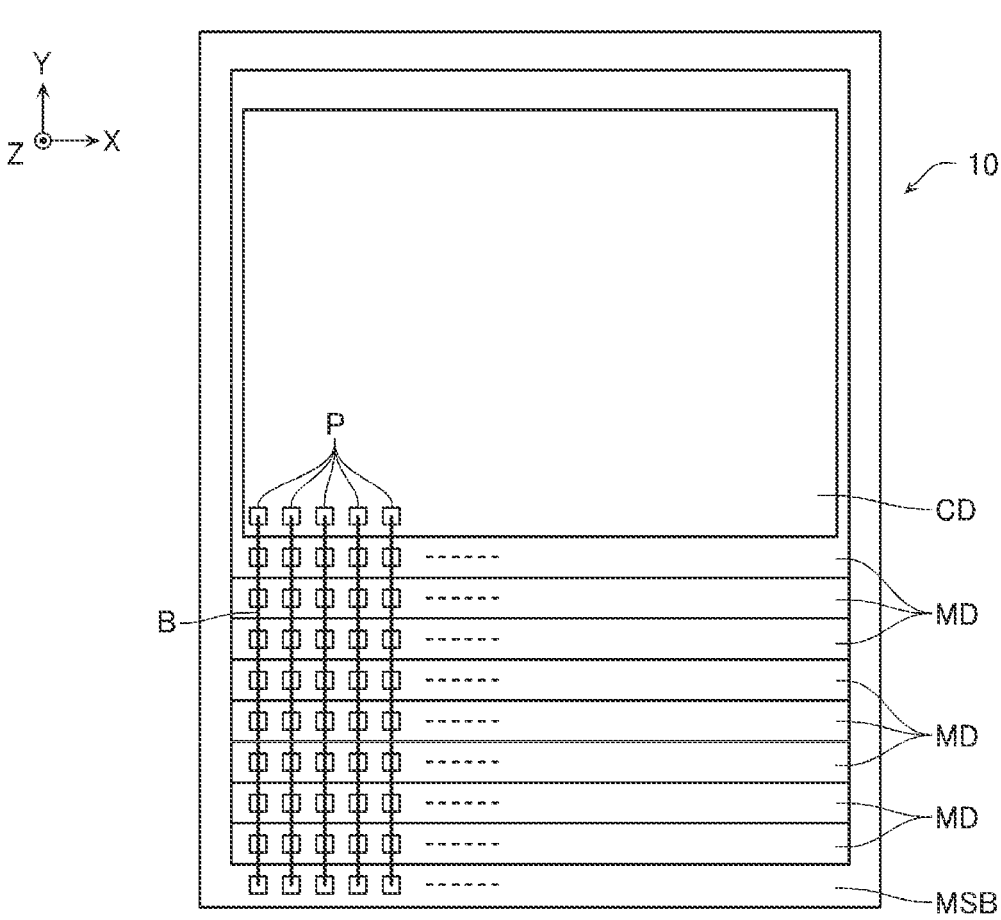
FIG. 3 is a schematic plan view illustrating a semiconductor memory device according to the first embodiment.

FIG. 2 is a schematic side view illustrating an example of the configuration of the memory system 10 according to the present embodiment. FIG. 3 is a schematic plan view showing the same configuration example. For convenience of description, a part of the configuration is omitted in FIGS. 2 and 3.

As shown in FIG. 2, the memory system 10 according to the first embodiment includes a mounting substrate MSB, a plurality of memory dies MD stacked on the mounting substrate MSB, and a controller die CD stacked on the memory die MD. A pad electrode P is provided in a region of an end portion of the upper surface of the mounting substrate MSB in the Y direction, and a part of another region of the upper surface of the mounting substrate MSB is adhered to the lower surface of the memory die MD via an adhesive or the like. The pad electrode P is provided in the region of the end portion of the upper surface of the memory die MD in the Y direction, and another region of the upper surface of the memory die MD is adhered to the lower surface of another memory die MD or the lower surface of the controller die CD via an adhesive or the like. The pad electrode P is provided in a region of an end portion of the upper surface of the controller die CD in the Y direction.

As shown in FIG. 3, each of the mounting substrate MSB, the plurality of memory dies MD, and the controller die CD includes a plurality of pad electrodes P arranged in the X direction. The plurality of pad electrodes P, which are provided on the mounting substrate MSB, the plurality of memory dies MD, and the controller die CD, are connected to each other via bonding wires B.

The configurations shown in FIGS. 2 and 3 are merely an example, and the specific configurations may be adjusted as appropriate. For example, in the example shown in FIGS. 2 and 3, the controller die CD is stacked on the plurality of memory dies MD, and such components are connected by the bonding wires B. In such a configuration, the plurality of memory dies MD and the controller dies CD can be provided in one package. However, in other examples, the controller die CD may be provided in a package different from the memory die MD. Further, the plurality of memory dies MD and the controller dies CD may be connected to each other via through-electrodes or the like instead of bonding wires B.

Configuration of Memory Die MD

Figure 4:
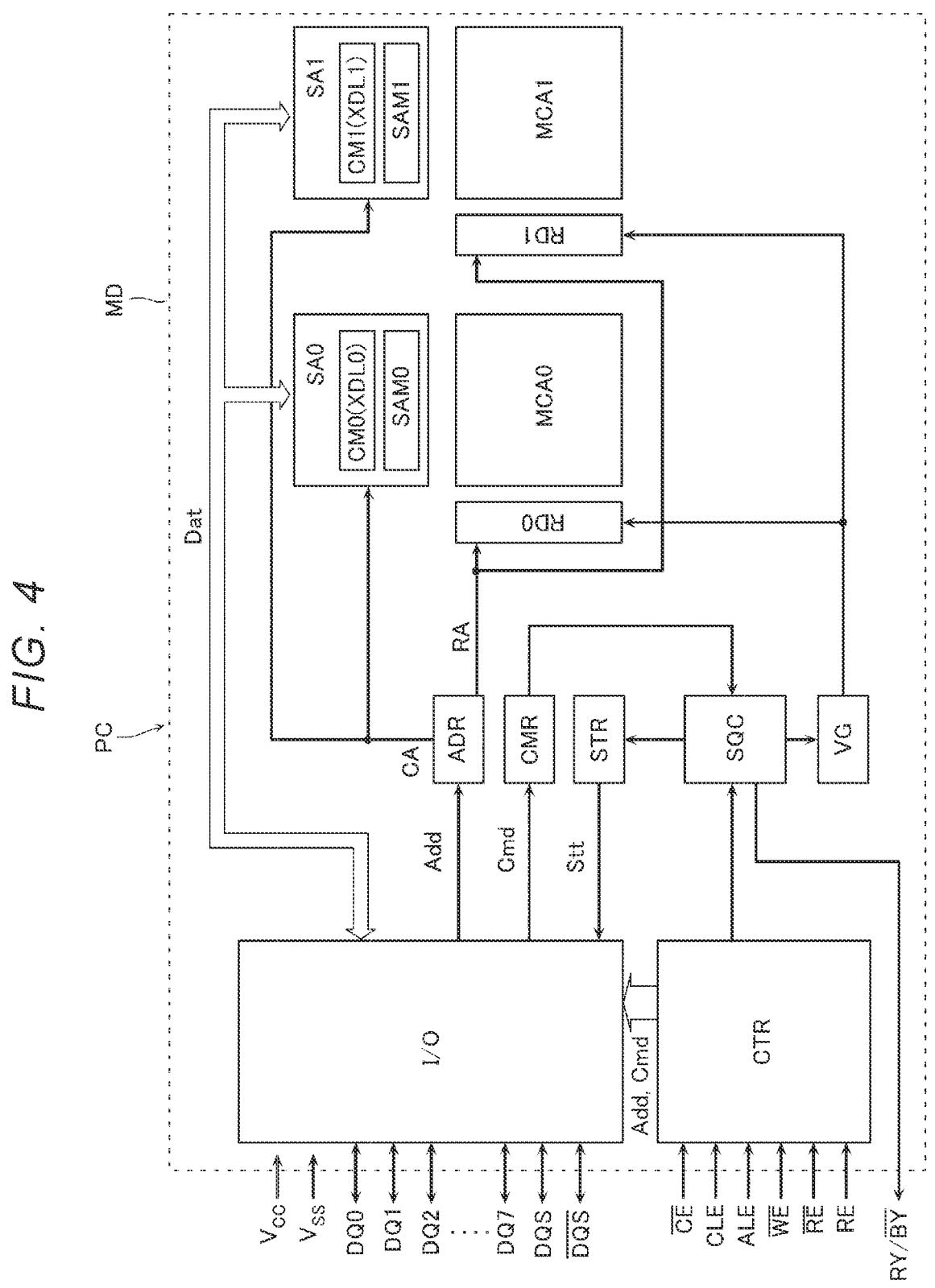
FIG. 4 is a schematic block diagram illustrating a semiconductor memory device according to the first embodiment.
Figure 5:
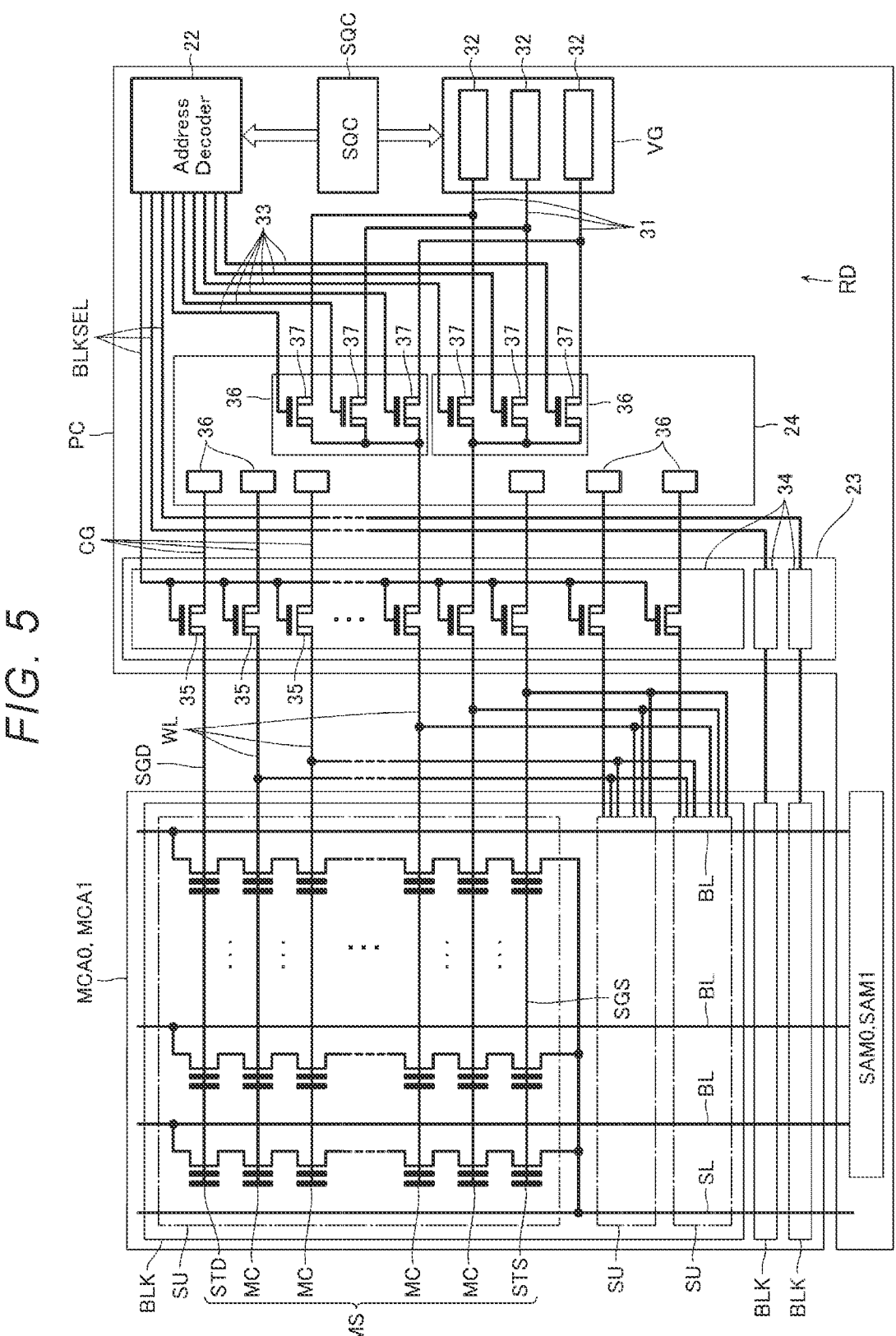
FIG. 5 is schematic a circuit diagram of a semiconductor memory device according to the first embodiment.

FIG. 4 is a schematic block diagram showing a configuration of the memory die MD according to the first embodiment. FIG. 5 is a schematic circuit diagram showing a configuration of a part of the memory die MD. For convenience of description, a part of the configuration is omitted in FIGS. 4 to 5.

FIG. 4 illustrates a plurality of control terminals and the like. The plurality of control terminals may be represented as control terminals corresponding to a high active signal (a positive logic signal), may be represented as control terminals corresponding to a low active signal (a negative logic signal), and may be represented as control terminals corresponding to both the high active signal and the low active signal. In FIG. 4, the reference sign of the control terminal corresponding to a low active signal includes an overline, however, in the text of the present specification, the reference sign of a control terminal corresponding to a low active signal includes a slash (/) suffix. The illustration of FIG. 4 is just one example, and the specific forms may be adjusted as appropriate. For example, some or all of high active signals may be set to be low active signals instead, or some or all of low active signals may be set to be high active signals.

As shown in FIG. 4, the memory die MD includes memory cell arrays MCA0 and MCA1 that store the user data, and a peripheral circuit PC that is connected to the memory cell arrays MCA0 and MCA1. In the following description, the memory cell arrays MCA0 and MCA1 may be referred to as a memory cell array MCA.

Circuit Configuration of Memory Cell Array MCA

As shown in FIG. 5, the memory cell array MCA includes a plurality of memory blocks BLK. Each of the plurality of memory blocks BLK includes a plurality of string units SU. Each of the string units SU includes a plurality of memory strings MS. One end of each of the memory strings MS is connected to the peripheral circuit PC via a bit line BL. The other end of each of the memory strings MS is connected to the peripheral circuit PC via a common source line SL.

The memory string MS includes a drain side select transistor STD that is connected in series between the bit line BL and the source line SL, a plurality of memory cells MC (memory cell transistors), and a source side select transistor STS. The drain side select transistor STD and the source side select transistor STS may be more simply referred to as a select transistor (STD, STS).

The memory cell MC is an electric field effect type transistor that includes a semiconductor layer, a gate insulating film, and a gate electrode. The semiconductor layer functions as a channel region. The gate insulating film includes a charge storage film. A threshold voltage of the memory cell MC is changed according to a charge quantity in the charge storage film. The memory cell MC stores the user data of one bit or a plurality of bits. The word line WL is connected to each of the gate electrodes of the plurality of memory cells MC corresponding to one memory string MS. Each of these word lines WL is commonly connected to all the memory strings MS in one memory block BLK.

The select transistors (STD, STS) are electric field effect type transistors including a semiconductor layer, a gate insulating film, and a gate electrode. The semiconductor layer functions as a channel region. A drain side select gate line SGD and a source side select gate line SGS are connected to each of the gate electrodes of the select transistors (STD, STS). The drain side select gate line SGD is provided corresponding to the string unit SU and commonly connected to all the memory strings MS in one string unit SU. The source side select gate line SGS is commonly connected to all the memory strings MS in the memory block BLK. The drain side select gate line SGD and the source side select gate line SGS may be more simply referred to as select gate lines (SGD, SGS).

Circuit Configuration of Peripheral Circuit PC

For example, as shown in FIG. 4, the peripheral circuit PC includes row decoders RD0 and RD1 and sense amplifiers SA0 and SA1 respectively connected to the memory cell arrays MCA0 and MCA'. The peripheral circuit PC includes a voltage generation circuit VG and a sequencer SQC. The peripheral circuit PC includes an input/output control circuit I/O, a logic circuit CTR, an address register ADR, a command register CMR, and a status register STR. In the following description, the row decoders RD0 and RD1 may be referred to as a row decoder RD, and the sense amplifiers SA0 and SA1 may be referred to as a sense amplifier SA.

Configuration of Row Decoder RD

For example, as shown in FIG. 5, the row decoder RD (FIG. 4) includes an address decoder 22 that decodes address data Add (FIG. 4). The row decoder RD (FIG. 4) includes a block select circuit 23 and a voltage select circuit 24 that transfer operation voltages to the memory cell array MCA according to an output signal of the address decoder 22.

The address decoder 22 is connected to a plurality of block select lines BLKSEL and a plurality of voltage select lines 33. The address decoder 22 sequentially references row addresses RA of the address register ADR (FIG. 4) according to, for example, a control signal from the sequencer SQC.

The block select circuit 23 includes a plurality of block selection portions 34 corresponding to the memory blocks BLK. Each of the block selection portions 34 includes a plurality of block select transistors 35 corresponding to the word lines WL and the select gate lines (SGD, SGS). The block select transistor 35 is, for example, an electric field effect type breakdown voltage transistor. Each of the drain electrodes of the block select transistors 35 is electrically connected to the corresponding word lines WL or select gate lines (SGD, SGS). Each of the source electrodes of the block select transistors 35 is electrically connected to a voltage supply line 31 via the wiring CG and the voltage select circuit 24. The gate electrode of the block select transistor 35 is commonly connected to the corresponding block select line BLKSEL.

The voltage select circuit 24 includes a plurality of voltage selection portions 36 corresponding to the word lines WL and select gate lines (SGD, SGS). Each of the voltage selection portions 36 includes a plurality of voltage select transistors 37. The voltage select transistor 37 is, for example, an electric field effect type breakdown voltage transistor. Each of drain terminals of the voltage select transistors 37 is electrically connected to the corresponding word lines WL or select gate lines (SGD, SGS) via the wiring CG and the block select circuit 23. Each of the source terminals is electrically connected to the corresponding voltage supply line 31. Each of the gate electrodes is connected to the corresponding voltage select line 33.

Configuration of Sense Amplifier SA

Each of the sense amplifiers SA0 and SA1 (FIG. 4) includes sense amplifier modules SAM0 and SAM1, and cache memories CM0 and CM1 (data registers). Each of the cache memories CM0 and CM1 includes latch circuits XDL0 and XDL1. In the following description, the sense amplifier modules SAM0 and SAM1 may each be referred to as a sense amplifier module SAM, the cache memories CM0 and CM1 may each be referred to as a cache memory CM, and the latch circuits XDL0 and XDL1 may each be referred to as a latch circuit XDL.

A sense amplifier module SAM includes, for example, sense circuits respectively corresponding to a plurality of bit lines BL, and a plurality of latch circuits connected to the sense circuits.

The cache memory CM includes the plurality of latch circuits XDL. Each of the plurality of latch circuits XDL is connected to a latch circuit in the sense amplifier module SAM. The latch circuit XDL stores, for example, user data, which is written to the memory cell MC, or user data, which is read from the memory cell MC.

A column decoder, for example, is connected to the cache memory CM. The column decoder decodes a column address CA that is stored in the address register ADR (FIG. 4) and selects the latch circuit XDL that corresponds to the column address CA.

The user data Dat, which are included in the plurality of latch circuits XDL, are sequentially transferred to the latch circuit in the sense amplifier module SAM at the time of the write operation. The user data Dat, which are included in the latch circuit in the sense amplifier module SAM, are sequentially transferred to the latch circuit XDL at the time of the read operation. The user data Dat, which are included in the latch circuit XDL, are sequentially transferred to the input/output control circuit I/O at the time of a data out operation.

Configuration of Voltage Generation Circuit VG

For example, as shown in FIG. 5, the voltage generation circuit VG (FIG. 4) is connected to a plurality of voltage supply lines 31. The voltage generation circuit VG includes, for example, a step-down circuit such as a regulator and a step-up circuit such as a charge pump circuit 32. The step-down circuit and the step-up circuit are respectively connected to the voltage supply lines that are supplied with a power supply voltage $V_{CC}$ and a ground voltage $V_{SS}$ (FIG. 4). These voltage supply lines are connected to the pad electrodes P described with reference to FIGS. 2 and 3, for example. For example, the voltage generation circuit VG generates a plurality of operation voltages to be applied to the bit line BL, the source line SL, the word line WL, and the select gate lines (SGD, SGS) at the time of the read operation, the write operation, and the erasing operation with respect to the memory cell array MCA according to the control signal from the sequencer SQC, and simultaneously outputs the plurality of operation voltages to the plurality of voltage supply lines 31. The operation voltage, which is output from the voltage supply line 31, is appropriately adjusted according to the control signal from the sequencer SQC.

Configuration of Sequencer SQC

The sequencer SQC (FIG. 4) outputs an internal control signal to the row decoders RD0 and RD1, the sense amplifier modules SAM0 and SAM1, and the voltage generation circuit VG in accordance with command data Cmd stored in the command register CMR. The sequencer SQC outputs status data Stt, which indicates a state of the memory die MD, to the appropriate status register STR.

The sequencer SQC generates a ready/busy signal and outputs the generated ready/busy signal to a terminal RY/(/BY). During a period (busy period) in which the terminal RY/(/BY) is in the "L" state, access to the memory die MD is basically prohibited. During a period (ready period) in which the terminal RY/(/BY) is in the "H" state, access to the memory die MD is permitted. The terminal RY/(/BY) is embodied, for example, by a pad electrode P described with reference to FIGS. 2 and 3. Configuration of Address Register ADR As shown in FIG. 4, the address register ADR is connected to the input/output control circuit I/O and stores the address data Add that is input from the input/output control circuit I/O. The address register ADR includes, for example, a plurality of 8-bit register rows. For example, when an internal operation such as the read operation, the write operation, or the erasing operation is executed, the register row stores the address data Add that corresponds to the internal operation being executed.

The address data Add includes, for example, the column address CA (FIG. 4) and the row address RA (FIG. 4). The row address RA includes, for example, a block address that specifies the memory block BLK (FIG. 5), a page address that specifies the string unit SU and the word line WL, a plane address that specifies a memory cell array MCA (plane), and a chip address that specifies the memory die MD.

Configuration of Command Register CMR

The command register CMR is connected to the input/output control circuit I/O and stores the command data Cmd that is input from the input/output control circuit I/O. The command register CMR includes at least one set of 8-bit register rows, for example. When the command data Cmd is stored in the command register CMR, a control signal is transmitted to the sequencer SQC.

Configuration of Status Register STR

The status register STR is connected to the input/output control circuit I/O and stores the status data Stt to be output to the input/output control circuit I/O. The status register STR includes, for example, a plurality of 8-bit register rows. For example, when the internal operation such as the read operation, the write operation or the erasing operation is executed, the register row stores the status data Stt that is related to the internal operation being executed. The register row stores ready/busy information of the memory cell arrays MCA0 and MCAT, for example.

Configuration of Input/Output Control Circuit I/O

The input/output control circuit I/O (FIG. 4) includes data signal input/output terminals DQ0 to DQ7, data strobe signal input/output terminals DQS and /DQS, a shift register, and a buffer circuit.

Each of the data signal input/output terminals DQ0 to DQ7 and the data strobe signal input/output terminals DQS and /DQS is embodied by a pad electrode P described with reference to FIGS. 2 and 3, for example. The data, which is input via the data signal input/output terminals DQ0 to DQ7, is input from the buffer circuit to the cache memory CM, the address register ADR, or the command register CMR in accordance with the internal control signal from the logic circuit CTR. The data, which is output via the data signal input/output terminals DQ0 to DQ7, is input to the buffer circuit from the cache memory CM or the status register STR in accordance with the internal control signal from the logic circuit CTR.

The signals (for example, data strobe signals and complementary signals thereof), which are input via the data strobe signal input/output terminals DQS and /DQS, are used when the data is input via the data signal input/output terminals DQ0 to DQ7. The data, which is input via the data signal input/output terminals DQ0 to DQ7, is taken into the shift register in the input/output control circuit I/O at a timing of a rising edge of a voltage of the data strobe signal input/output terminal DQS (switching of the input signal) and a timing of a falling edge of a voltage of the data strobe signal input/output terminal /DQS (switching of the input signal), and at a timing of the falling edge of the voltage of the data strobe signal input/output terminal DQS (switching of the input signal), and a timing of the rising edge of the voltage of the data strobe signal input/output terminal /DQS (switching of the input signal).

Configuration of Logic Circuit CTR

The logic circuit CTR (FIG. 4) includes a plurality of external control terminals such as external control terminals /CE, CLE, ALE, /WE, /RE, and RE, and logic circuits connected to the plurality of external control terminals /CE, CLE, ALE, /WE, /RE, and RE. The logic circuit CTR receives an external control signal from the controller die CD via the external control terminals /CE, CLE, ALE, /WE, /RE, and RE, and outputs the internal control signal to the input/output control circuit I/O in response to the reception.

Each of the external control terminals /CE, CLE, ALE, /WE, /RE, and RE can be a pad electrode P described with reference to FIGS. 2 and 3.

Structure of Memory Die MD

Figure 6:
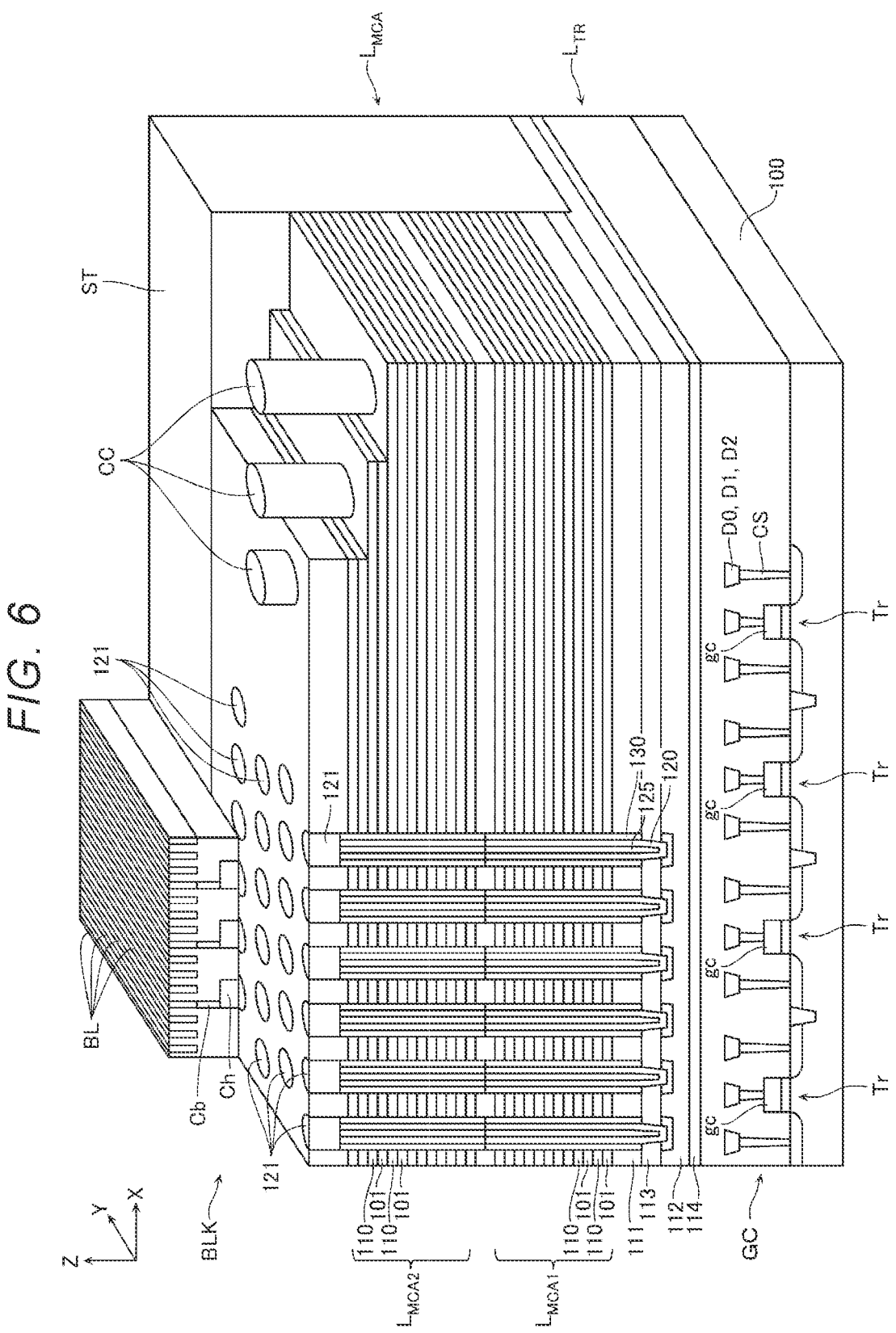
FIG. 6 is a schematic perspective view illustrating aspects of a semiconductor memory device according to the first embodiment.
Figure 7:
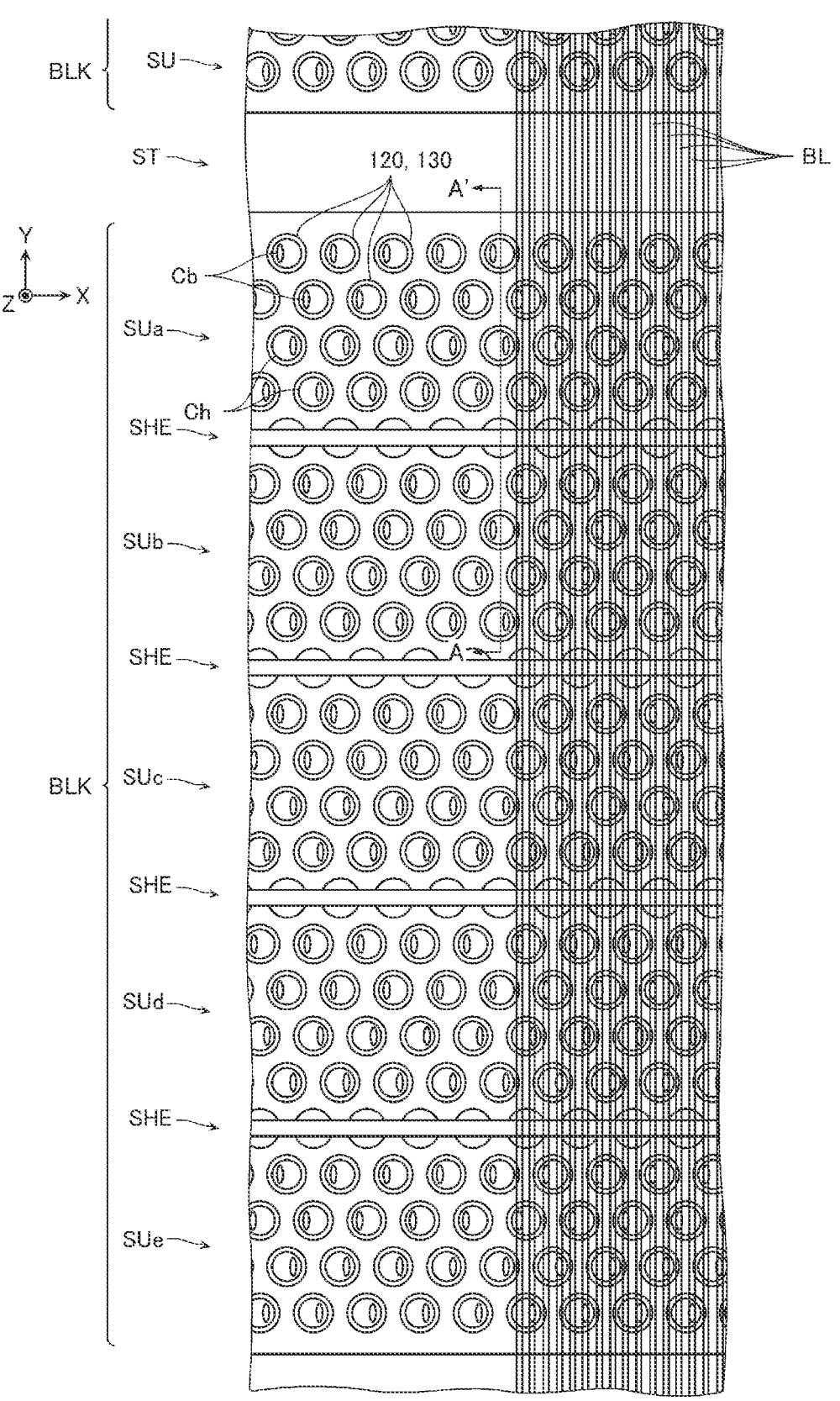
FIG. 7 is a schematic plan view illustrating aspects of a semiconductor memory device according to the first embodiment.
Figure 8:
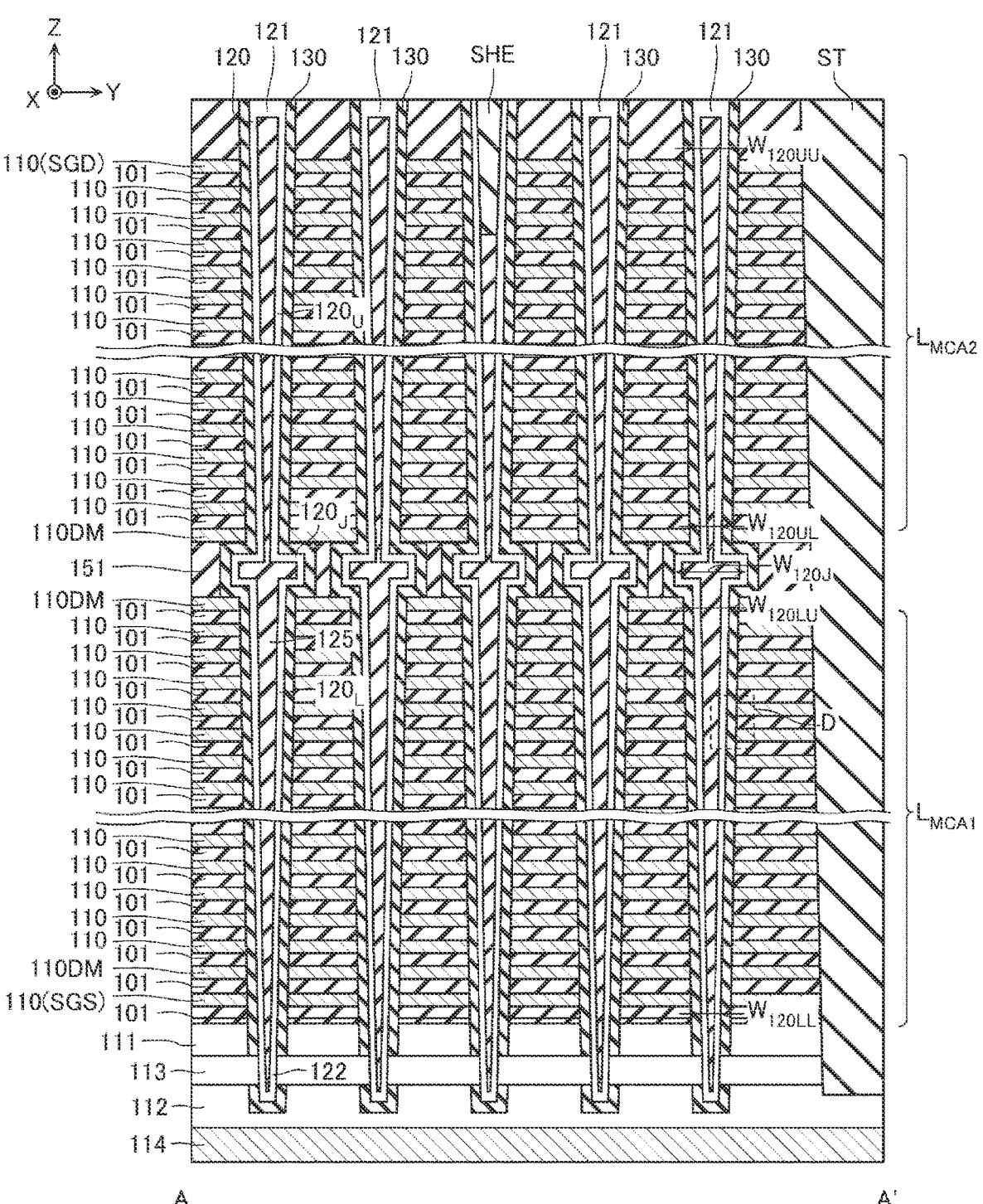
FIG. 8 is a schematic cross-sectional view illustrating aspects of the semiconductor memory device according to the first embodiment.
Figure 9:
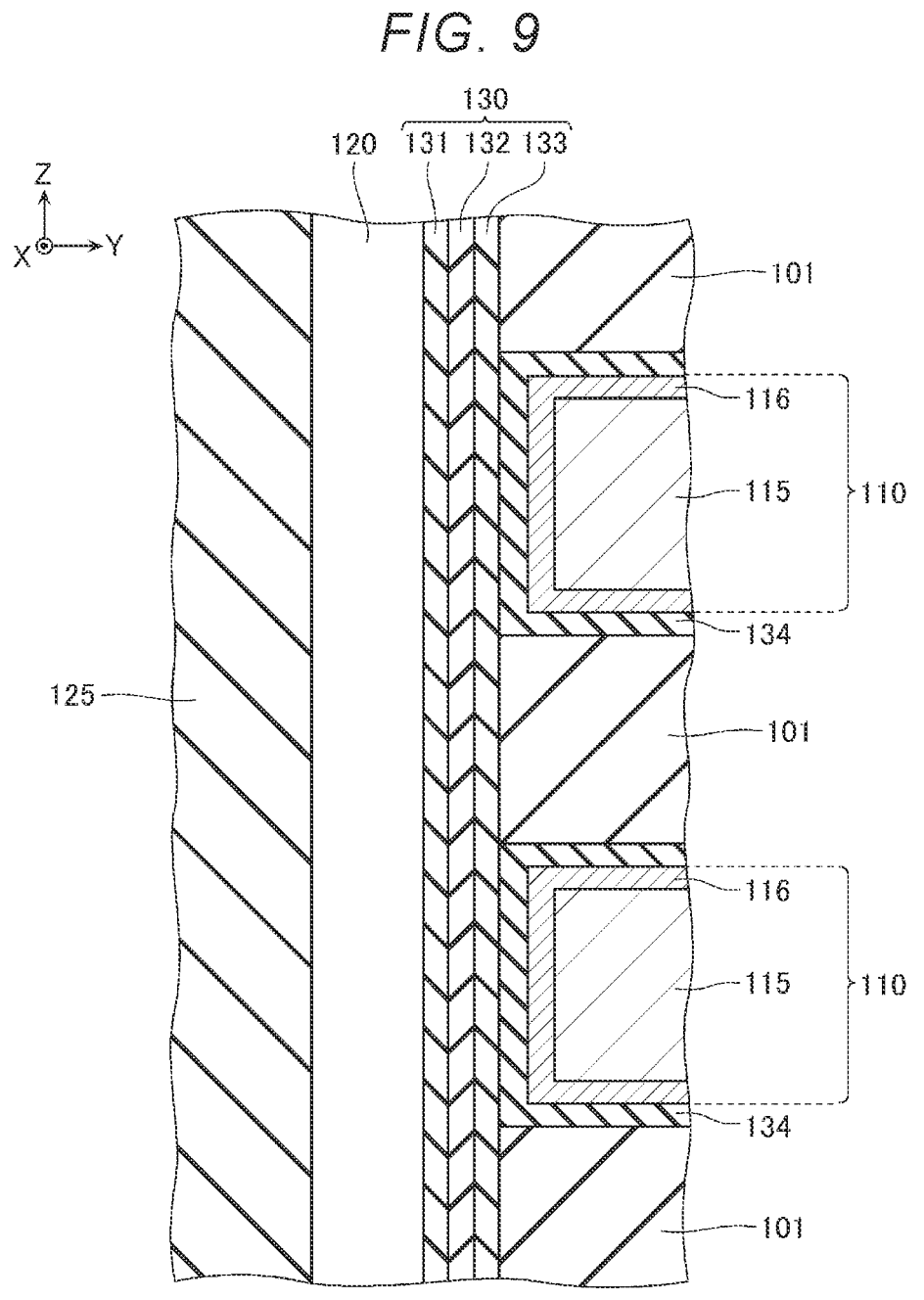

FIG. 6 is a schematic perspective view showing a configuration of a part of the memory die MD. FIG. 7 is a schematic plan view showing a configuration of a part of the memory die MD. FIGS. 8 and 9 are schematic cross-sectional views showing a configuration of a part of the memory die MD. FIG. 8 is a schematic cross-sectional view of the structure shown in FIG. 7 cut along the line A-A' and viewed in a direction of the arrow. FIG. 9 is a schematic cross-sectional view enlarging a region D shown in FIG. 8. For convenience of description, a part of the configuration is omitted in FIGS. 6 to 9.

For example, as shown in FIG. 6, the semiconductor memory device according to the present embodiment includes a transistor layer $L_{TR}$ that is provided on a semiconductor substrate 100 and a memory cell array layer $L_{MCA}$ that is provided above the transistor layer $L_{TR}$.

Structure of Transistor Layer $L_{TR}$

A wiring layer GC is provided on an upper surface of the semiconductor substrate 100 via an insulating layer. The wiring layer GC includes a plurality of electrodes gc that face a surface of the semiconductor substrate 100. Each of the regions of the semiconductor substrate 100 and the plurality of electrodes gc, which are provided in the wiring layer GC, is connected to a contact CS.

Each of the electrodes gc faces the surface of the semiconductor substrate 100 and functions as gate electrodes of a plurality of transistors Tr, electrodes of a plurality of capacitors, and the like, constituting the peripheral circuit PC.

A plurality of contacts CS extend in the Z direction and are connected to the upper surface of the semiconductor substrate 100 or the upper surface of the electrode gc at the lower end of the contact CS. An impurity region containing N-type impurities or P-type impurities is provided at a portion at which the contact CS and the semiconductor substrate 100 are connected to each other. A contact CS may comprise, for example, a stacked film including a barrier conductive film made of titanium nitride (TiN) or the like and a metal film made of tungsten (W) or the like.

Each of the wiring layers D0, D1, and D2 includes a plurality of wirings, and the plurality of wirings are electrically connected to at least one component in the memory cell array MCA and the peripheral circuit PC. The wirings may comprise, for example, a stacked film including a barrier conductive film made of titanium nitride (TiN) or the like and a metal film made of tungsten (W) or the like.

Structure of Memory Cell Array Layer $L_{MCA}$

For example, as shown in FIG. 6, the memory block BLK is provided in the memory cell array layer $L_{MCA}$.

In the example of FIG. 7, the memory block BLK includes five string units SUa to SUe provided from one side in the Y direction (a positive side in the Y direction in FIG. 4) to the other side in the Y direction (a negative side in the Y direction in FIG. 4). Each of the plurality of string units SUa to SUe corresponds to the string unit SU described with reference to FIG. 5. An inter-string unit insulating layer SHE, which is made of silicon oxide ($SiO_2$) or the like is provided between two string units SU adjacent to each other in the Y direction. An inter-block structure ST is provided between two memory blocks BLK adjacent to each other in the Y direction.

As shown in FIGS. 6 and 8, in the memory cell array layer $L_{MCA}$, the memory block BLK includes a memory cell array layer $L_{MCA1}$ and a memory cell array layer $L_{MCA2}$ provided above the memory cell array layer $L_{MCA1}$. An insulating layer 151 such as silicon oxide ($SiO_2$) is provided between the memory cell array layer $L_{MCA1}$ and the memory cell array layer $L_{MCA2}$. The memory cell array layer $L_{MCA1}$ and the memory cell array layer $L_{MCA2}$ include a plurality of conductive layers 110 arranged in the Z direction, a plurality of semiconductor layers 120 extending in the Z direction, and a plurality of gate insulating films 130 respectively provided between the plurality of conductive layers 110 and the plurality of semiconductor layers 120.

The conductive layer 110 is a substantially plate-shaped conductive layer extending in the X direction. As shown in FIG. 9, the conductive layer 110 may comprise, for example, a stacked film including a barrier conductive film 116 made of titanium nitride (TiN) or the like and a metal film 115 made of tungsten (W) or the like. An insulating metal oxide film 134 such as alumina (AlO) may be provided on the upper and lower surfaces of the conductive layer 110 and the surface facing the semiconductor layer 120. The conductive layer 110 may contain, for example, polycrystalline silicon containing impurities such as phosphorus (P) or boron (B). A contact CC (FIG. 6) is provided at each of end portions of the plurality of conductive layers 110 in the X direction. Insulating layers 101 made of silicon oxide ($SiO_2$) or the like are provided between the plurality of conductive layers 110 arranged in the Z direction.

As shown in FIG. 8, the semiconductor layer 111, the semiconductor layer 113, and the semiconductor layer 112 are provided below the plurality of conductive layers 110 via the insulating layer 101. A part of the gate insulating film 130 is provided between the semiconductor layers 111 and 112 and the semiconductor layer 120. The semiconductor layer 113 is connected to a lower end portion of the semiconductor layer 120.

An upper surface of the semiconductor layer 113 is connected to the semiconductor layer 111 and a lower surface of the semiconductor layer 113 is connected to the semiconductor layer 112. A conductive layer 114 may be provided on a lower surface of the semiconductor layer 112. The semiconductor layer 111, the semiconductor layer 113, the semiconductor layer 112, and the conductive layer 114 function as the source line SL (FIG. 1). The source line SL is provided, for example, in common for the plurality of memory blocks BLK. The semiconductor layer 111, the semiconductor layer 113, and the semiconductor layer 112 contain, for example, polycrystalline silicon containing impurities such as phosphorus (P) or boron (B). The conductive layer 114 may comprise, for example, a metal film made of tungsten (W) or the like, a conductive layer made of tungsten silicide or the like, or other conductive layers.

Among the plurality of conductive layers 110 that are provided in the memory cell array layer $L_{MCA1}$, one or a plurality of conductive layers 110, which are located on the lowermost layer, function as the source side select gate line SGS (FIG. 5) and the gate electrodes of the plurality of source side select transistors STS (FIG. 5) connected to the source side select gate line SGS. This conductive layer 110 is electrically independent for each memory block BLK.

Among the plurality of conductive layers 110 that are provided in the memory cell array layer $L_{MCA1}$, one or the plurality of conductive layers 110, which are located above the plurality of conductive layers 110, are provided as dummies. Such a conductive layer 110 can be referred to as a dummy conductive layer 110DM. The dummy conductive layer 110DM does not function as one of the select gate lines (SGD, SGS) or the word lines WL. A memory cell MC, which records data, is not provided between the dummy conductive layer 110DM and the semiconductor layer 120. A dummy conductive layer 110DM may also be referred to as a dummy word line DWL.

Among the plurality of conductive layers 110 that are provided in the memory cell array layer $L_{MCA1}$, a plurality of conductive layers 110 located above the above-described conductive layers 110 function as the word line WL (FIG. 5) and the gate electrodes of the plurality of memory cells MC (FIG. 5) connected to the word line WL. The memory cell MC, which is used for recording the data, is provided between the conductive layer 110 and the semiconductor layer 120. The plurality of conductive layers 110 are electrically independent for each memory block BLK.

Among the plurality of conductive layers 110 that are provided in the memory cell array layer $L_{MCA1}$, one or the plurality of conductive layers 110, which are located in the uppermost layer, are dummy conductive layers 110DM.

Among the plurality of conductive layers 110 that are provided in the memory cell array layer $L_{MCA2}$, one or the plurality of conductive layers 110, which are located in the lowermost layer, are dummy conductive layers 110DM.

Among the plurality of conductive layers 110 that are provided in the memory cell array layer $L_{MCA2}$, a plurality of conductive layers 110 located above the above-described conductive layers 110 function as the word line WL (FIG. 5) and the gate electrodes of the plurality of memory cells MC (FIG. 5) connected to the word line WL. The memory cell MC, which is used for recording the data, is provided between the conductive layer 110 and the semiconductor layer 120. The plurality of conductive layers 110 are electrically independent for each memory block BLK.

One or a plurality of conductive layers 110 located above the above-described conductive layers 110 function as the drain side select gate line SGD (FIG. 5) and the gate electrodes of the plurality of drain side select transistors STD (FIG. 5) connected to the drain side select gate line SGD. Widths of the plurality of conductive layers 110 in the Y direction are smaller than those of the other conductive layers 110. An inter-string unit insulating layer SHE is provided between two conductive layers 110 adjacent to each other in the Y direction. Each of the plurality of conductive layers 110 is electrically independent for each string unit SU.

For example, as shown in FIGS. 6 and 7, the semiconductor layers 120 are arranged in the X direction and the Y direction in a predetermined pattern. The semiconductor layer 120 function as channel regions of the plurality of memory cells MC and select transistors (STD, STS) in one memory string MS (FIG. 5). The semiconductor layer 120 is a semiconductor layer made of polycrystalline silicon (Si), for example. For example, as shown in FIG. 8, the semiconductor layer 120 has a substantially bottomed-closed cylindrical shape, and an insulating layer 125 made of silicon oxide ($SiO_2$) or the like is provided at the central portion of the semiconductor layer 120.

As shown in FIG. 8, the semiconductor layer 120 includes a semiconductor region $120_L$ provided in the memory cell array layer $L_{MCA1}$ and a semiconductor region $120_U$ provided in the memory cell array layer $L_{MCA2}$. The semiconductor layer 120 includes a semiconductor region $120_J$ connected to an upper end of the semiconductor region $120_L$ and a lower end of the semiconductor region $120_U$, an impurity region 122 connected to a lower end of the semiconductor region $120_L$, and an impurity region 121 connected to an upper end of the semiconductor region $120_U$.

The semiconductor region $120_L$ is a substantially cylindrical-shaped region extending in the Z direction. Each of outer peripheral surfaces of the semiconductor region $120_L$ is surrounded by the plurality of conductive layers 110, which are provided in the memory cell array layer $L_{MCA1}$ and faces the plurality of conductive layers 110.

The semiconductor region $120_U$ is a substantially cylindrical-shaped region extending in the Z direction. Each of outer peripheral surfaces of the semiconductor region $120_U$ is surrounded by the plurality of conductive layers 110, which are provided in the memory cell array layer $L_{MCA2}$ and faces the plurality of conductive layers 110.

The semiconductor region $120_J$ is provided above the plurality of conductive layers 110, which are provided in the memory cell array layer $L_{MCA1}$ and is provided below the plurality of conductive layers 110, which are provided in the memory cell array layer $L_{MCA2}$.

The impurity region 122 is connected to the semiconductor layer 113. The impurity region 122 contains, for example, N-type impurities such as phosphorus (P) or P-type impurities such as boron (B). A portion of the semiconductor layer 120 located directly above the impurity region 122 functions as a channel region of the source side select transistor STS.

The impurity region 121 contains, for example, N-type impurities such as phosphorus (P). The impurity region 121 is connected to the bit line BL via a contact Ch and a contact Cb (FIG. 6).

The gate insulating film 130 has a substantially bottomed-closed cylindrical shape that covers the outer peripheral surface of the semiconductor layer 120. For example, as illustrated in FIG. 9, the gate insulating film 130 includes a tunnel insulating film 131, a charge storage film 132, and a block insulating film 133, which are stacked between the semiconductor layer 120 and the conductive layer 110. The tunnel insulating film 131 and the block insulating film 133 are insulating films made of silicon oxide ($SiO_2$), for example. The charge storage film 132 is a film that is made of silicon nitride (SiN) and is capable of storing charges, for example. The tunnel insulating film 131, the charge storage film 132, and the block insulating film 133 have a substantially cylindrical shape, and extend in the Z direction along the outer peripheral surface of the semiconductor layer 120.

The gate insulating film 130 may comprise, for example, a floating gate made of polycrystalline silicon containing N-type or P-type impurities (dopants).

The inter-block structure ST is a structure body that extends in the Z direction and the X direction, divides the plurality of insulating layers 101, the plurality of conductive layers 110, the semiconductor layer 111, and the semiconductor layer 113 in the Y direction, and reaches the semiconductor layer 112. The inter-block structure ST is, for example, an insulating layer such as silicon oxide ($SiO_2$). The inter-block structure ST may include a conductive layer of tungsten or the like extending in the X and Z directions in the center of the Y direction, and the lower end of this conductive layer may be connected to the semiconductor layer 112.

Widths of Semiconductor Regions 120$_L$, 120$_U$, and 120$_J$ in Radial Direction Next, widths of the semiconductor regions 120$_L$, 120$_U$, and 120$_J$ in the radial direction will be described. In this context, the width of the semiconductor layer in the XY cross section that intersects the Z direction, which is the extending direction of the semiconductor regions 120$_L$ and 120$_U$, is also referred to as a width in the radial direction. For convenience of description, in FIG. 8 and the like, the width in the Y direction is illustrated as the width in the radial direction.

A width $W_{120LL}$ of a lower end portion (for example, a portion located below the plurality of conductive layers 110 provided in the memory cell array layer $L_{MCA1}$) of the semiconductor region 120$_L$ in the radial direction is smaller than a width $W_{120LU}$ of an upper end portion (for example, a portion located above the plurality of conductive layers 110 provided in the memory cell array layer $L_{MCA1}$) of the semiconductor region 120$_L$ in the radial direction. That is, the semiconductor region 120$_L$ is provided such that the width in the radial direction becomes smaller closer to the substrate.

A width $W_{120UL}$ of a lower end portion (for example, a portion located below the plurality of conductive layers 110 provided in the memory cell array layer $L_{MCA2}$) of the semiconductor region 120$_U$ in the radial direction is smaller than a width $W_{120UU}$ of an upper end portion (for example, a portion located above the plurality of conductive layers 110 provided in the memory cell array layer $L_{MCA2}$) of the semiconductor region 120$_U$ in the radial direction. That is, the semiconductor region 120$_U$ is provided such that the width in the radial direction becomes smaller toward the substrate and the semiconductor region 120$_J$, and the width in the radial direction is the smallest in the vicinity directly above the semiconductor region 120$_J$. The width $W_{120UL}$ is smaller than the width $W_{120LU}$.

The semiconductor region 120$_J$ is provided such that the width $W_{120J}$ of the semiconductor region 120$_J$ in the radial direction is larger than any widths $W_{120LL}$, $W_{120LU}$, $W_{120UL}$, and $W_{120UU}$ of the semiconductor regions 120$_L$ and 120$_U$ in the radial direction.

Threshold Voltage of Memory Cell MC that Records Plurality of Bits

Figures 10A, 10B, 10C:
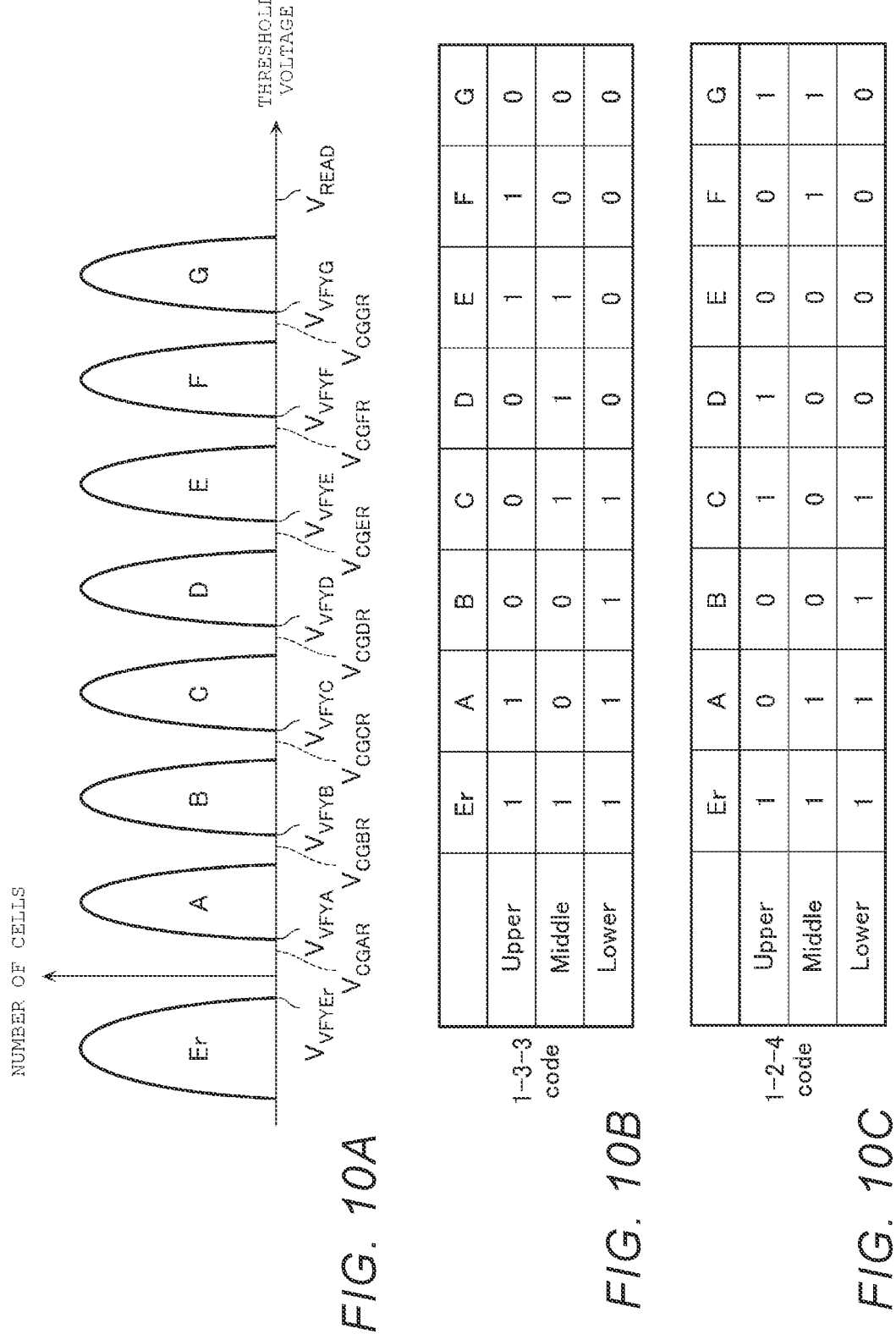
FIGS. 10A, 10B, and 10C relate to aspects of a threshold voltage of a memory cell MC in which 3-bit data is recorded.

Next, a threshold voltage of the memory cell MC that records data of a plurality of bits will be described with reference to FIGS. 10A, 10B, and 10C. FIGS. 10A, 10B, and 10C show, as an example, the threshold voltage of the memory cell MC that records 3-bit data.

FIG. 10A is a schematic histogram illustrating the threshold voltage of the memory cells MC in which 3-bit data is recorded. The horizontal axis indicates a voltage of the word line WL, and the vertical axis indicates the number of memory cells MC. FIG. 10B is a table showing an example of a relationship between the threshold voltage of the memory cell MC in which the 3-bit data is recorded and the data to be recorded. FIG. 10C is a table showing another example of a relationship between the threshold voltage of the memory cell MC in which the 3-bit data is recorded and the data to be recorded.

In the example of FIG. 10A, the threshold voltage of the memory cell MC is controlled to be in one of eight states. The threshold voltage of the memory cell MC, which is controlled to an Er state, is lower than an erasing verification voltage $V_{VFYEr}$. For example, the threshold voltage of the memory cell MC, which is controlled to an A state, is higher than a verification voltage $V_{VFYA}$ and lower than a verification voltage $V_{VFYB}$. For example, the threshold voltage of the memory cell MC, which is controlled to a B state, is higher than a verification voltage $V_{VFYB}$ and lower than a verification voltage $V_{VFYC}$. Similarly, each of the threshold voltages of the memory cells MC, which are controlled to a C state to F state, is higher than the verification voltages $V_{VFYC}$ to $V_{VFYF}$ and lower than the verification voltages $V_{VFYD}$ to $V_{VFYG}$. For example, the threshold voltage of the memory cell MC, which is controlled to a G state, is higher than a verification voltage $V_{VFYG}$ and lower than a read pass voltage $V_{READ}$. The read pass voltage $V_{READ}$ is, for example, a voltage of approximately 9 V.

In the example of FIG. 10A, a read voltage $V_{CGBR}$ is set between a threshold voltage distribution corresponding to the Er state and the threshold voltage distribution corresponding to the A state. A read voltage $V_{CGBR}$ is set between the threshold voltage distribution corresponding to the A state and the threshold voltage distribution corresponding to the B state. Similarly, a read voltage $V_{CGCR}$ to a read voltage $V_{CGGR}$ are respectively set between a threshold voltage distribution corresponding to the B state and a threshold voltage distribution corresponding to the C state to between a threshold voltage distribution corresponding to the F state and a threshold voltage distribution corresponding to the G state.

For example, the Er state corresponds to the lowest threshold voltage. The memory cell MC in the Er state is in an erased state. For example, data "111" is assigned to the memory cell MC in the Er state.

The A state corresponds to a threshold voltage that is higher than a threshold voltage corresponding to the Er state. For example, data "101" is assigned to the memory cell MC in the A state.

The B state corresponds to a threshold voltage that is higher than a threshold voltage corresponding to the A state. For example, data "001" is assigned to the memory cell MC in the B state.

Similarly, the C state to G state in the drawing correspond to threshold voltages that are higher than those corresponding to the B state to F state. For example, data "011", "010", "110", "100" and "000" are assigned to the memory cells MC in these states.

In the case of the assignment as illustrated in FIG. 10B, lower bit data can be determined by one read voltage $V_{CGDR}$, middle bit data can be determined by three read voltages $V_{CGAR}$, $V_{CGCR}$, and $V_{CGFR}$, and upper bit data can be determined by three read voltages $V_{CGBR}$, $V_{CGER}$, and $V_{CGGR}$. Such assignment of the data is sometimes referred to as a 1-3-3 code.

The number of data bits, the number of states, the assignment of the data values to each state, and the like, which are recorded in the memory cell MC, can be appropriately varied.

For example, in the case of the assignment as illustrated in FIG. 10C, lower bit data can be determined by one read voltage $V_{CGDR}$, middle bit data can be determined by two read voltages $V_{CGBR}$ and $V_{CGFR}$, and upper bit data can be determined by four read voltages $V_{CGAR}$, $V_{CGCR}$, $V_{CGER}$, and $V_{CGGR}$. Such assignment of the data is sometimes referred to as a 1-2-4 code.

Operation

Next, an operation of the semiconductor memory device according to the present embodiment will be described.

Read Operation

Figure 11:
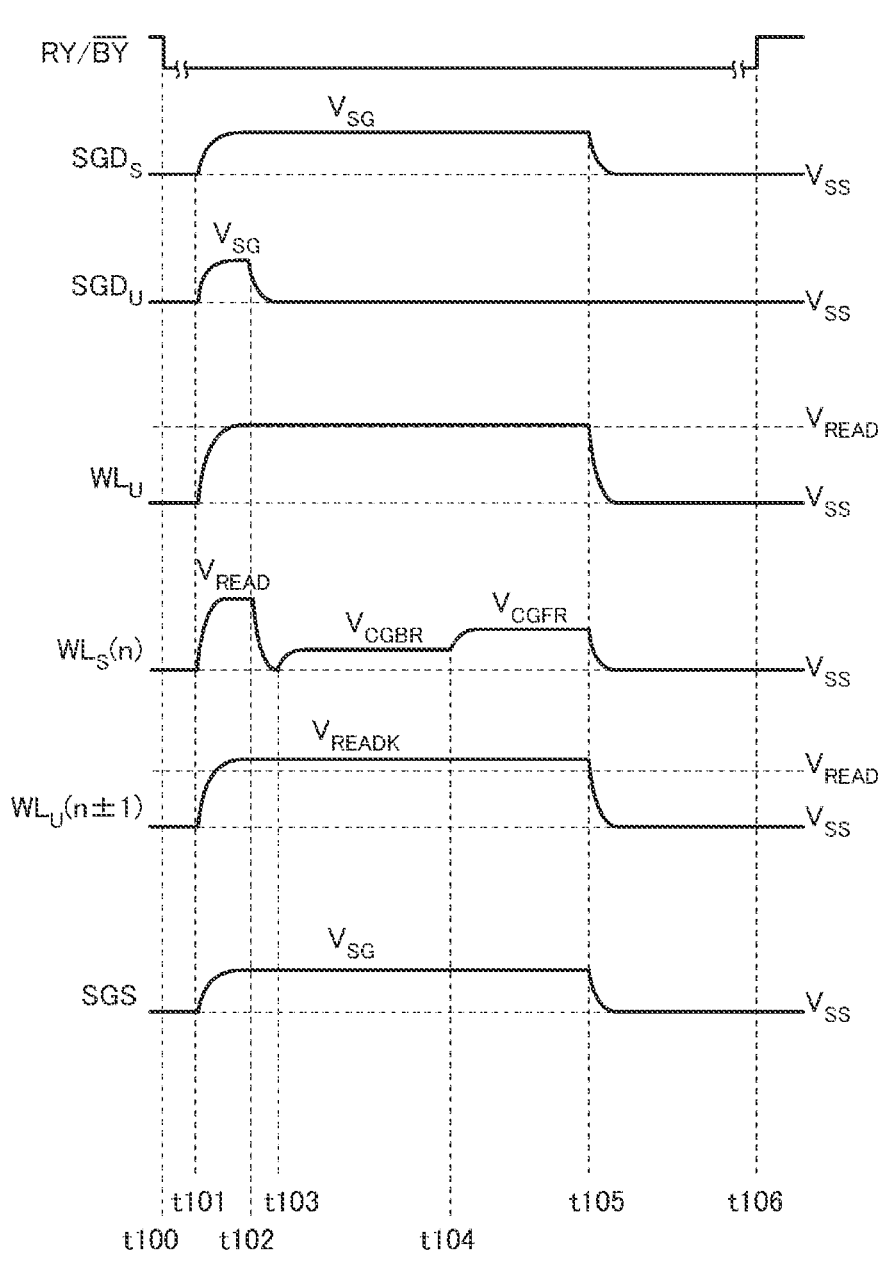
FIG. 11 is a timing chart illustrating aspects of an operation method of a semiconductor memory device according to the first embodiment.
Figure 12:
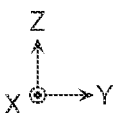
FIG. 12 is a schematic cross-sectional view illustrating aspects of an operation method of a semiconductor memory device according to the first embodiment.

A read operation of the memory die MD according to the present embodiment will be described. FIG. 11 is a timing chart illustrating the read operation. FIG. 12 is a schematic cross-sectional view illustrating the read operation. FIG. 12 shows each voltage supplied from a timing t103 to a timing t105 in FIG. 11.

In the following description, the drain side select gate line SGD, which corresponds to the string unit SU that is an operation target, may be referred to as a drain side select gate line $SGD_S$, and the drain side select gate line SGD, which corresponds to the rest of string units SU, may be referred to as a drain side select gate line $SGD_U$.

The word line WL that is an operation target may be referred to as a selected word line $WL_S$, and the rest of word lines WL may be referred to as unselected word lines $WL_U$. The selected word line $WL_S$ may be referred to as a selected word line $WL_S(n)$. The unselected word lines $WL_U$, which are vertically and respectively adjacent to the selected word line $WL_S(n)$, may be referred to as unselected word lines $WL_U(n\pm1)$. The unselected word line $WL_U$ that is located two lines above the selected word line $WL_S(n)$ may be referred to as an unselected word line $WL_U(n+2)$, and the unselected word line $WL_U$ that is located two lines below may be referred to as an unselected word line $WL_U(n-2)$.

In the following description, an example will be described in which the read operation is executed on the memory cells MC connected to the selected word line $WL_S$ (referred to as a "selected memory cell MC") among the plurality of memory cells MC provided in the string unit SU (FIG. 12) that is an operation target. In the following description, a configuration including a plurality of selected memory cells MC may be referred to as a selected page PG. The memory block BLK, which includes the selected page PG, may be referred to as a selected memory block $BLK_{tb}$.

In the following description, an example will be described in which each memory cell MC stores the data of a plurality of bits and a plurality of read voltages are used at the time of the read operation.

At a timing t100 of the read operation, the controller die CD sequentially inputs the command data Cmd (FIG. 4) for an instruction of the read operation and the address data Add (FIG. 4) to the memory die MD. As a result, the terminal RY/(/BY) enters a period (a busy period) in an "L" state.

For example, as shown in FIG. 11, at a timing t101, a voltage $V_{SG}$ is supplied to the drain side select gate line $SGD_S$, the drain side select gate line $SGD_U$, and the source side select gate line SGS, and then all the select transistors (STD, STS) are set to an ON state. The read pass voltage $V_{READ}$ is supplied to the selected word line $WL_S(n)$, the read pass voltage $V_{READK}$ is supplied to the unselected word line $WL_U(n\pm1)$, and the read pass voltage $V_{READ}$ is supplied to the unselected word line $WL_U$ other than the unselected word lines $WL_U(n\pm1)$, and then all the memory cells MC are set to an ON state. The read pass voltage $V_{READK}$ is higher than the read pass voltage $V_{READ}$.

For example, as shown in FIG. 11, at a timing t102, the read pass voltage $V_{READK}$ is supplied to the unselected word line $WL_U(n\pm1)$, and the read pass voltage $V_{READ}$ is supplied to the rest of unselected word lines $WL_U$, and then the memory cells MC connected to all the unselected word lines $WL_U$ are set to an ON state. However, the selected word line $WL_S(n)$ is supplied with a ground voltage $V_{SS}$ and then the memory cell MC that is connected to the selected word line $WL_S(n)$ is set to an OFF state. The voltage $V_{SG}$ is supplied to the drain side select gate line $SGD_S$ and the source side select gate line SGS of the string unit SUa including the selected page PG, and the select transistors STD and STS that are connected thereto are set to an ON state. The ground voltage $V_{SS}$ is supplied to the drain side select gate line $SGD_U$ of the string units SUb to SUe that do not include the selected page PG, and the select transistor STD that is connected thereto is set to an OFF state.

At the timing t103, a predetermined read voltage $V_{CGR}$ is supplied to the selected word line $WL_S(n)$. The read voltage $V_{CGR}$ may be, for example, one of the seven read voltages $V_{CGGR}$ to $V_{CGGR}$ described with reference to FIG. 10A. As a result, each of the selected memory cells MC, which are provided in the selected page PG, is turned into an ON state or an OFF state according to the threshold voltage. That is, a part of the selected memory cells MC of the selected page PG are turned into an ON state, and the rest of the selected memory cells MC are turned into an OFF state.

From the timing t103 to the timing t104 of the read operation, for example, charging of the bit line BL or the like is performed. For example, a voltage $V_{SRC}$ is supplied to the source line SL (the semiconductor layer 112) and then the charging is started. The voltage $V_{SRC}$ has, for example, approximately the same magnitude as the ground voltage $V_{SS}$. Subsequently, the sense amplifier module SAM (FIG. 4) performs a sensing operation of detecting the ON state/OFF state of the memory cell MC and acquires data indicating the state of this memory cell MC.

At the timing t104 of the read operation, another read voltage $V_{CGR}$ is supplied to the selected word line $WL_S(n)$. As a result, a part of the selected memory cells MC of the selected page PG are turned into an ON state, and the rest of the selected memory cells MC are turned into an OFF state.

From the timing t104 to the timing t105 of the read operation, in the same manner as the timing t103 to timing t104, the sense amplifier module SAM performs the sensing operation and acquires the data indicating the state of the memory cell MC.

At the timing t105 of the read operation, the ground voltage $V_{SS}$ is supplied to the selected word line $WL_S(n)$, all the unselected word lines $WL_U$, and the select gate lines (SGD, SGS).

At a timing t106, the read operation in the memory die MD is ended. The state of the terminal RY/(/BY) is changed from the "L" state to the "H" state, and access to the memory die MD is permitted.

In the read operation, an arithmetic processing such as AND and OR operations is performed on the data indicating the state of the memory cell MC, and the data recorded in the memory cell MC is calculated by the arithmetic processing. This data is transferred to the cache memory CM (FIG. 4).

Write Operation

Figure 13:
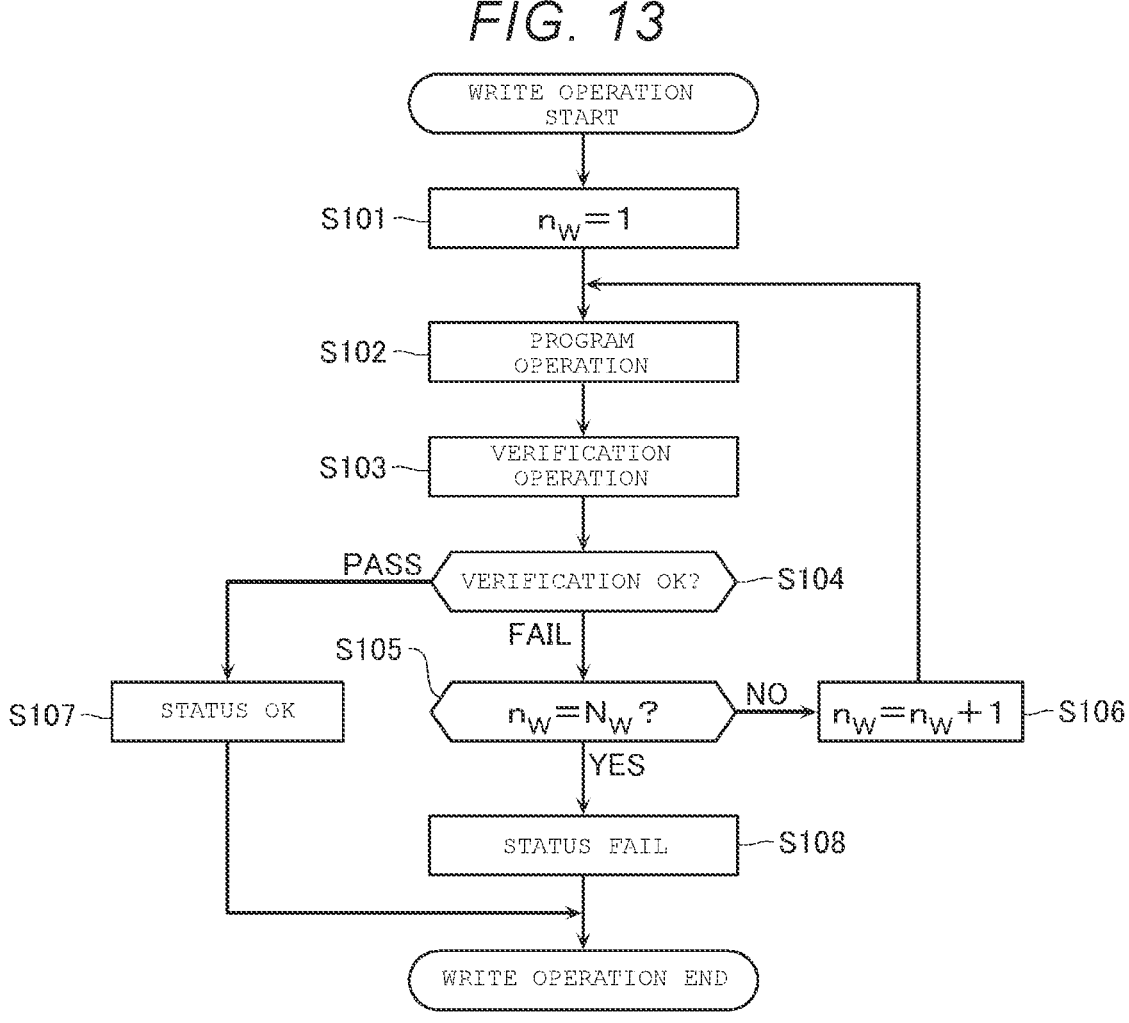
FIG. 13 is a flowchart illustrating an operation method of a semiconductor memory device according to the first embodiment.

Next, a write operation of the memory die MD according to the present embodiment will be described. FIG. 13 is a flowchart illustrating the write operation.

In the following description, an example of executing the write operation with respect to a plurality of selected memory cells MC corresponding to the selected page PG will be described.

In step S101, a loop count $n_W$ is set to one. The loop count $n_W$ is a variable that indicates the number of write loops.

In step S102, a program operation is executed. The program operation is an operation of supplying a program voltage $V_{PGM}$ (FIG. 15) to the selected word line $WL_S$ to increase the threshold voltage of the memory cell MC.

In step S103, a verification operation is performed. The verification operation is basically executed in the same manner as the read operation described with reference to FIGS. 11 and 12. In the verification operation, instead of the predetermined read voltage $V_{CGR}$, for example, the verification voltage $V_{VFYA}$ to the verification voltage $V_{VFYG}$ described with reference to FIGS. 10A, 10B, and 10C are supplied to the selected word line $WL_S$, the ON state/OFF state of the memory cell MC is detected, and whether the threshold voltage of the memory cell MC has reached a target value is detected.

In step S104, the result of the verification operation is determined. For example, a counter circuit or the like is referenced to count the number of memory cells MC for which the threshold voltage has not reached the target value. When the number of memory cells MC for which the threshold voltage has not reached the target value is equal to or larger than a certain number, it is determined as verification FAIL, and the process proceeds to step S105. On the other hand, when the number of memory cells MC for which the threshold voltage has not reached the target value is less than a certain number, it is determined as verification PASS, and the process proceeds to step S107.

In step S105, it is determined whether the loop count $n_W$ has reached a predetermined count $N_W$. When the loop count $n_W$ has not reached the predetermined count $N_W$, the process proceeds to step S106. When the loop count $n_W$ has reached the predetermined count $N_W$, the process proceeds to step S108.

In step S106, 1 is added to the loop count $n_W$, and the process proceeds to step S102. In step S106, for example, in the program operation, the program voltage $V_{PGM}$ (FIG. 15), which is supplied to the selected word line $WL_S$, is increased by a predetermined voltage $\Delta V$. Therefore, the program voltage $V_{PGM}$ is increased as the loop count n w is increased.

In step S107, the status data Stt, which indicates that the write operation has been ended normally, is stored in the status register STR (FIG. 4), and the write operation is ended. The status data Stt is output to the controller die CD (FIG. 1) by a status read operation.

In step S108, the status data Stt, which indicates that the write operation has not been ended normally, is stored in the status register STR (FIG. 4), and the write operation is ended.

Figure 14:
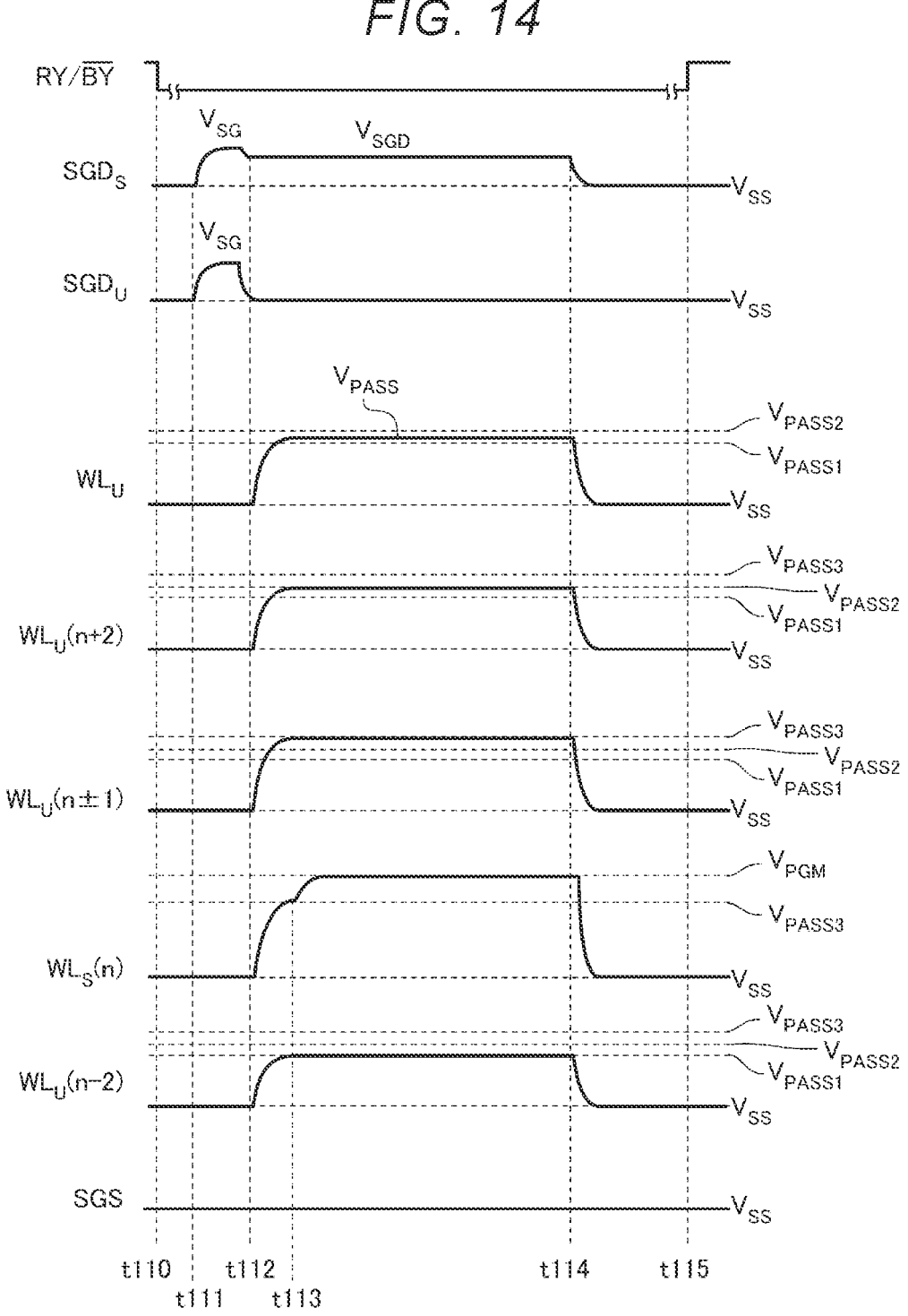
FIG. 14 is a timing chart illustrating aspects of an operation method of a semiconductor memory device according to the first embodiment.
Figure 15:
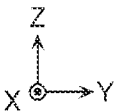
FIG. 15 is a schematic cross-sectional view illustrating aspects of an operation method of a semiconductor memory device according to the first embodiment.

FIG. 14 is a timing chart illustrating the write operation. FIG. 15 is a schematic cross-sectional view illustrating the write operation. FIG. 15 shows each voltage supplied from a timing t113 to a timing t114 in FIG. 14.

Among the plurality of selected memory cells MC, the selected memory cell MC that adjusts (changes) threshold voltage may be referred to as a "write memory cell MC", and the selected memory cell MC that does not adjust the threshold voltage may be referred to as an "inhibited memory cell MC".

For example, as shown in FIG. 14, at a timing t110 of the write operation, the controller die CD sequentially inputs the command data Cmd (FIG. 4) for an instruction of the write operation and the address data Add (FIG. 4) to the memory die MD. As a result, the terminal RY/(/BY) enters a period (a busy period) in an "L" state.

From the timings t110 to t111, for example, the voltage $V_{SRC}$ is supplied to the bit line $BL_W$ (FIG. 15), which is connected to the write memory cell MC, and the voltage $V_{DD}$ is supplied to the bit line BL, which is connected to the inhibited memory cell MC. The voltage $V_{SRC}$ is supplied to the source line SL (the semiconductor layer 112).

At the timing t111, the voltage $V_{SG}$ is supplied to the drain side select gate line $SGD_S$ and the drain side select gate line $SGD_U$, and then all the drain side select transistors STD are set to an ON state.

At the timing t112, the voltage $V_{SGD}$ is supplied to the drain side select gate line $SGD_S$. The voltage $V_{SGD}$ is lower than the voltage $V_{SG}$ and has a magnitude such that the drain side select transistor STD is turned into an ON state or an OFF state according to the voltage of the bit line BL. The ground voltage $V_{SS}$ is supplied to the drain side select gate line $SGD_U$ and the source side select gate line SGS, and the select transistors STD and STS that are connected thereto are set to an OFF state. The write pass voltage $V_{PASS3}$ is supplied to the selected word line $WL_S(n)$ and the unselected word lines $WL_U(n\pm1)$. The write pass voltage $V_{PASS2}$ is supplied to the unselected word line $WL_U(n+2)$. The write pass voltage $V_{PASS1}$ is supplied to the unselected word line $WL_U(n-2)$. The write pass voltage $V_{PASS}$ is supplied to other unselected word lines $WL_U$. The write pass voltage $V_{PASS}$ may have approximately the same magnitude as the read pass voltage $V_{READ}$ described with reference to FIG. 12, or may be higher than the read pass voltage $V_{READ}$. The write pass voltage $V_{PASS}$ is higher than the write pass voltage $V_{PASS1}$. The write pass voltage $V_{PASS2}$ is higher than the write pass voltage $V_{PASS1}$. The write pass voltage $V_{PASS3}$ is higher than write pass voltage $V_{PASS2}$.

At the timing t113, the program voltage $V_{PGM}$ is supplied to the selected word line $WL_S(n)$. The program voltage $V_{PGM}$ is higher than the write pass voltage $V_{PASS3}$.

Here, for example, as shown in FIG. 15, the voltage $V_{SRC}$ is supplied from the bit line BL to a channel of the semiconductor layer 120 that is connected to the bit line $BL_W$. A relatively large electric field is generated between the semiconductor layer 120 and the selected word line WL s as described above. Thus, electrons in the channel of the semiconductor layer 120 tunnel into the charge storage film 132 (FIG. 9) via the tunnel insulating film 131 (FIG. 9). As a result, the threshold voltage of the write memory cell MC is increased.

The channel of the semiconductor layer 120 that is connected to the bit line BL, which is other than the bit line $BL_W$, is electrically in a floating state, and the potential of this channel rises to approximately the write pass voltage $V_{PASS}$ due to capacitive coupling with the unselected word line $WL_U$. An electric field smaller than the above-described electric field is generated between the semiconductor layer 120 and the selected word line $WL_S$ as described above. Therefore, the electrons in the channel of the semiconductor layer 120 do not tunnel into the charge storage film 132 (FIG. 9). Therefore, the threshold voltage of the inhibited memory cell MC is not increased.

At the timing t114, the ground voltage $V_{SS}$ is supplied to the selected word line $WL_S$, the unselected word line $WL_U$, the drain side select gate line $SGD_S$, the drain side select gate line $SGD_U$, and the source side select gate line SGS.

At a timing t115, the write operation in memory die MD is ended. The state of the terminal RY/(/BY) is changed from the "L" state to the "H" state, and access to the memory die MD is permitted.

Erasing Operation

Next, an erasing operation of the memory die MD according to the present embodiment will be described. FIG. 16 is a flowchart illustrating the erasing operation.

In the following description, an example of executing the erasing operation with respect to the select memory block $BLK_{tb}$ that is an operation target will be described.

In step S111, for example, as shown in FIG. 16, a loop count $n_E$ is set to 1. The loop count $n_E$ is a variable that indicates the number of erasing loops.

In step S112, an erasing voltage supply operation is executed. The erasing voltage supply operation is an operation in which the ground voltage $V_{SS}$ is supplied to the word line WL, the voltage $V_{ERA}$ (FIG. 18, sometimes referred to as an erasing voltage) is supplied to at least one of the source line SL and the bit line BL, and then the threshold voltage of the memory cell MC is decreased.

In step S113, an erasing verification operation is performed. The erasing verification operation is an operation for supplying the erasing verification voltage $V_{VFYEr}$ to the word line WL, detecting the ON state/OFF state of the memory cell MC, and detecting whether the threshold voltage of the memory cell MC has reached the target value.

In step S114, the result of the erasing verification operation is determined. For example, a counter circuit is referenced to count the number of memory cells MC of which the threshold voltage has not reached the target value. When the number of memory cells MC of which the threshold voltage has not reached the target value is equal to or larger than a certain number, it is determined as verification FAIL, and the process proceeds to step S115. On the other hand, when the number of memory cells MC of which the threshold voltage has not reached the target value is less than a certain number, it is determined as verification PASS, and the process proceeds to step S117.

In step S115, it is determined whether the loop count $n_E$ has reached a predetermined count $N_E$. When the loop count $n_W$ has not reached the predetermined count $N_W$, the process proceeds to step S116. When the loop count $n_W$ has reached the predetermined count $N_W$, the process proceeds to step S118.

In step S116, 1 is added to the loop count $n_E$, and the process proceeds to step S112. In step S116, for example, a predetermined voltage $\Delta V$ is added to the voltage $V_{ERA}$ (FIG. 18) that is supplied to at least one of the source line SL and the bit line BL in the erasing voltage supply operation. Therefore, the voltage $V_{ERA}$ (FIG. 18) is increased as the loop count $n_E$ is increased.

In step S117, the status data Stt, which indicates that the erasing operation has been ended normally, is stored in the status register STR (FIG. 4), and the erasing operation is ended. The status data Stt is output to the controller die CD (FIG. 1) by a status read operation.

In step S118, the status data Stt, which indicates that the erasing operation has not been ended normally, is stored in the status register STR (FIG. 4), and the erasing operation is ended.

Figure 17:
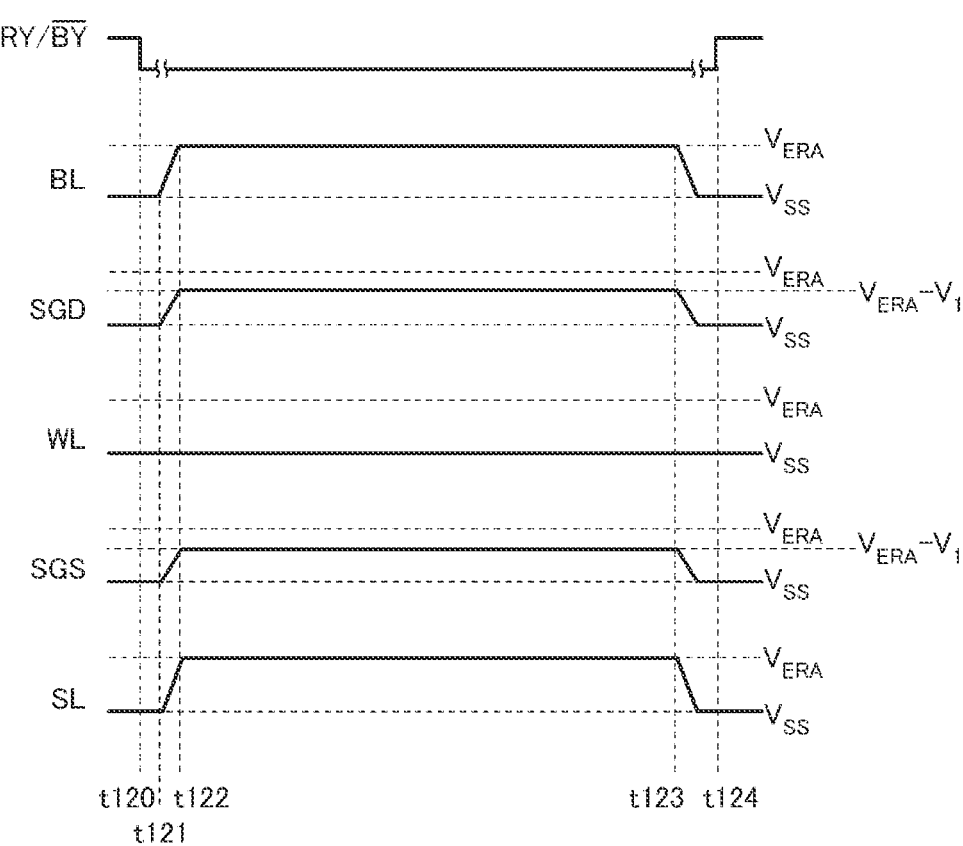
FIG. 17 is a timing chart illustrating aspects of an operation method of a semiconductor memory device according to the first embodiment.
Figure 18:
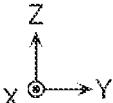
FIG. 18 is a schematic cross-sectional view illustrating aspects of an operation method of a semiconductor memory device according to the first embodiment.

FIG. 17 is a timing chart illustrating the erasing operation. FIG. 18 is a schematic cross-sectional view illustrating the erasing operation. FIG. 18 shows each voltage supplied from a timing t122 to a timing t123 in FIG. 17.

At a timing t120 of the erasing operation, the controller die CD sequentially inputs the command data Cmd for an instruction of the erasing operation and the address data Add to the memory die MD. As a result, the terminal RY/(/BY) enters a period (a busy period) in an "L" state.

At a timing t121 of the erasing operation, the voltage $V_{ERA}-V_1$ is supplied to each of the select gate lines (SGD, SGS) and the ground voltage $V_{SS}$ is supplied to the word line WL. The voltage $V_{ERA}-V_1$, which is supplied to the select gate lines (SGD, SGS), is higher than the ground voltage $V_{SS}$, which is supplied to the word lines WL. The voltage $V_{ERA}$ is supplied to the bit line BL and the source line SL (the semiconductor layer 112). At the timing t121 of the erasing operation, the voltage $V_{ERA}-V_1$ may be supplied to only one of the drain side select gate line SGD and the source side select gate line SGS. When the voltage $V_{ERA}-V_1$ is supplied to the drain side select gate line SGD, the voltage $V_{ERA}$ may be supplied to the bit line BL. When the voltage $V_{ERA}-V_1$ is supplied to the source side select gate line SGS, the voltage $V_{ERA}$ may be supplied to the source line SL.

From the timing t122 to the timing t123, data that is written in the memory cell MC is erased by gate induced drain leakage (GIDL), which will be described later.

At the timing t123, the ground voltage $V_{SS}$ is supplied to the bit line BL, the select gate lines (SGD, SGS), and the word line WL.

At the timing t124, the erasing operation in the memory die MD is ended. The state of the terminal RY/(/BY) is changed from the "L" state to the "H" state, and access to the memory die MD is permitted.

Erasing Operation by GIDL

From the timing t122 to the timing t123 in FIG. 17, as shown in FIG. 18, the voltage $V_{ERA}-V_1$ is supplied to the gate electrodes of the select transistors (STD, STS) via the select gate lines (SGD, SGS). The voltage $V_{ERA}$ is supplied to channel regions of the select transistors (STD, STS) via the bit line BL and the source line SL. Therefore, a voltage $V_1$ is applied between the gate electrode and the channel region of the select transistors (STD, STS).

The voltage $V_1$ is, for example, a voltage having a magnitude that causes the GIDL in the vicinity of the channel of the select transistors (STD, STS) (the surface of the semiconductor layer 120). For example, as shown in FIG. 18, the GIDL generates a pair of electron-holes in the vicinity of each of the channels of the select transistors (STD, STS).

The electron, which is generated in the drain side select transistor STD, is supplied to the bit line BL side, and the hole is supplied to the memory cell MC side. The electron, which is generated in the source side select transistor STS, is supplied to the source line SL side, and the hole is supplied to the memory cell MC side. Accordingly, the holes are stored in the channel region of the memory cell MC, and the voltage of the channel region of the memory cell MC rises.

From the timing t122 to the timing t123 in FIG. 17, the ground voltage $V_{SS}$ is supplied to the word line WL. Therefore, a voltage of approximately the same as the voltage $V_{ERA}$ is applied between the gate electrode and the channel region of the memory cell MC. This voltage has a magnitude that is approximately high enough for the hole, which is supplied by the GIDL, to tunnel through a tunnel insulating film 131 and reach the charge storage film 132.

By storing the hole, which is generated by the GIDL, in the charge storage film 132 (FIG. 9) of all the memory cells MC provided in the select memory block BLK t b in this way, the data in the memory cell MC is erased by decreasing the threshold voltage of the memory cell MC.

Erasing Verification Operation

Figure 19:
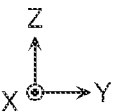
FIG. 19 is a schematic cross-sectional view illustrating aspects of an operation method of a semiconductor memory device according to the first embodiment.

FIG. 19 is a schematic cross-sectional view illustrating the erasing verification operation. For example, as shown in FIG. 19, in the erasing verification operation, the voltage $V_{SS}$ is supplied to the drain side select gate line $SGD_S$ and the source side select gate line SGS of the string unit SUa, and the select transistors STD and STS that are connected thereto are set to an ON state. The ground voltage $V_{SS}$ is supplied to the drain side select gate line $SGD_U$ of the other string units SUb to SUe, and the select transistor STD that is connected thereto is set to an OFF state. The erasing verification voltage $V_{VFYEr}$ is supplied to the word line WL, and whether the threshold voltage of the memory cell MC, which is provided in the string unit SUa, has reached the target value is detected.

Sub Block Mode

As semiconductor memory devices become highly integrated, the number of bits per memory block BLK is increased. Along with this, the erasing unit is increased, and the number of write operations at the time of the garbage collection is increased. Therefore, the semiconductor memory device according to the first embodiment is configured to be operated in a sub block mode. In the sub block mode, one memory block BLK is divided into two sub blocks, and the sub block is set to an erasing unit. In the sub block mode, for example, in the configuration among the memory blocks BLK, the memory block BLK, which is provided in the memory cell array layer $L_{MCA1}$ described with reference to FIG. 8, is defined as one sub block, and the memory block BLK, which is provided in the memory cell array layer $L_{MCA2}$, is defined as another sub block.

An erasing operation with respect to the sub block refers to performing the erasing operation on all the memory cells MC provided in the sub block. When the sub block is said to be in an erased state, it means that all the memory cells MC in the sub block are in the erased state.

Sub Block Mode Erasing Operation 1

Figure 20:
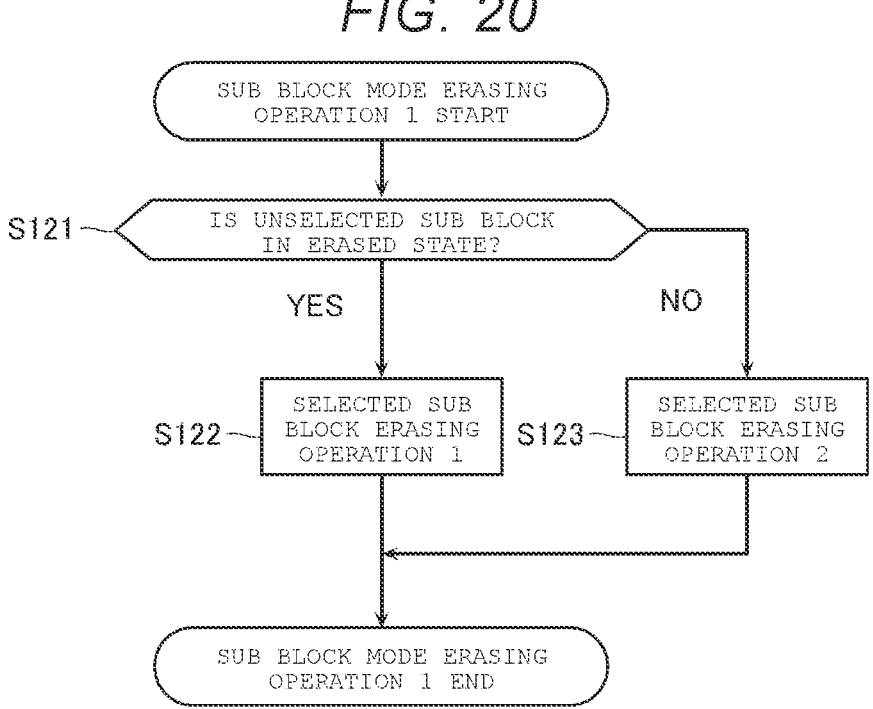
FIG. 20 is a flowchart illustrating an operation method of a semiconductor memory device according to the first embodiment.

The erasing operation in sub block mode will be described. FIG. 20 is a flowchart illustrating the sub block mode erasing operation 1.

In the following description, the sub block SBLK, which is an operation target, may be referred to as a selected sub block $SBLK_S$, and the sub block SBLK, which is not an operation target, may be referred to as an unselected sub block $SBLK_U$. In the following description, an example of executing the erasing operation with respect to the selected sub block $SBLK_S$ will be described.

In step S121, it is determined whether the unselected sub block $SBLK_U$ is in the erased state. If the unselected sub block $SBLK_U$ is in the erased state, the process proceeds to step S122, and if the unselected sub block $SBLK_U$ is not in the erased state, the process proceeds to step S123. A method of determining the erased state of the unselected sub block $SBLK_U$ will be described later.

In step S122, the selected sub block erasing operation 1 is executed.

In step S123, a selected sub block erasing operation 2 is executed.

Selected Sub Block Erasing Operation 1

The selected sub block erasing operation 1 is basically executed in the same manner as the erasing operation described with reference to FIG. 16. However, the erasing voltage supply operation and the erasing verification operation, which are executed in the selected sub block erasing operation 1, are respectively different from the erasing voltage supply operation and the erasing verification operation, which are executed in the erasing operation described with reference to FIG. 16.

Figure 21:
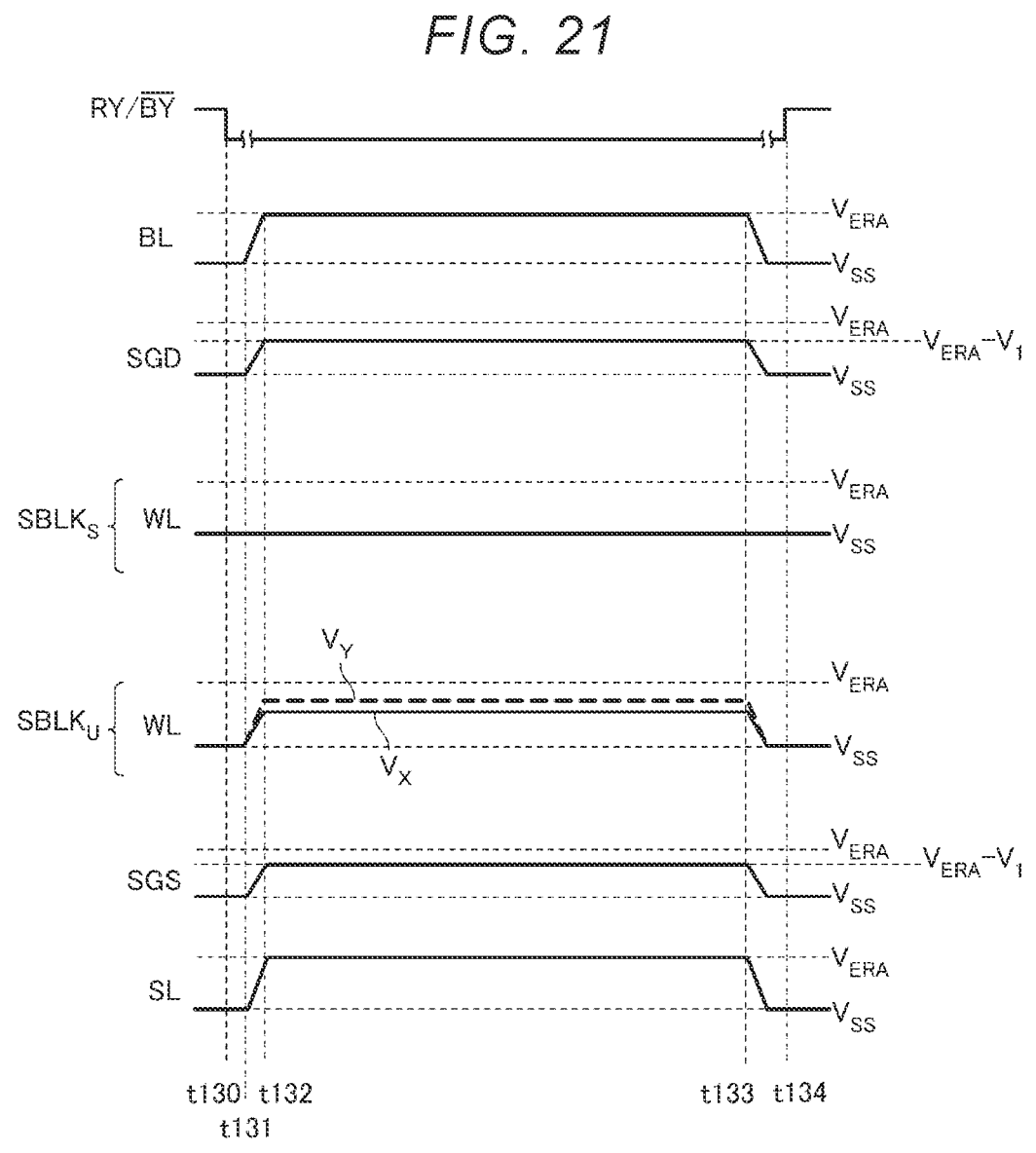

FIG. 21 is a timing chart illustrating the selected sub block erasing operation 1 and the selected sub block erasing operation 2. In FIG. 21, waveforms which are common to the selected sub block erasing operation 1 and the selected sub block erasing operation 2 are indicated by solid lines. In FIG. 21, when the waveform of the selected sub block erasing operation 2 is different from that of the selected sub block erasing operation 1, the waveform of the selected sub block erasing operation 2 is indicated by a broken line.

Figure 22:
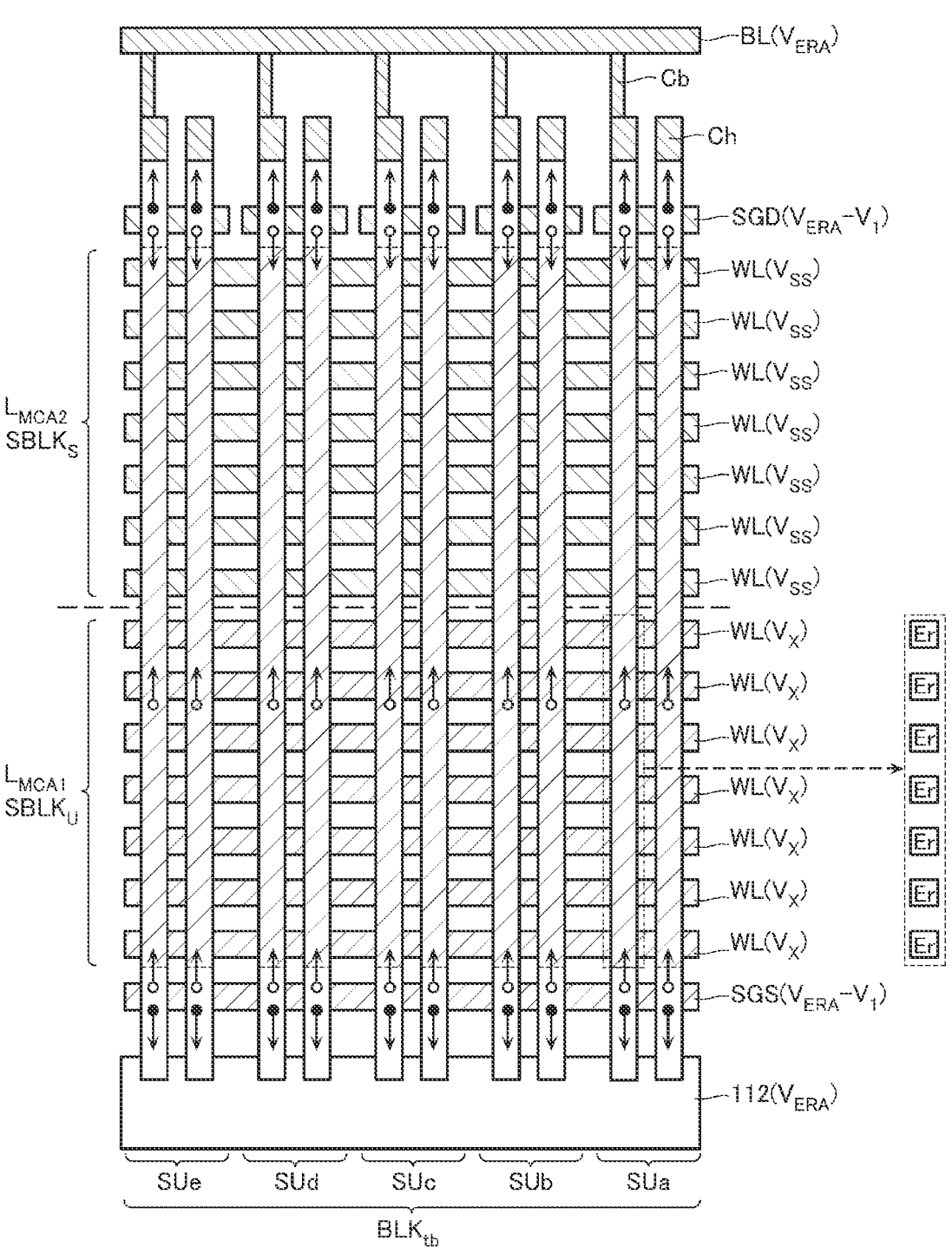
FIG. 22 is a schematic cross-sectional view illustrating aspects of an operation method of a semiconductor memory device according to the first embodiment.

FIG. 22 is a schematic cross-sectional view illustrating the erasing voltage supply operation executed in the selected sub block erasing operation 1. FIG. 22 shows an example in which in the select memory block $BLK_{tb}$, the memory cell array layer $L_{MCA2}$ includes the selected sub block $SBLK_S$, and the memory cell array layer $L_{MCA1}$ includes the unselected sub block $SBLK_U$.

The selected sub block erasing operation 1 is an operation of erasing the data in the memory cells MC of the selected sub block $SBLK_S$ when the memory cells MC of the unselected sub block $SBLK_U$ is in the erased state. In FIG. 22, "Er" indicates a mode in which the page PG is in the erased state (a mode in which the memory cells MC that are provided in the page PG are all in the Er state) in the unselected sub block $SBLK_U$.

At a timing t130 of the selected sub block erasing operation 1, as shown in FIG. 21, the terminal RY/(/BY) enters a period in the "L" state (a busy period) as the selected sub block erasing operation 1 is started.

At a timing t131 of the selected sub block erasing operation 1, as shown in FIGS. 21 and 22, the voltage $V_{ERA}-V_1$ is supplied to each of the select gate lines (SGD, SGS), and the voltage $V_{ERA}$ is supplied to the bit line BL and the source line SL (the semiconductor layer 112).

The ground voltage $V_{SS}$ is supplied to the word line WL of the selected sub block $SBLK_S$. Accordingly, a voltage of approximately the same as the voltage $V_{ERA}$ is applied between the gate electrode and the channel region of the memory cell MC in the selected sub block $SBLK_S$.

An unselect erasing voltage $V_X$, which is higher than the ground voltage $V_{SS}$, is supplied to the word line WL of the unselected sub block $SBLK_U$. Accordingly, a voltage $V_{ERA}-V_X$, which is lower than the voltage $V_{ERA}$, is applied between the gate electrode and the channel region of the memory cell MC in the unselected sub block $SBLK_U$. The voltage $V_{ERA}-V_X$ is a voltage such that the hole does not tunnel through the tunnel insulating film 131 even when the memory cell MC in the unselected sub block $SBLK_U$ is in the Er state, that is, in a state in which the electrons are not stored in the charge storage film 132. The voltage $V_{ERA}-V_X$ has a magnitude such that the memory cell MC is in an ON state when the memory cell MC is operated as a PMOS transistor.

From a timing t132 to a timing t133, in the memory cell MC of the selected sub block $SBLK_S$, the data in the memory cell MC is erased by storing the hole that has tunneled through the tunnel insulating film 131 in the charge storage film 132 (FIG. 9). However, in the memory cell MC of the unselected sub block $SBLK_U$, since the hole does not tunnel through the tunnel insulating film 131, a threshold value of the memory cell MC is not further decreased (over-erasing).

In the erasing voltage supply operation that is executed in the selected sub block erasing operation 1, as shown in FIG. 22, the hole, which is generated in the vicinity of the channel of the select transistor STS, is transferred to the selected sub block SBLK$_S$ via the channel region corresponding to the unselected sub block SBLK$_U$, and is used to erase the memory cell MC.

At the timing t133, the ground voltage V$_{SS}$ is supplied to the bit lines BL, the select gate lines (SGD, SGS), the word lines WL of the selected sub block SBLK$_S$ and the unselected sub block SBLK$_U$, and the source line SL.

At the timing t134, the erasing operation in the memory die MD is ended. The state of the terminal RY/(/BY) is changed from the "L" state to the "H" state, and access to the memory die MD is permitted.

Figure 23:
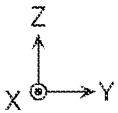
FIG. 23 is a schematic cross-sectional view illustrating aspects of an operation method of a semiconductor memory device according to the first embodiment.

FIG. 23 is a schematic cross-sectional view illustrating the erasing verification operation executed in the selected sub block erasing operation 1. This erasing verification operation is basically executed in the same manner as the erasing verification operation described with reference to FIG. 19. In the erasing verification operation that is executed in the selected sub block erasing operation 1, the read pass voltage V$_{READ}$ is supplied to the word line WL of the unselected sub block SBLK$_U$.

Selected Sub Block Erasing Operation 2

The selected sub block erasing operation 2 is basically executed in the same manner as the selected sub block erasing operation 1. The erasing voltage supply operation, which is executed in the selected sub block erasing operation 2, is different from the erasing voltage supply operation, which is executed in the selected sub block erasing operation 1.

Figure 24:
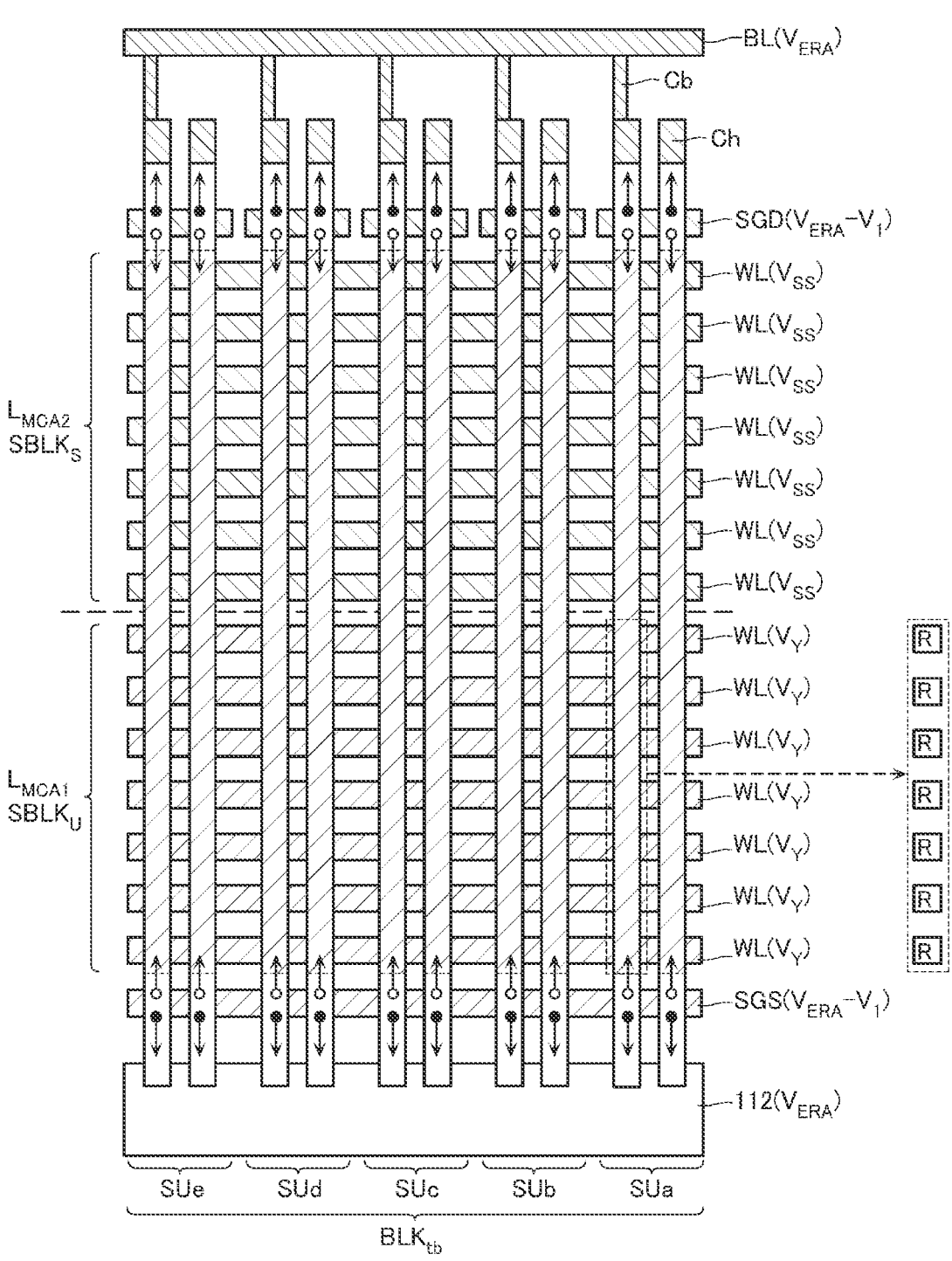
FIG. 24 is a schematic cross-sectional view illustrating aspects of an operation method of a semiconductor memory device according to the first embodiment.

FIG. 24 is a schematic cross-sectional view illustrating the erasing voltage supply operation executed in the selected sub block erasing operation 2. As in FIG. 22, FIG. 24 shows an example in which the memory cell array layer L$_{MCA2}$ includes the selected sub block SBLK$_S$, and the memory cell array layer L$_{MCA1}$ includes the unselected sub block SBLK$_U$.

The selected sub block erasing operation 2 is an operation of erasing the data in the memory cells MC of the selected sub block SBLK$_S$ when the memory cells MC of the unselected sub block SBLK$_U$ is in the non-erased state, for example, in the written state. In FIG. 24, "R" indicates a mode in which the page PG is in the written state (a mode in which the memory cell MC in a state other than the Er state is provided in the memory cell MC that is provided in the page PG) in the unselected sub block SBLK$_U$.

At the timing t130 of the selected sub block erasing operation 2, in the same manner as the selected sub block erasing operation 1, the terminal RY/(/BY) enters a period in the "L" state (a busy period) as the selected sub block erasing operation 2 is started.

At the timing t131 of the selected sub block erasing operation 2, as shown in FIGS. 21 and 24, a voltage that is similar to that in the selected sub block erasing operation 1 is supplied to the bit line BL, the select gate lines (SGD, SGS), the word line WL of the selected sub block SBLK$_S$, and the source line SL. Accordingly, a voltage of approximately the same as the voltage V$_{ERA}$ is applied between gate electrode and the channel region of the memory cell MC in the selected sub block SBLK$_S$.

However, an unselect erasing voltage V$_Y$, which is higher than the unselect erasing voltage V$_X$ (FIG. 22), is supplied to the word line WL of the unselected sub block SBLK$_U$. Accordingly, a voltage V$_{ERA}$–V$_Y$, which is lower than the voltage V$_{ERA}$–V$_X$ is applied between the gate electrode and the channel region of the memory cell MC in the unselected sub block SBLK$_U$. The voltage V$_{ERA}$–V$_Y$ is a voltage at which the hole does not tunnel through the tunnel insulating film 131 when the page PG in the unselected sub block SBLK$_U$ is in the written state "R".

From a timing t132 to a timing t133, in the memory cell MC of the selected sub block SBLK$_S$, the data in the memory cell MC is erased by storing the hole that has tunneled through the tunnel insulating film 131 in the charge storage film 132 (FIG. 9). However, in the memory cell MC of the unselected sub block SBLK$_U$, since the hole does not tunnel through the tunnel insulating film 131, the threshold value of memory cell MC in the written state is not decreased.

Comparative Example

Figure 25A:
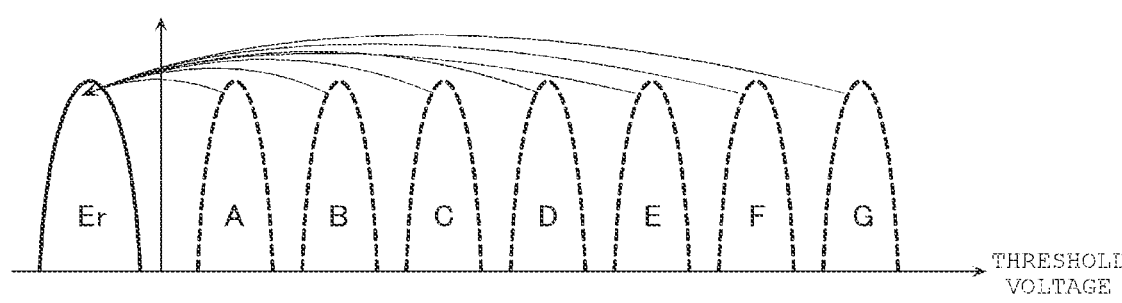
FIGS. 25A and 25B are schematic histograms illustrating aspects of a semiconductor memory device according to a comparative example.
Figure 25B:
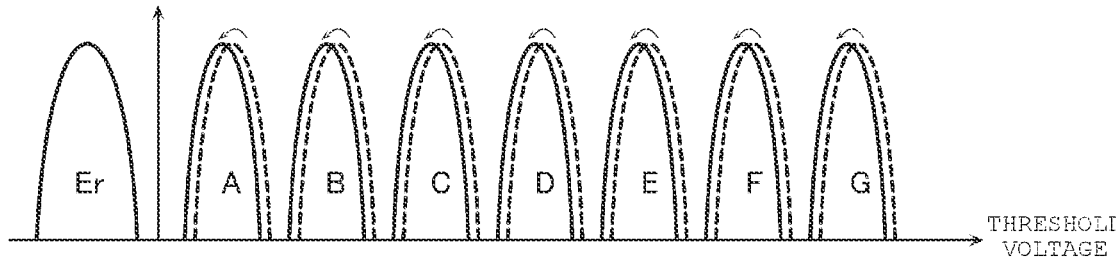

Next, a case where the sub block mode erasing operation X, which is different from the present embodiment, is performed on the selected sub block SBLK$_S$ of the semiconductor memory device according to a comparative example, will be described. FIGS. 25A and 25B are schematic histograms illustrating a semiconductor memory device according to the comparative example. The horizontal axis indicates a voltage of the word line WL, and the vertical axis indicates the number of memory cells MC.

The sub block mode erasing operation X does not determine whether the unselected sub block SBLK$_U$ is in the erased state. The erasing voltage supply operation, which is executed in the sub block mode erasing operation X, supplies the unselect erasing voltage V$_X$ to the word line WL of the unselected sub block SBLK$_U$ when the unselected sub block SBLK$_U$ is in either the erased state or the written state.

FIG. 25A shows a mode in which the selected sub block SBLK$_S$ is erased by executing the sub block mode erasing operation X. In the selected sub block SBLK$_S$, the memory cells MC, which are written in the A state to the G state, are respectively erased in the Er state by executing the sub block mode erasing operation X.

FIG. 25B shows a mode in which the threshold values of the memory cells MC that are written in the A state to the G state of the unselected sub block SBLK$_U$ are respectively decreased by executing the sub block mode erasing operation X. Even when the unselected sub block SBLK$_U$ is in the written state, similar to the erased state, when a relatively low unselect erasing voltage V$_X$ is supplied to the word line WL of the unselected sub block SBLK$_U$, a relatively high voltage is supplied between the gate electrode and the channel region of the memory cell MC in the unselected sub block SBLK$_U$, and the hole tunnels through the tunnel insulating film 131, and then such erroneous erasure may occur.

Effects

The semiconductor memory device according to the present embodiment determines whether the unselected sub block SBLK$_U$ is in the erased state at the time of performing the erasing operation on the selected sub block SBLK$_S$. When the unselected sub block SBLK$_U$ is in the erased state, the unselect erasing voltage V$_X$ is supplied to the word line WL of the unselected sub block SBLK$_U$. When the unselected sub block SBLK$_U$ is in the written state, the unselect erasing voltage V$_Y$, which is higher than the unselect erasing voltage V$_X$, is supplied to the word line WL of the unselected sub block SBLK$_U$.

In such a case, when the unselected sub block SBLK$_U$ is in the written state, a relatively low voltage (the voltage V$_{ERA}$–V$_Y$) is supplied between the gate electrode and the channel region of the memory cell MC in the unselected sub block $SBLK_U$. As a result, it becomes difficult for the hole to tunnel through the tunnel insulating film 131. Therefore, the erroneous erasure of the unselected sub block $SBLK_U$ as described with reference to FIG. 25B can be prevented.

When the unselected sub block $SBLK_U$ is in the erased state, a relatively high voltage (the voltage $V_{ERA}-V_X$) can be supplied between the gate electrode and the channel region of the memory cell MC in the unselected sub block $SBLK_U$. As a result, the hole, which is generated in the vicinity of the channel of the select transistor STS, can be efficiently transferred to the selected sub block $SBLK_S$ via the channel region corresponding to the unselected sub block $SBLK_U$. As a result, a speed of the erasing operation of the selected sub block $SBLK_S$ can be improved.

As a result, it is possible to implement the semiconductor memory device that operates favorably.

Determination Method 1 for Erased State of Memory Cell MC

Next, the determination method 1 for the erased state of the memory cell MC (step S121 in FIG. 20) will be described with reference to FIGS. 26A and 26B.

Figures 26A, 26B:
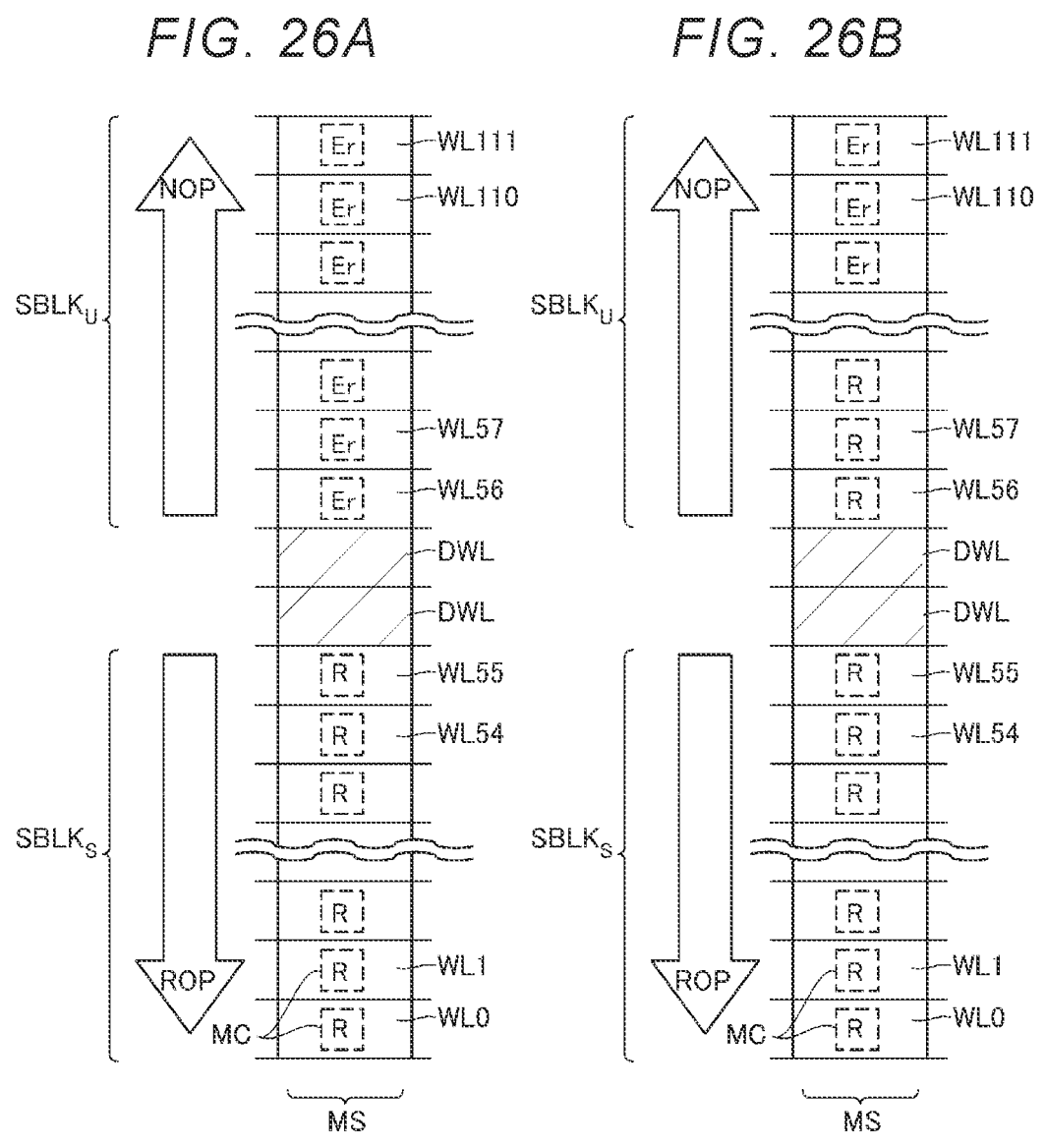

FIGS. 26A and 26B show a plurality of word lines WL0 to WL111 numbered from 0 from the bottom and the memory cells MC corresponding to the plurality of word lines WL0 to WL111. A writing order in which the write operation is performed sequentially from the bottom of the page PG is referred to as a normal write direction NOP, and the writing order in which the write operation is performed sequentially from the top of the page PG is referred to as a reverse write direction ROP. FIGS. 26A and 26B show an example in which the reverse write direction ROP is applied to the page PG that corresponds to word lines WL0 to WL55, and the normal write direction NOP is applied to the page PG that corresponds to word lines WL56 to WL111.

FIGS. 26A and 26B show an example in which the selected sub block $SBLK_S$ includes the word lines WL0 to WL55, the unselected sub block $SBLK_U$ includes the word lines WL56 to WL111, and a plurality of dummy word lines DWL are provided between the selected sub block $SBLK_S$ and the unselected sub block $SBLK_U$.

FIG. 26A shows a case where all the pages PG in the unselected sub block $SBLK_U$ are in the erased state "Er". When the normal write direction NOP is applied to the page PG that corresponds to the word lines WL56 to WL111, the page PG that corresponds to the word line WL56 in the lowermost layer is in the erased state "Er".

FIG. 26B shows a case where a part of pages PG in the unselected sub block $SBLK_U$ are in the written state "R". When the normal write direction NOP is applied to the page PG that corresponds to the word lines WL56 to WL111, the page PG that corresponds to the word line WL56 in the lowermost layer of at least the unselected sub block $SBLK_U$ is in the written state "R".

Therefore, when the normal write direction NOP is applied to the page PG that corresponds to the unselected sub block $SBLK_U$, it can be determined whether the entire unselected sub block $SBLK_U$ is in the erased state by performing the read operation on the page PG that corresponds to the word line WL in the lowermost layer of the unselected sub block $SBLK_U$.

When the reverse write direction ROP is applied to the page PG that corresponds to the unselected sub block $SBLK_U$, it can be determined whether the entire unselected sub block $SBLK_U$ is in the erased state by performing the read operation on the page PG that corresponds to the word line WL in the uppermost layer of the unselected sub block $SBLK_U$.

Determination Method 2 for Erased State of Memory Cell MC

As another determination method that is executed in step S121 in FIG. 20, a determination method 2 for the erased state of the memory cells MC, which will be described below, may be executed. In the determination method 2 for the erased state of the memory cells MC, the erasing verification operation as described with reference to FIG. 23 may be performed on a plurality of pages PG that correspond to the unselected sub blocks $SBLK_U$.

Modification 1

Next, Modification 1 of the semiconductor memory device according to the first embodiment will be described with reference to FIG. 27. FIG. 27 is a flowchart illustrating Modification 1 of the first embodiment.

The semiconductor memory device according to the present modification is basically configured in the similar manner to the semiconductor memory device according to the first embodiment. In the semiconductor memory device according to the present modification, the controller die CD includes a register or the like that records the erased state and written state in a unit of a sub block. The semiconductor memory device according to the present modification performs a sub block mode erasing operation 2 (FIG. 27) instead of the sub block mode erasing operation 1 (FIG. 20).

Sub Block Mode Erasing Operation 2

In step S131, it is determined whether the unselected sub block $SBLK_U$ is in the erased state. When the unselected sub block $SBLK_U$ is in the erased state, the process proceeds to step S132, and when the unselected sub block $SBLK_U$ is not in the erased state, the process proceeds to step S133. The erased state and written state of the unselected sub block $SBLK_U$ are determined based on a register value or the like that is provided in the controller die CD and the like.

In step S132, the controller die CD sequentially inputs the command data Cmd for an instruction of the above-described selected sub block erasing operation 1 and the address data Add to the memory die MD. As a result, the selected sub block erasing operation 1 is executed in the memory die MD, and the selected sub block $SBLK_S$ is erased.

In step S133, the controller die CD sequentially inputs the command data Cmd for an instruction of the above-described selected sub block erasing operation 2 and the address data Add to the memory die MD. As a result, the selected sub block erasing operation 2 is executed in the memory die MD, and the data in the memory cell MC of the selected sub block $SBLK_S$ is erased.

Modification 2

Next, Modification 2 of the semiconductor memory device according to the first embodiment will be described with reference to FIG. 28. FIG. 28 is a flowchart illustrating Modification 2 of the first embodiment.

The semiconductor memory device according to the present modification is basically configured in the similar manner to the semiconductor memory device according to the first embodiment. The semiconductor memory device according to the present modification performs a sub block mode erasing operation 3 (FIG. 28) instead of the sub block mode erasing operation 1 (FIG. 20).

Sub Block Mode Erasing Operation 3

In step S141, it is determined whether the unselected sub block $SBLK_U$ is in the erased state. When the unselected sub block $SBLK_U$ is in the erased state, the process proceeds to step S142, and when the unselected sub block $SBLK_U$ is not in the erased state, the process proceeds to step S143. As for the method of determining the erased state of the unselected sub block $SBLK_U$, the same method as in the first embodiment may be used, or the determination may be made based on the register value that is provided in the controller die CD or the like.

In step S142, a selected sub block erasing operation 3, which will be described later, is executed.

In step S143, the selected sub block erasing operation 2 described with reference to FIG. 24 is executed.

Selected sub Block Erasing Operation 3

The selected sub block erasing operation 3 is basically executed in the same manner as the selected sub block erasing operation 1. The erasing voltage supply operation, which is executed in the selected sub block erasing operation 3, is executed in the same manner as the erasing voltage supply operation described with reference to FIG. 18. For example, in FIG. 18 a case where the memory cell array layer $L_{MCA2}$ includes one of the unselected sub block $SBLK_U$ or the selected sub block $SBLK_S$, and the memory cell array layer $L_{MCA1}$ includes the other, will be described.

For example, as shown in FIG. 18, in the erasing voltage supply operation that is executed in the selected sub block erasing operation 3, the ground voltage $V_{SS}$ is supplied to the word lines WL of both the selected sub block $SBLK_S$ and the unselected sub block $SBLK_U$. Accordingly, a voltage of approximately the same as the voltage $V_{ERA}$ is applied between the gate electrode and the channel region of the memory cell MC in the selected sub block $SBLK_S$ and the unselected sub block $SBLK_U$, and the data of the memory cell MC is erased.

Effects

In step S141, even when it is determined that the unselected sub block $SBLK_U$ is in the erased state, due to the erroneous writing or the like, the threshold voltage of a part of the memory cells MC provided in the unselected sub block $SBLK_U$ may be higher than the erasing verification voltage $V_{VFYEr}$. In such a case, by executing the selected sub block erasing operation 3, the threshold voltages of the memory cells MC in the unselected sub blocks $SBLK_U$ can have a normal threshold voltage distribution corresponding to the Er state by performing the erasing operation on the unselected sub block $SBLK_U$ simultaneously with the selected sub block $SBLK_S$.

Modification 3

Figure 29:
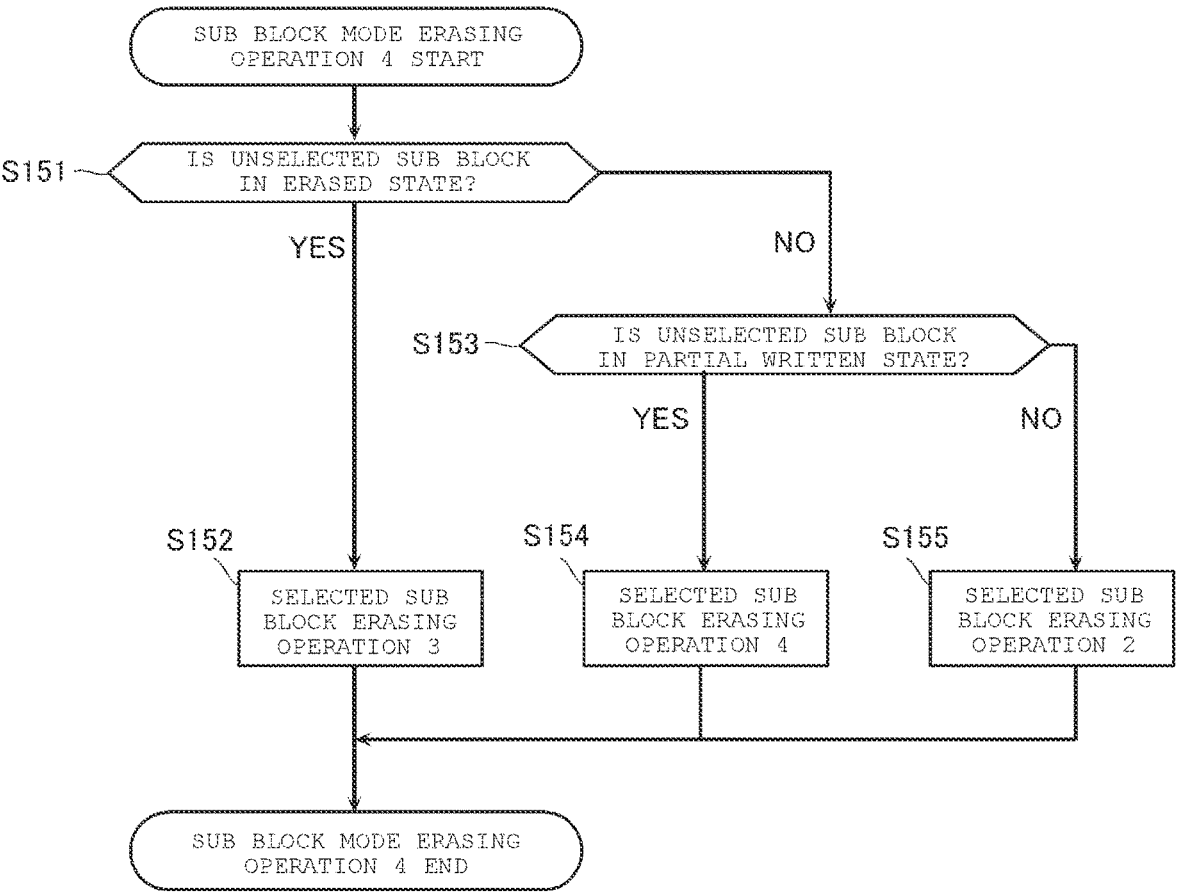
FIG. 29 is a flowchart illustrating Modification 3 of a semiconductor memory device according to the first embodiment.

Next, Modification 3 of the semiconductor memory device according to the first embodiment will be described with reference to FIGS. 29, and 30. FIG. 29 is a flowchart illustrating the present modification.

The semiconductor memory device according to the present modification is basically configured in the similar manner to the semiconductor memory device according to the first embodiment. The semiconductor memory device according to the present modification performs a sub block mode erasing operation 4 (FIG. 29) instead of the sub block mode erasing operation 1 (FIG. 20).

Sub Block Mode Erasing Operation 4

In step S151, it is determined whether the unselected sub block $SBLK_U$ is in the erased state. When the unselected sub block $SBLK_U$ is in the erased state, the process proceeds to step S152, and when the unselected sub block $SBLK_U$ is not in the erased state, the process proceeds to step S153. As for the method of determining the erased state of the unselected sub block $SBLK_U$, the same method as the method described in the sub block mode erasing operation 1 may be used, or the determination may be made based on the register value that is provided in the controller die CD or the like.

In step S152, the selected sub block erasing operation 3 described in Modification 2 is executed. In the present step S152, instead of the selected sub block erasing operation 3, the selected sub block erasing operation 1 (FIG. 22) may be executed.

In step S153, it is determined whether the unselected sub block $SBLK_U$ is in a partial-written state (a less than fully written state). When the unselected sub block $SBLK_U$ is in the partial-written state, the process proceeds to step S154, and if not in the partial-written state, the process proceeds to step S155. The partial-written state is a state in which the selected sub block SBLK S includes the pages PG in both the written state "R" and the erased state "Er".

In step S154, a selected sub block erasing operation 4, which will be described later, is executed.

In step S155, the selected sub block erasing operation 2 (FIG. 24) described in the first embodiment is executed.

Selected Sub Block Erasing Operation 4

The selected sub block erasing operation 4 is basically executed in the same manner as the selected sub block erasing operation 1. The erasing voltage supply operation, which is executed in the selected sub block erasing operation 4, is different from the erasing voltage supply operation, which is executed in the selected sub block erasing operation 1.

Figure 30:
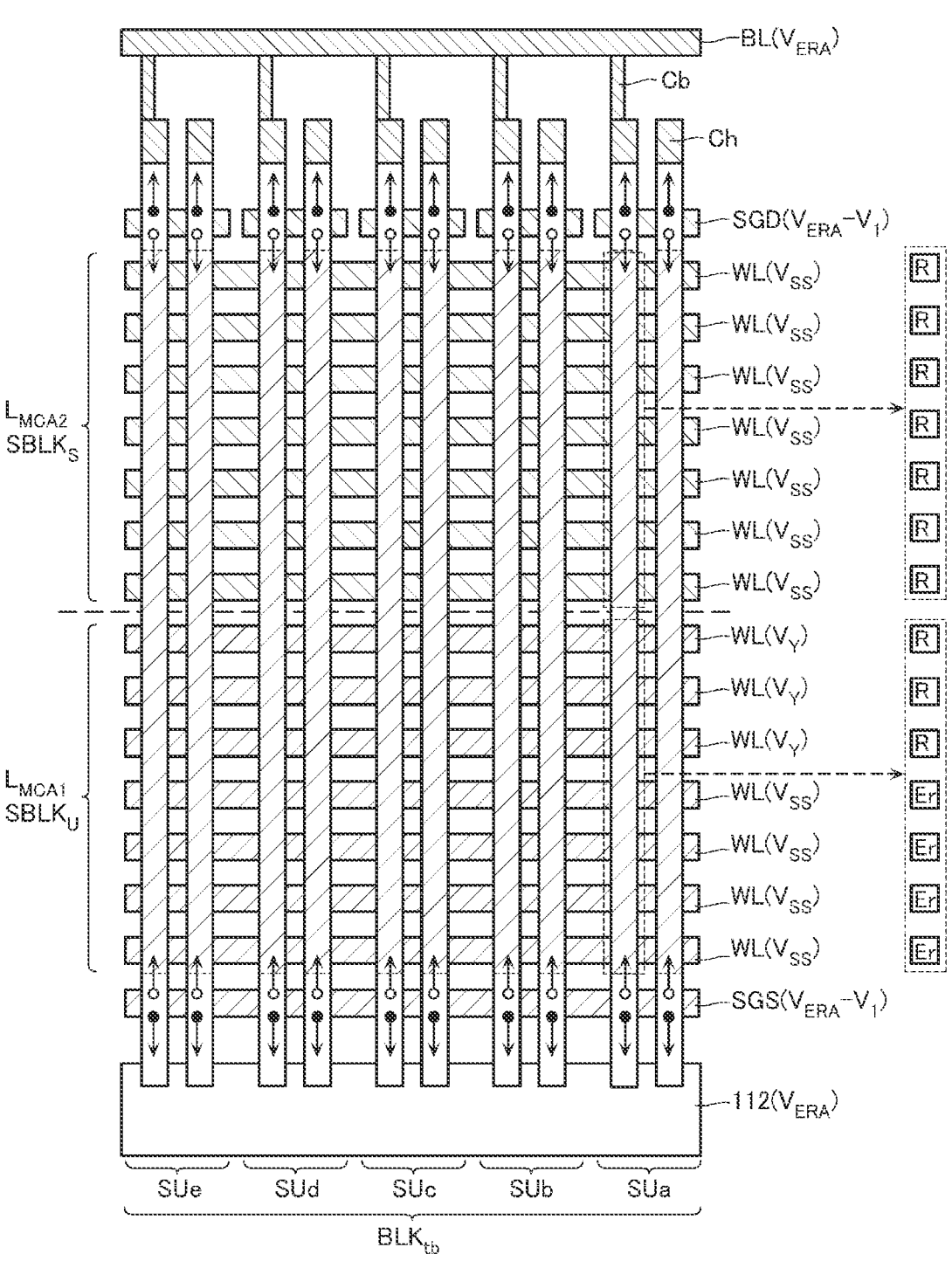
FIG. 30 is a schematic cross-sectional view illustrating aspects of Modification 3 of the semiconductor memory device according to the first embodiment.

FIG. 30 is a schematic cross-sectional view illustrating the erasing voltage supply operation executed in the selected sub block erasing operation 4. FIG. 30 shows an example in which the memory cell array layer $L_{MCA2}$ includes the selected sub block $SBLK_S$, and the memory cell array layer $L_{MCA1}$ includes the unselected sub block $SBLK_U$.

FIG. 30 shows a state of the memory cell MC when the reverse write direction ROP is partially performed on the unselected sub block $SBLK_U$ as an example in which the unselected sub block $SBLK_U$ is in the partial-written state. In the example shown in FIG. 30, the pages PG corresponding to the first to third word lines WL from the top of the unselected sub block $SBLK_U$ are in the written state "R", and the pages PG corresponding to the word lines WL located below the third from the top are in the erased state "Er".

The erasing voltage supply operation, which is executed in the selected sub block erasing operation 4, is basically the same operation as the erasing voltage supply operation (FIG. 24), which is executed in the selected sub block erasing operation 2. However, in the erasing voltage supply operation performed in the selected sub block erasing operation 4, the unselect erasing voltage $V_Y$ is supplied to the word line WL, which is provided in the unselected sub block $SBLK_U$ and which corresponds to the page PG in the written state "R", and the ground voltage $V_{SS}$ is supplied to the word line WL that corresponds to the page PG in the erased state "Er".

As a result, the threshold voltages of the memory cells MC, which are in the page PG that is provided in the selected sub block $SBLK_S$ and that is in the written state "R", and in the page PG that is provided in the unselected sub block $SBLK_U$ and that is in the erased state "Er", are the threshold voltages in the Er state. However, the threshold voltage of the memory cell MC, which is in the page PG that is provided in unselected sub block $SBLK_U$ and that is in written state "R", is not changed.

Effects

The threshold voltage of the memory cell MC, which is in the page PG in the erased state "Er" provided in the unselected sub block $SBLK_U$ of the partial-written state, may be higher than the erasing verification voltage $V_{VFYEr}$ due to the erroneous writing. Therefore, by performing the erasing operation on the memory cell MC, which is in the page PG that is provided in the unselected sub block $SBLK_U$ and that is in the erased state "Er", simultaneously with the selected sub block $SBLK_S$, a deviation of the threshold voltage due to erroneous writing can be reset.

Second Embodiment

Next, a semiconductor memory device according to a second embodiment will be described. The semiconductor memory device according to the present embodiment is basically configured in the similar manner to the semiconductor memory device according to the first embodiment. However, the semiconductor memory device according to the second embodiment is configured to execute a sub block mode write operation 1. In the following description, the description of the same configuration and operation as those of the first embodiment may be omitted.

Sub Block Mode Write Operation 1

FIG. 31 is a flowchart illustrating the sub block mode write operation 1.

In step S201, it is determined whether the unselected sub block $SBLK_U$ is in the erased state. When the unselected sub block $SBLK_U$ is in the erased state, the process proceeds to step S202, and when the unselected sub block $SBLK_U$ is not in the erased state, the process proceeds to step S203. The same method as in the first embodiment is used for a method of determining the erased state of the unselected sub block $SBLK_U$.

In step S202, a selected sub block write operation 1, which will be described later, is executed.

In step S203, a selected sub block write operation 2, which will be described later, is executed.

Selected Sub Block Write Operation 1

The selected sub block write operation 1 is basically executed in the same manner as the write operation described with reference to FIG. 13. A program operation and a verification operation, which are executed in the selected sub block write operation 1, are each different from the program operation and the verification operation, which are executed in the write operation described with reference to FIG. 13.

Figure 32:
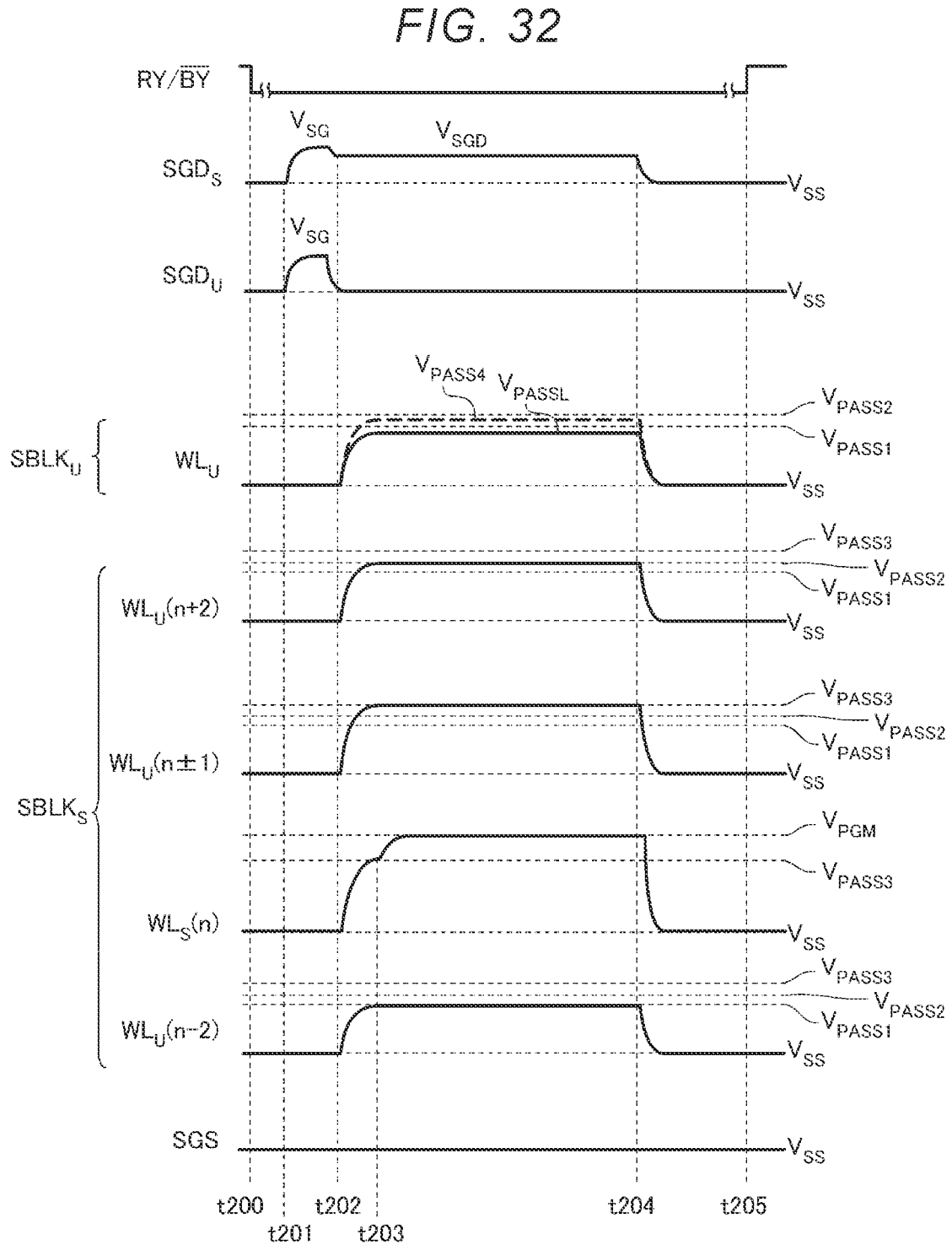
FIG. 32 is a timing chart illustrating aspects of a semiconductor memory device according to the second embodiment.

FIG. 32 is a timing chart illustrating the selected sub block write operation 1 and the selected sub block write operation 2. In FIG. 32, waveforms, which are common to the selected sub block write operation 1 and the selected sub block write operation 2, are indicated by solid lines. In FIG. 32, when the waveform of the selected sub block write operation 2 is different from that of the selected sub block write operation 1, the waveform of the selected sub block write operation 2 is indicated by a broken line. In the following description, description of operations similar to the write operations described with reference to FIGS. 14 and 15 may be omitted.

Figure 33:
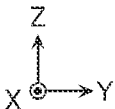
FIG. 33 is a schematic cross-sectional view illustrating aspects of a semiconductor memory device according to the second embodiment.

FIG. 33 is a schematic cross-sectional view illustrating a program operation executed in the selected sub block write operation 1. FIG. 33 shows an example in which in the select memory block $BLK_{tb}$, the memory cell array layer $L_{MCA2}$ includes the unselected sub block $SBLK_U$, and the memory cell array layer $L_{MCA1}$ includes the selected sub block $SBLK_S$.

The selected sub block write operation 1 is an operation of writing the data in the memory cells MC of the selected page PG of the selected sub block $SBLK_S$ when the memory cell MC of the unselected sub block $SBLK_U$ is in the erased state.

At a timing t200 of the selected sub block write operation 1, as shown in FIG. 32, the terminal RY/(/BY) enters a period in the "L" state (a busy period) as the selected sub block write operation 1 is started.

From the timings t200 to t201 of the selected sub block write operation 1, the voltage $V_{SRC}$ is supplied to the bit line $BL_W$ and the source line SL (the semiconductor layer 112), in the same manner as the timings t110 to t111 of the write operation (FIG. 14).

At the timing t201 of the selected sub block write operation 1, the same operation as the timing t111 of the write operation (FIG. 14) is performed and all the drain side select transistors STD are set to an ON state.

At a timing t202 of the selected sub block write operation 1, basically in the same manner as the timing t112 of the write operation (FIG. 14), the voltage $V_{SGD}$ is supplied to the drain side select gate line $SGD_S$, the ground voltage $V_{SS}$ is supplied to the drain side select gate line $SGD_U$ and the source side select gate line SGS, the write pass voltage $V_{PASS3}$ is supplied to the selected word line $WL_S(n)$ and the unselected word line $WL_U(n\pm1)$, the write pass voltage $V_{PASS2}$ is supplied to the unselected word line $WL_U(n+2)$, and the write pass voltage $V_{PASS1}$ is supplied to the unselected word line $WL_U(n-2)$. However, at the timing t202 of the selected sub block write operation 1, the write pass voltage $V_{PASSL}$ is supplied to the unselected word line $WL_U$ of the unselected sub block $SBLK_U$. The write pass voltage $V_{PASSL}$ is lower than the write pass voltage $V_{PASS1}$.

At a timing t203 of selected sub block write operation 1, the program voltage $V_{PGM}$ is supplied to selected word line $WL_S(n)$ as at the timing t113 of the write operation (FIG. 14). As a result, the threshold voltage of the write memory cell MC is increased.

At a timing t204 of the selected sub block write operation 1, in the same manner as the timing t114 of the write operation (FIG. 14), the ground voltage $V_{SS}$ is supplied to the selected word line $WL_S$, the unselected word line $WL_U$, the drain side select gate line $SGD_S$, the drain side select gate line $SGD_U$, and the source side select gate line SGS.

At a timing t205 of the selected sub block write operation 1, the write operation in memory die MD is ended. The state of the terminal RY/(/BY) is changed from the "L" state to the "H" state, and access to the memory die MD is permitted.

Verification Operation

The verification operation, which is executed in the selected sub block write operation 1, is basically executed in the same manner as the verification operation described with reference to FIG. 13. In the verification operation that is executed in the selected sub block write operation 1, the read pass voltage $V_{READ}$ is supplied to the word line WL of the unselected sub block $SBLK_U$.

Selected Sub Block Write Operation 2

The selected sub block write operation 2 is basically executed in the same manner as the selected sub block write operation 1. The program operation, which is executed in the selected sub block write operation 2, is different from the program operation, which is executed in the selected sub block write operation 1.

Figure 34:
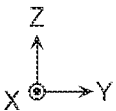
FIG. 34 is a schematic cross-sectional view illustrating aspects of a semiconductor memory device according to the second embodiment.

FIG. 34 is a schematic cross-sectional view illustrating the program operation executed in the sub block write operation 2. As in FIG. 33, FIG. 34 shows an example in which the memory cell array layer $L_{MCA2}$ includes the unselected sub block $SBLK_U$, and the memory cell array layer $L_{MCA1}$ includes the selected sub block $SBLK_S$.

The selected sub block write operation 2 is an operation of writing the data in the memory cells MC of the selected page PG of the selected sub block SBLK$_S$ when the memory cells MC of the unselected sub block SBLK$_U$ is in the written state.

At timings t200 to t201 of the selected sub block write operation 2, the same operation as the selected sub block write operation 1 is performed.

At a timing t202 of the selected sub block write operation 2, basically the same operation as the selected sub block write operation 1 is performed. However, different from the selected sub block write operation 1, at the timing t202 of the selected sub block write operation 2, the write pass voltage V$_{PASS4}$ is supplied to the unselected word line WL$_U$ of the unselected sub block SBLK$_U$. The write pass voltage V$_{PASS4}$ is higher than the write pass voltage V$_{PASS1}$ and lower than the write pass voltage V$_{PASS2}$.

At timings t203 to t205 of the selected sub block write operation 2, the same operation as the selected sub block write operation 1 is performed.

Comparative Example

Figure 35A:
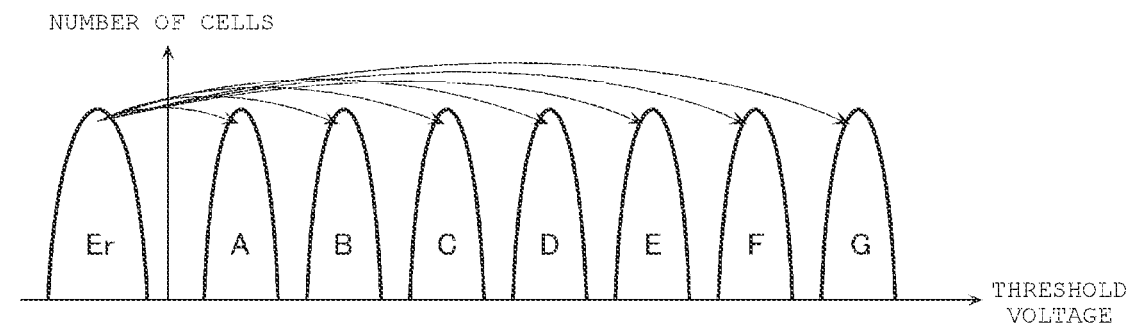
FIGS. 35A and 35B are schematic histograms illustrating aspects of a semiconductor memory device according to a comparative example.
Figure 35B:

Next, a case where the sub block mode write operation X, which is different from the present embodiment, is performed on the selected sub block SBLK$_S$ of the semiconductor memory device according to a comparative example, will be described. FIGS. 35A and 35B are schematic histograms illustrating a semiconductor memory device according to the comparative example. The horizontal axis indicates a voltage of the word line WL, and the vertical axis indicates the number of memory cells MC.

The sub block mode write operation X does not determine whether the unselected sub block SBLK$_U$ is in the erased state. The program operation, which is executed in the sub block mode write operation X, supplies the write pass voltage V$_{PASS4}$ to the word line WL of the unselected sub block SBLK$_U$ when the unselected sub block SBLK$_U$ is in either the erased state or the written state.

FIG. 35A shows a mode in which the selected sub block SBLK$_S$ is written by executing the sub block mode write operation X. In the selected sub block SBLK$_S$, the memory cells MC in the Er state are each written in the A state to the G state by executing the sub block mode write operation X.

FIG. 35B shows a mode in which the threshold voltage of the memory cell MC that is written in the Er state of the unselected sub block SBLK$_U$ rises by executing the sub block mode write operation X. Even when the unselected sub block SBLK$_U$ is in the erased state, similar to the written state, when a relatively high write pass voltage V$_{PASS4}$ is supplied to the word line WL of the unselected sub block SBLK$_U$, a relatively high voltage is supplied between the gate electrode and the channel region of the memory cell MC in the unselected sub block SBLK$_U$, and the electron tunnels through the tunnel insulating film 131, and then such erroneous writing may occur.

Effects

The semiconductor memory device according to the present embodiment determines whether the unselected sub block SBLK$_U$ is in the erased state at the time of performing the sub block mode write operation. When the unselected sub block SBLK$_U$ is in the written state, the write pass voltage V$_{PASS4}$ is supplied to the word line WL of the unselected sub block SBLK$_U$. When the unselected sub block SBLK$_U$ is in the erased state, the write pass voltage V$_{PASSL}$ which is lower than the write pass voltage V$_{PASS4}$, is supplied to the word line WL of the unselected sub block SBLK$_U$.

In such a case, when the unselected sub block SBLK$_U$ is in the erased state, a relatively low write pass voltage V$_{PASSL}$ is supplied between the gate electrode and the channel region of the memory cell MC in the unselected sub block SBLK$_U$. As a result, it becomes difficult for the electron to tunnel through the tunnel insulating film 131. Therefore, the erroneous writing to the unselected sub block SBLK$_U$ as described with reference to FIG. 35B can be prevented.

Modification 1

Next, Modification 1 of the semiconductor memory device according to the second embodiment will be described with reference to FIG. 36. FIG. 36 is a flowchart illustrating Modification 1 of the second embodiment.

The semiconductor memory device according to the present modification is basically configured in the similar manner to the semiconductor memory device according to the second embodiment. In the semiconductor memory device according to the present modification, the controller die CD includes a register or the like that records the erased state and written state in a unit of a sub block. The semiconductor memory device according to the present modification performs a sub block mode write operation 2 (FIG. 36) instead of the sub block mode write operation 1 (FIG. 31).

Sub Block Mode Write Operation 2

In step S211, it is determined whether the unselected sub block SBLK$_U$ is in the erased state. When the unselected sub block SBLK$_U$ is in the erased state, the process proceeds to step S212, and when the unselected sub block SBLK$_U$ is not in the erased state, the process proceeds to step S213. The erased state and written state of the unselected sub block SBLK$_U$ are determined based on a register value or the like that is provided in the controller die CD and the like.

In step S212, the controller die CD sequentially inputs the command data Cmd for an instruction of the above-described selected sub block write operation 1 and the address data Add to the memory die MD. As a result, the selected sub block write operation 1 is executed in the memory die MD, and the write operation is performed on the write memory cell MC of the selected sub block SBLK$_S$.

In step S213, the controller die CD sequentially inputs the command data Cmd for an instruction of the above-described selected sub block write operation 2 and the address data Add to the memory die MD. As a result, the selected sub block write operation 2 is executed in the memory die MD, and the write operation is performed on the write memory cell MC of the selected sub block SBLK$_S$.

Modification 2

Next, Modification 2 of the semiconductor memory device according to the second embodiment will be described with reference to FIGS. 37, and 38. FIG. 37 is a flowchart illustrating Modification 2 of the second embodiment.

The semiconductor memory device according to the present modification is basically configured in the similar manner to the semiconductor memory device according to the second embodiment. The semiconductor memory device according to the present modification performs a sub block mode write operation 3 (FIG. 37) instead of the sub block mode write operation 1 (FIG. 31).

Sub Block Mode Write Operation 3

In step S221, it is determined whether the selected sub block SBLK$_S$ is in the erased state. When the selected sub block SBLK$_S$ is in the erased state, the process proceeds to step S222, and when the unselected sub block SBLK$_U$ is not in the erased state, the process proceeds to step S223. As for the method of determining the erased state of the unselected sub block SBLK$_U$, the same method as in the first embodiment may be used, or the determination may be made based on the register value that is provided in the controller die CD or the like.

In step S222, the selected sub block erasing operation 2 (FIG. 24) is executed, and the erasing operation is performed on the selected sub block SBLK$_S$.

In step S223, it is determined whether the selected sub block SBLK$_S$ is in a partial-written state (a less than fully written state). When the selected sub block SBLK$_S$ is in the partial-written state, the process proceeds to step S224. When the selected sub block SBLK$_S$ is not in the partial-written state, the selected sub block SBLK$_S$ is in a fully written state, so the sub block mode write operation 3 is ended.

In step S224, a selected sub block erasing operation 5, which will be described later, is executed.

In step S225, the sub block mode write operation 1 (FIG. 31) is executed, and the write operation is performed on the selected sub block SBLK$_S$.

Selected Sub Block Erasing Operation 5

The selected sub block erasing operation 5 is basically executed in the same manner as the selected sub block erasing operation 1. The erasing voltage supply operation, which is executed in the selected sub block erasing operation 5, is different from the erasing voltage supply operation, which is executed in the selected sub block erasing operation 1.

Figure 38:
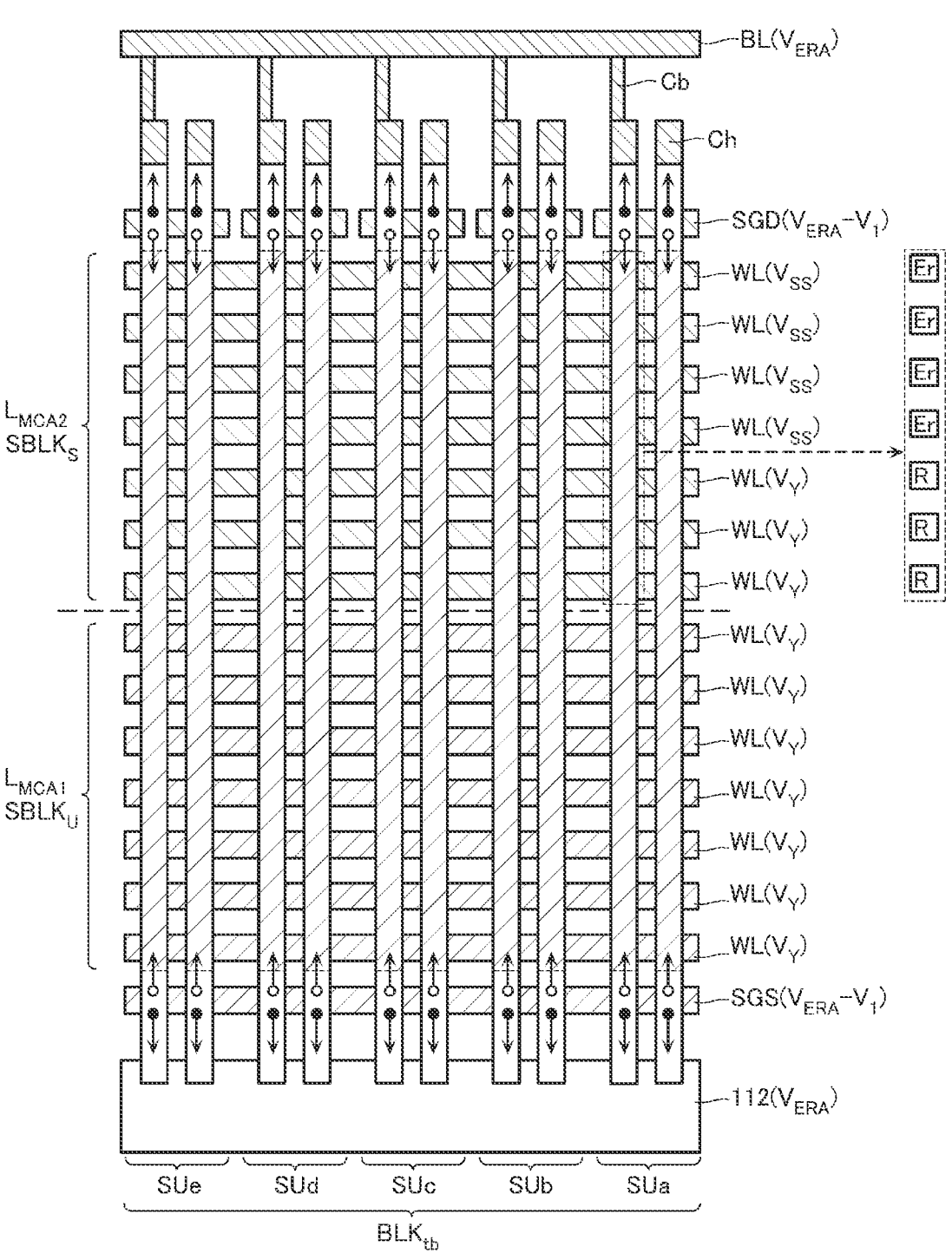
FIG. 38 is a schematic cross-sectional view illustrating aspects of Modification 2 of a semiconductor memory device according to the second embodiment.

FIG. 38 is a schematic cross-sectional view illustrating the erasing voltage supply operation executed in the selected sub block erasing operation 5. FIG. 38 shows an example in which the memory cell array layer L$_{MCA2}$ includes the selected sub block SBLK$_S$, and the memory cell array layer L$_{MCA1}$ includes the unselected sub block SBLK$_U$.

FIG. 38 shows a state of the memory cell MC when the normal write direction NOP is partially performed on the selected sub block SBLK$_S$ as an example in which the selected sub block SBLK$_S$ is in the partial-written state. In the example shown in FIG. 38, the pages PG corresponding to the first to third word lines WL from the bottom of the selected sub block SBLK$_S$ are in the written state "R", and the pages PG corresponding to the word lines WL located above the third from the top are in the erased state "Er".

The erasing voltage supply operation, which is executed in the selected sub block erasing operation 5, is basically the same operation as the erasing voltage supply operation (FIG. 24), which is executed in the selected sub block erasing operation 2. However, in the erasing voltage supply operation performed in the selected sub block erasing operation 5, the unselect erasing voltage V$_Y$ is supplied to the word line WL, which is provided in the selected sub block SBLK$_S$ and which corresponds to the page PG in the written state "R", and the ground voltage V$_{SS}$ is supplied to the word line WL that corresponds to the page PG in the erased state "Er".

As a result, a voltage necessary for erasing is supplied to the memory cell MC in the page PG, which is provided in the selected sub block SBLK$_S$ and which is in the erased state "Er". However, the data in the memory cells MC, which is in the page PG that is provided in the selected sub block SBLK$_S$ and that is in the written state "R", and the data in the memory cell MC in the unselected sub block SBLK$_U$ are not erased.

Effects

Even when the selected sub block SBLK S is determined to be in the erased state in step S221, the threshold voltages of a part of memory cells MC provided in the selected sub block SBLK$_S$ may be higher than the erasing verification voltage V$_{VFYEr}$ due to the erroneous writing or the like. Even in such a case, by using step S222, the threshold voltages of the memory cells MC in the selected sub block SBLK$_S$ can have a normal threshold voltage distribution corresponding to the Er state.

The threshold value of the memory cell MC, which is in the page PG in the erased state "Er" provided in the selected sub block SBLK S of the partial-written state, may be higher than the erasing verification voltage V$_{VFYEr}$ due to the erroneous writing. Even in such a case, by using step S224, the threshold voltages of the memory cells MC, which is in the page PG that is provided in the selected sub block SBLK$_S$ and that is in the erased state "Er", can have a normal threshold voltage distribution corresponding to the Er state.

As described above, by setting the threshold voltages of the memory cells MC in the page PG in the erased state "Er" to a normal threshold voltage distribution corresponding to the Er state before executing the sub block mode write operation 1, the threshold voltage distribution of the memory cells MC when the sub block mode write operation 1 is performed can be controlled more accurately.

Third Embodiment

Next, a semiconductor memory device according to a third embodiment will be described. The semiconductor memory device according to the present embodiment is basically configured in the similar manner to the semiconductor memory device according to the first embodiment. The semiconductor memory device according to the third embodiment is configured to execute the sub block mode read operation 1, the sub block mode write verification operation, and the sub block mode erasing verification operation. In the following description, the description of the same configuration and operation as those of the first embodiment may be omitted.

Sub Block Mode Read Operation 1

FIG. 39 is a flowchart illustrating a sub block mode read operation 1.

In step S301, it is determined whether the unselected sub block SBLK$_U$ is in the erased state. When the unselected sub block SBLK$_U$ is in the erased state, the process proceeds to step S302, and when the unselected sub block SBLK$_U$ is not in the erased state, the process proceeds to step S303. The same method as in the first embodiment is used for a method of determining the erased state of the unselected sub block SBLK$_U$.

In step S302, a selected sub block read operation 1 is executed.

In step S303, a selected sub block read operation 2 executed.

Selected Sub Block Read Operation 1

Figure 40:
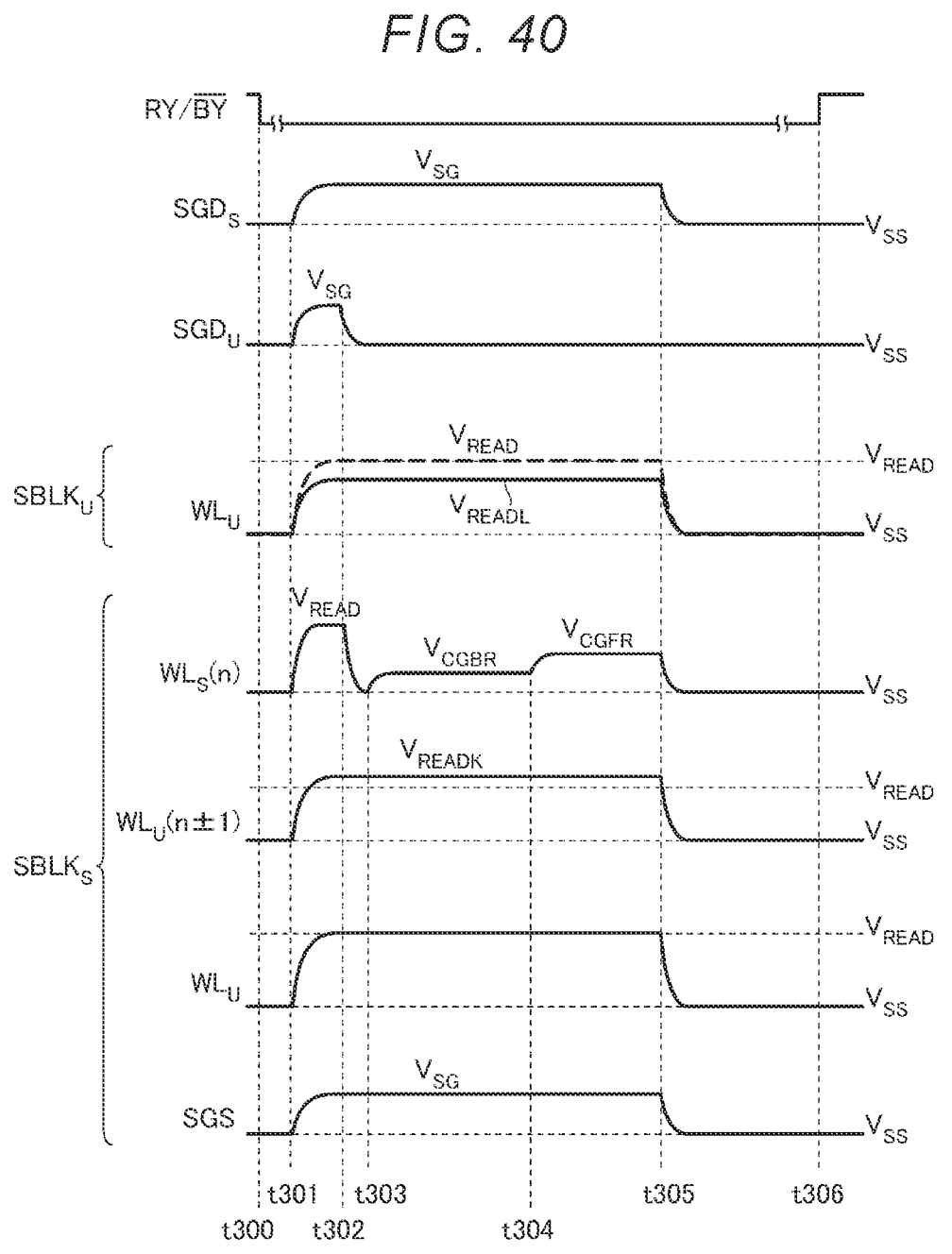

FIG. 40 is a timing chart illustrating the selected sub block read operation 1 and the selected sub block read operation 2. In FIG. 40, waveforms, which are common to the selected sub block read operation 1 and the selected sub block read operation 2, are indicated by solid lines. In FIG. 40, when the waveform of the selected sub block read operation 2 is different from that of the selected sub block read operation 1, the waveform of the selected sub block read operation 2 is indicated by a broken line. In the following description, description of operations similar to the read operations described with reference to FIGS. 11 and 12 may be omitted.

Figure 41:
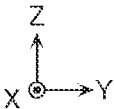
FIG. 41 is a schematic cross-sectional view illustrating aspects of a semiconductor memory device according to the third embodiment.

FIG. 41 is a schematic cross-sectional view illustrating the selected sub block read operation 1. FIG. 41 shows an example in which in the select memory block BLK$_{tb}$, the memory cell array layer $L_{MCA2}$ includes the unselected sub block $SBLK_U$, and the memory cell array layer $L_{MCA1}$ includes the selected sub block $SBLK_S$.

The selected sub block read operation 1 is an operation of reading the data in the memory cell MC of the selected page PG of the selected sub block $SBLK_S$ when the memory cells MC of the unselected sub block $SBLK_U$ are in the erased state.

At a timing t300 of the selected sub block read operation 1, as shown in FIG. 40, the terminal RY/(/BY) enters a period in the "L" state (a busy period) as the selected sub block read operation 1 is started.

At timings t300 to t301 of the selected sub block read operation 1, the same operations as the timings t100 to t101 of the read operation (FIG. 11) are performed.

At the timing t301 of selected sub block read operation 1, basically, the same voltage as at the timing t101 of the read operation (FIG. 11) is supplied. A read pass voltage $V_{READL}$, which is lower than the read pass voltage $V_{READ}$, is supplied to the unselected word line $WL_U$ of the unselected sub block $SBLK_U$.

At timings t302 to t306 of the selected sub block read operation 1, the same operations as the timings t102 to t106 of the read operation (FIG. 11) are performed.

Selected Sub Block Read Operation 2

Figure 42:
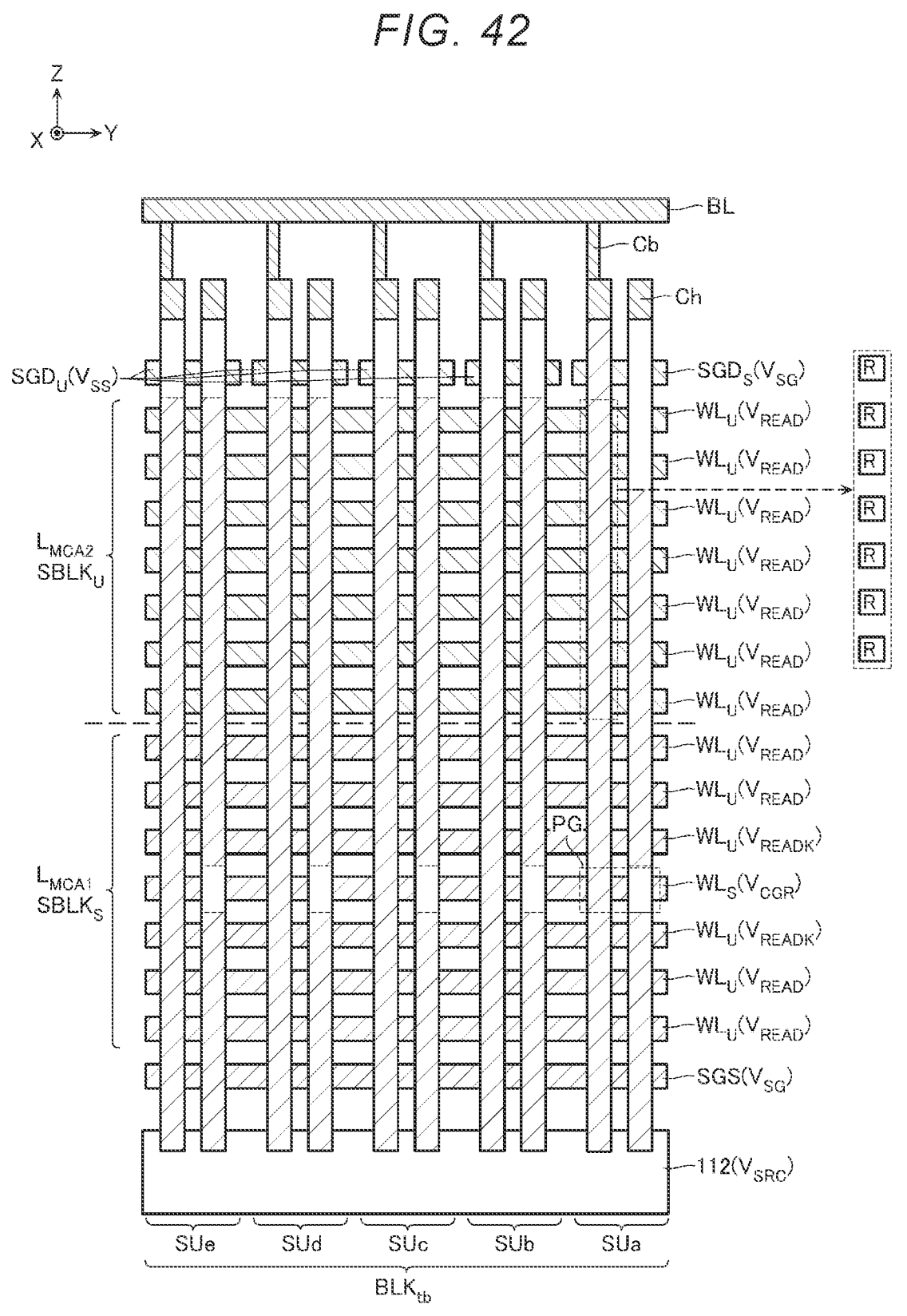

FIG. 42 is a schematic cross-sectional view illustrating the selected sub block read operation 2. As in FIG. 41, FIG. 42 shows an example in which the memory cell array layer $L_{MCA2}$ includes the unselected sub block $SBLK_U$, and the memory cell array layer $L_{MCA1}$ includes the selected sub block $SBLK_S$.

The selected sub block read operation 2 is an operation of reading the data in the memory cells MC of the selected page PG of the selected sub block $SBLK_S$ when the memory cells MC of the unselected sub block $SBLK_U$ are in the written state.

At timings t300 to t301 of the selected sub block read operation 2, the same operations as the timings t300 to t301 of the selected sub block read operation 1 are performed.

At the timing t301 of the selected sub block read operation 2, basically the same voltage as at the timing t301 of the selected sub block read operation 1 is supplied. The read pass voltage $V_{READ}$ is supplied to the unselected word line $WL_U$ of the unselected sub block $SBLK_U$ instead of the read pass voltage $V_{READL}$.

At timings t302 to t306 of the selected sub block read operation 2, the same operations as the timings t102 to t106 of the selected sub block read operation 1 are performed.

Sub Block Mode Write Verification Operation

The sub block mode write verification operation is, for example, a verification operation that is performed after executing the program operation with respect to the selected sub block $SBLK_S$. The program operation with respect to the selected sub block $SBLK_S$ may be executed in the same manner as any of the program operations exemplified in the second embodiment.

A case where the write operation on the selected sub block $SBLK_S$ includes steps similar to those of the write operation described with reference to FIG. 13 will be explained.

In the sub block mode write verification operation, a sub block write verification operation 1 or a sub block write verification operation 2 is executed instead of the verification operation in step S103 of FIG. 13. The sub block write verification operation 1 is executed when the unselected sub block $SBLK_U$ is in the erased state. The sub block write verification operation 2 is executed when the unselected sub block $SBLK_U$ is in the written state.

The sub block write verification operation 1 is basically the same operation as the selected sub block read operation 1 described with reference to FIG. 41. The sub block write verification operation 1 supplies verification voltages $V_{VFYA}$ to $V_{VFYG}$ to the selected word line $WL_S$ instead of a predetermined read voltage $V_{CGR}$.

The sub block write verification operation 2 is basically the same operation as the selected sub block read operation 2 described with reference to FIG. 42. The sub block write verification operation 2 supplies verification voltages $V_{VFYA}$ to $V_{VFYG}$ to the selected word line $WL_S$ instead of a predetermined read voltage $V_{CGR}$.

Sub Block Mode Erasing Verification Operation

The sub block mode erasing verification operation is, for example, an erasing verification operation that is performed after executing the erasing voltage supply operation with respect to the selected sub block $SBLK_S$. The erasing voltage supply operation with respect to the selected sub block $SBLK_S$ may be executed in the same manner as any of the erasing voltage supply operations exemplified in the first embodiment.

A case where the erasing operation on the selected sub block $SBLK_S$ includes steps similar to those of the erasing operation described with reference to FIG. 16 will be explained.

In the sub block mode erasing verification operation, a sub block erasing verification operation 1 or a sub block erasing verification operation 2 is executed instead of the erasing verification operation in step S113 of FIG. 16. The sub block erasing verification operation 1 is executed when the unselected sub block $SBLK_U$ is in the erased state. The sub block erasing verification operation 2 is executed when the unselected sub block $SBLK_U$ is in the written state.

The sub block erasing verification operation 1 is basically the same operation as the selected sub block read operation 1 described with reference to FIG. 41. The sub block erasing verification operation 1 supplies the erasing verification voltage $V_{VFYEr}$ (FIG. 19) to all the word lines WL of the selected sub block $SBLK_S$ and supplies the read pass voltage $V_{READL}$ to all the unselected word lines $WL_U$ of the unselected sub block $SBLK_U$.

The sub block erasing verification operation 2 is basically the same operation as the selected sub block read operation 2 described with reference to FIG. 42. The sub block erasing verification operation 2 supplies the erasing verification voltage $V_{VFYEr}$ (FIG. 19) to all the word lines WL of the selected sub block $SBLK_S$ and supplies the read pass voltage $V_{READ}$ to all the unselected word lines $WL_U$ of the unselected sub block $SBLK_U$.

Comparative Example

Figure 43A:
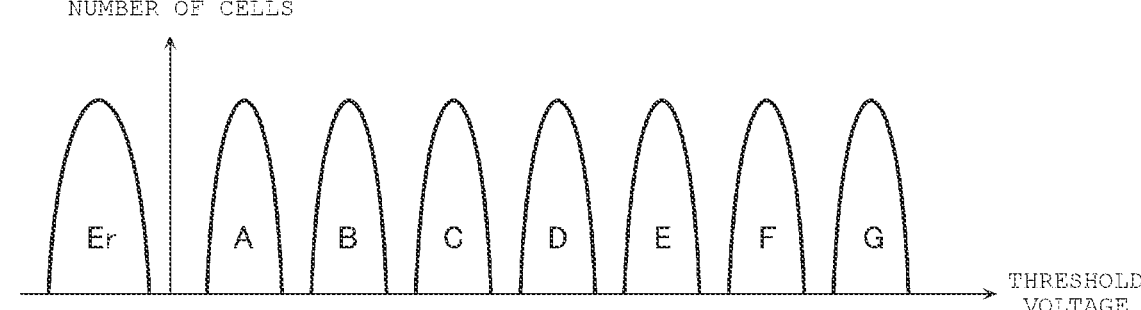
FIGS. 43A and 43B are schematic histograms illustrating aspects of a semiconductor memory device according to a comparative example.
Figure 43B:

Next, a case where the sub block mode read operation X, which is different from the present embodiment, is performed on the selected sub block $SBLK_S$ of the semiconductor memory device according to a comparative example, will be described. FIGS. 43A and 43B are schematic histograms illustrating a semiconductor memory device according to the comparative example. The horizontal axis indicates a voltage of the word line WL, and the vertical axis indicates the number of memory cells MC.

The sub block mode read operation X does not determine whether the unselected sub block $SBLK_U$ is in the erased state. The sub block mode read operation X supplies the read pass voltage $V_{READ}$ to the unselected word line $WL_U$ of the unselected sub block $SBLK_U$ when the unselected sub block $SBLK_U$ is in either the erased state or the read state.

FIG. 43A shows the threshold voltage distribution of the memory cells MC in the selected sub block SBLK$_S$ read by executing the sub block mode read operation X. In the selected sub block SBLK$_S$, the memory cells MC in the Er state to the G state are each read by executing the sub block mode read operation X.

FIG. 43B shows a mode in which the threshold value of the memory cell MC that is in the Er state of the unselected sub block SBLK$_U$ rises by executing the sub block mode read operation X. Even when the unselected sub block SBLK$_U$ is in the erased state, similar to the written state, when a relatively high read pass voltage V$_{READ}$ is supplied to the word line WL of the unselected sub block SBLK$_U$, a relatively high voltage is supplied between the gate electrode and the channel region of the memory cell MC in the unselected sub block SBLK$_U$, and the electron tunnels through the tunnel insulating film 131, and then such erroneous writing may occur.

Effects

The semiconductor memory device according to the present embodiment determines whether the unselected sub block SBLK$_U$ is in the erased state at the time of performing the sub block mode read operation. When the unselected sub block SBLK$_U$ is in the written state, the read pass voltage V$_{READ}$ is supplied to the word line WL of the unselected sub block SBLK$_U$. When the unselected sub block SBLK$_U$ is in the erased state, the read pass voltage V$_{READL}$, which is lower than the read pass voltage V$_{READ}$, is supplied to the word line WL of the unselected sub block SBLK$_U$.

In such a case, when the unselected sub block SBLK$_U$ is in the erased state, a relatively low read pass voltage V$_{READL}$ is supplied between the gate electrode and the channel region of the memory cell MC in the unselected sub block SBLK$_U$. As a result, it becomes difficult for the electron to tunnel through the tunnel insulating film 131. Therefore, the erroneous writing to the unselected sub block SBLK$_U$ as described with reference to FIG. 43B can be prevented.

In the semiconductor memory device according to the present embodiment, even in the sub block mode write verification operation and the sub block mode erasing verification operation, the erroneous writing to the unselected sub block SBLK$_U$ can be prevented as in the sub block mode read operation 1.

Figure 44:
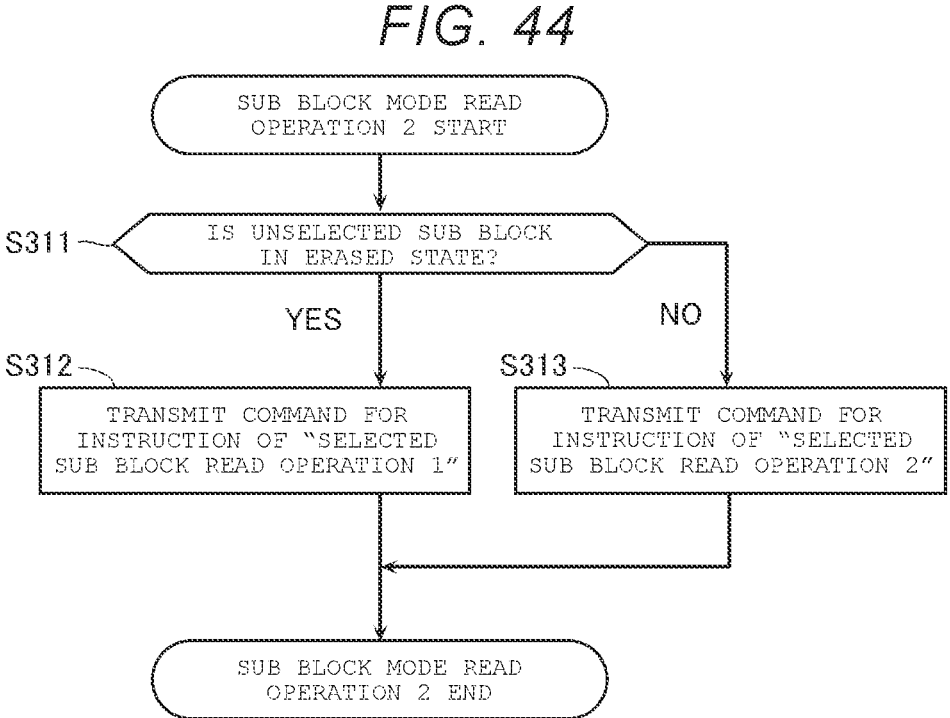
FIG. 44 is a flowchart illustrating a modification of a semiconductor memory device according to the third embodiment.

In the semiconductor memory device according to the present embodiment, when the unselected sub block SBLK$_U$ is in the erased state, by supplying a relatively low read pass voltage V$_{READL}$ to the word line WL, a large current can be prevented from flowing through the channel.
Modification Next, a modification of the semiconductor memory device according to the third embodiment will be described with reference to FIG. 44. FIG. 44 is a flowchart illustrating the modification of the third embodiment.

The semiconductor memory device according to the present modification is basically configured in the similar manner to the semiconductor memory device according to the third embodiment. In the semiconductor memory device according to the present modification, the controller die CD includes a register or the like that records the erased state and written state in a unit of a sub block. The semiconductor memory device according to the present modification performs a sub block mode read operation 2 (FIG. 44) instead of the sub block mode read operation 1 (FIG. 39).

Sub Block Mode Read Operation 2

In step S311, it is determined whether the unselected sub block SBLK$_U$ is in the erased state. When the unselected sub block SBLK$_U$ is in the erased state, the process proceeds to step S312, and when the unselected sub block SBLK$_U$ is not in the erased state, the process proceeds to step S313. The erasing/written state of the unselected sub block SBLK$_U$ are determined based on a register value or the like that is provided in the controller die CD and the like.

In step S312, the controller die CD sequentially inputs the command data Cmd for an instruction of the selected sub block read operation 1 and the address data Add to the memory die MD. As a result, the selected sub block read operation 1 is executed in the memory die MD, and the data in the memory cells MC of the selected page PG in the selected sub block SBLK$_S$ is read.

In step S313, the controller die CD sequentially inputs the command data Cmd for an instruction of the above-described selected sub block read operation 2 and the address data Add to the memory die MD. As a result, the selected sub block read operation 2 is executed in the memory die MD, and the data in the memory cells MC of the selected page PG in the selected sub block SBLK$_S$ is read.

Fourth Embodiment

Next, a semiconductor memory device according to a fourth embodiment will be described. The semiconductor memory device according to the present embodiment is basically configured in the similar manner to the semiconductor memory device according to the first embodiment. However, the semiconductor memory device according to the fourth embodiment is configured to execute a sub block mode write operation 4. In the following description, the description of the same configuration and operation as those of the first embodiment may be omitted.
Sub Block Mode Write Operation 4

Next, the sub block mode write operation 4 will be described with reference to FIGS. 45, 46A, and 46B. FIG. 45 is a flowchart illustrating the sub block mode write operation 4. FIGS. 46A and 46B are schematic views illustrating the sub block mode write operation 4. FIGS. 46A and 46B show a plurality of word lines WL0 to WL111 numbered from 0 from the bottom and the memory cells MC corresponding to the plurality of word lines WL0 to WL111.

For example, as shown in FIGS. 46A and 46B, the sub block mode write operation 4 is performed when the memory cell array layer L$_{MCA2}$ includes the selected sub block SBLK$_S$ and the memory cell array layer L$_{MCA1}$ includes the unselected sub block SBLK$_U$. FIG. 46A shows a case where the page PG in the unselected sub block SBLK$_U$ is in the erased state "Er", and FIG. 46B shows a case where the page PG in the unselected sub block SBLK$_U$ is in the written state "R".

In step S401, it is determined whether the unselected sub block SBLK$_U$ is in the erased state. When the unselected sub block SBLK$_U$ is in the erased state, the process proceeds to step S402, and when the unselected sub block SBLK$_U$ is not in the partial-written state, the process proceeds to step S403. The same method as in the first embodiment may be used for a method of determining the erased state of the unselected sub block SBLK$_U$, and the erasing/written state of the unselected sub block SBLK$_U$ may be determined based on a register value or the like provided in the controller die CD or the like.

In step S402, the write operation is performed on the selected sub block SBLK$_S$ by using the reverse write direction ROP. FIG. 46A shows a mode in which the pages PG corresponding to the first to third word lines WL from the top are in the written state "R".

In step S403, the write operation is performed on the selected sub block SBLK$_S$ by using the normal write direction NOP. FIG. 46B shows a mode in which the pages PG corresponding to the first to third word lines WL from the bottom are in the written state "R".

Effects

The semiconductor memory device according to the present embodiment can optimally control a writing direction of the selected sub block SBLK$_S$ based on whether the memory cell array layer L$_{MCA1}$, which is the unselected sub block SBLK$_U$, is in the erased state.

Fifth Embodiment

Next, a semiconductor memory device according to a fifth embodiment will be described. The semiconductor memory device according to the present embodiment is basically configured in the similar manner to the semiconductor memory devices according to the first to third embodiments. The semiconductor memory device according to the fifth embodiment includes three sub blocks instead of two sub blocks like the semiconductor memory devices according to the first to third embodiments.

For example, the semiconductor memory device according to the fifth embodiment may further include a memory cell array layer L$_{MCA3}$ provided above the memory cell array layer L$_{MCA2}$, in the memory cell array layer L$_{MCA}$ (FIG. 6). The memory cell array layer L$_{MCA3}$ is configured in the same manner as the memory cell array layer L$_{MCA1}$ and the memory cell array layer L$_{MCA2}$. In such a case, the memory cell array layer L$_{MCA1}$, the memory cell array layer L$_{MCA2}$, and the memory cell array layer L$_{MCA2}$ correspond to three sub blocks.

Next, an operation of the semiconductor memory device according to the fifth embodiment will be described with reference to FIG. 47.

Figure 47:
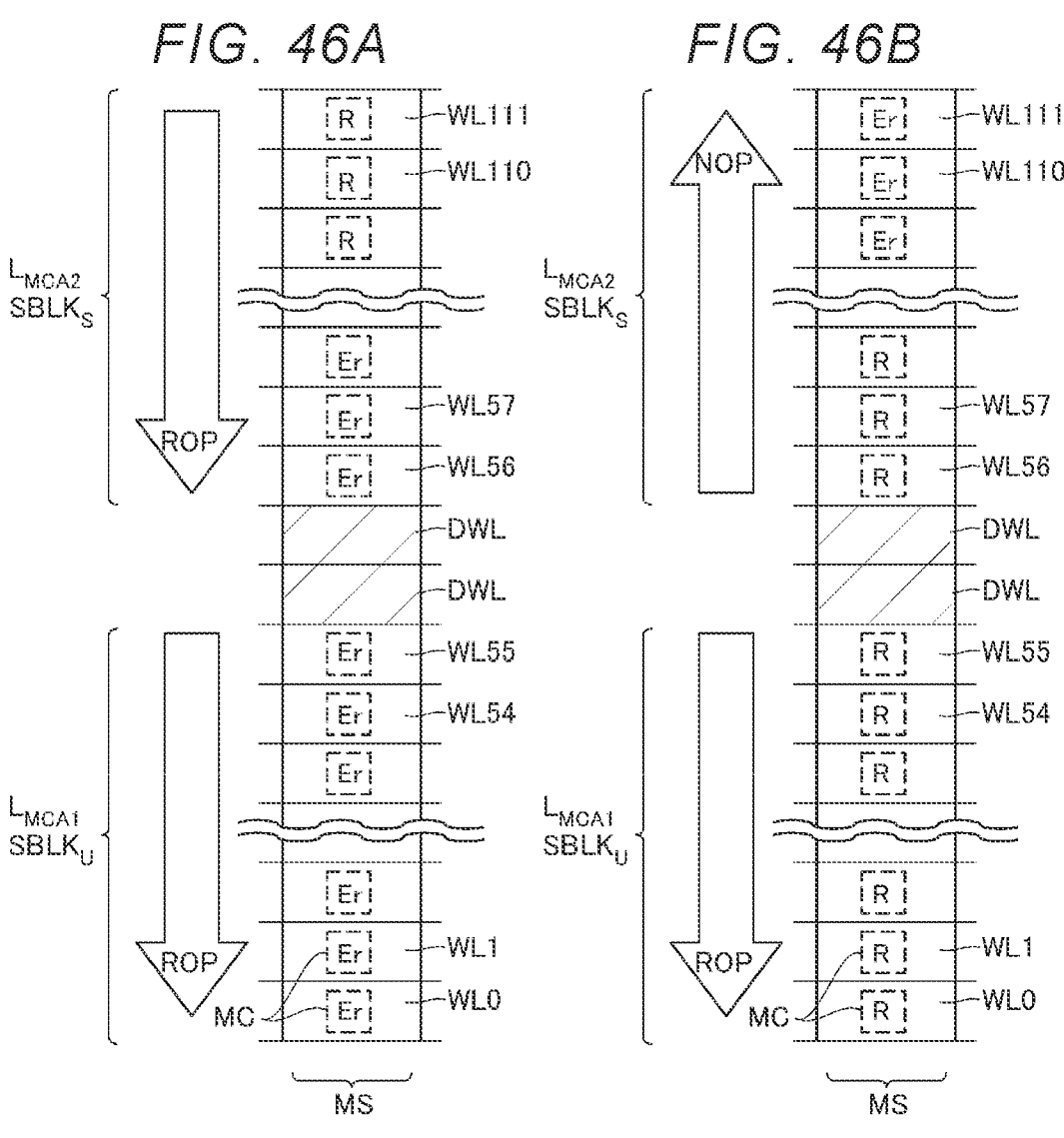
FIG. 47 is a table illustrating aspects of a semiconductor memory device according to a fifth embodiment.

In FIG. 47, when the memory cell array layer L$_{MCA2}$ includes the selected sub block SBLK$_S$ and the memory cell array layer L$_{MCA1}$ and the memory cell array layer L$_{MCA3}$ include the unselected sub blocks SBLK$_U$, the memory cell array layer L$_{MCA1}$ and the memory cell array layer L$_{MCA3}$ are classified according to whether each of the memory cell array layers is in the erased state or the written state, and the memory cell array layer L$_{MCA1}$ and the memory cell array layer L$_{MCA3}$ are indicated as patterns 1 to 3, respectively.

The pattern 1 is a case where the memory cell array layer L$_{MCA1}$ and the memory cell array layer L$_{MCA3}$ are in the erased state. The pattern 2 is a case where the memory cell array layer L$_{MCA1}$ is in the written state, and the memory cell array layer L$_{MCA3}$ is in the erased state. The pattern 3 is a case where the memory cell array layer L$_{MCA1}$ and the memory cell array layer L$_{MCA3}$ are in the written state. In this way, even when there are two or more unselected sub blocks SBLK$_U$, the sub block mode erasing operation 1 (FIG. 20), the sub block mode write operation 1 (FIG. 31), the sub block mode read operation 1 (FIG. 39), and the like described in the first to third embodiments can be applied.

For example, in the sub block mode erasing operation 1 (FIG. 20), when each unselected sub block SBLK$_U$ is in the erased state, the unselect erasing voltage V$_X$ may be supplied to each of the word lines WL of the unselected sub blocks SBLK$_U$. When each unselected sub block SBLK$_U$ is in the written state, the unselect erasing voltage V$_Y$, which is higher than the unselect erasing voltage V$_X$, may be supplied to each of the word lines WL of the unselected sub blocks SBLK$_U$.

For example, in the sub block mode write operation 1 (FIG. 31), when each unselected sub block SBLK$_U$ is in the written state, the write pass voltage V$_{PASS4}$ may be supplied to each of the word lines WL of the unselected sub blocks SBLK$_U$. When each unselected sub block SBLK$_U$ is in the erased state, the write pass voltage V$_{PASSL}$, which is lower than the write pass voltage V$_{PASS4}$, may be supplied to each of the word lines WL of the unselected sub blocks SBLK$_U$.

For example, in the sub block mode read operation 1 (FIG. 31), when each unselected sub block SBLK$_U$ is in the written state, the read pass voltage V$_{READ}$ may be supplied to each of the word lines WL of the unselected sub blocks SBLK$_U$. When each unselected sub block SBLK$_U$ is in the erased state, the read pass voltage V$_{READL}$, which is lower than the read pass voltage V$_{READ}$, may be supplied to each of the word lines WL of the unselected sub blocks SBLK$_U$.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
   a first sub memory block;
   a second sub memory block arranged with the first sub memory block along a first direction; and
   a bit line on a first side of the first sub memory block that is opposite from the second sub memory block in the first direction;
   a source line on a second side of the second sub memory block that is opposite from the first sub memory block in the first direction; and
   a control circuit configured to control operations on the first sub memory block and the second sub memory block, wherein
   the first sub memory block includes:
      a first memory cell that is electrically connected to the bit line and the source line, and
      a first word line that is electrically connected to the first memory cell,
   the second sub memory block includes:
      a second memory cell that is electrically connected to the bit line and the source line, and
      a second word line that is electrically connected to the second memory cell, and
   the control circuit is configured to:
      determine whether the second sub memory block is in a written state or an erased state,
      execute a first erasing operation on the first memory cell when the second sub memory block is determined to be in the written state, and
      execute a second erasing operation on the first memory cell when the second sub memory block is determined to be in the erased state,
      in the first erasing operation, the control circuit applies an erasing voltage to one or both of the bit line and the source line, a select erasing voltage, which is lower than the erasing voltage, to the first word line, and a first unselect erasing voltage, which is lower than the erasing voltage but higher than the select erasing voltage, to the second word line, and in the second erasing operation, the control circuit applies the erasing voltage to one or both of the bit line and the source line, the select erasing voltage to the first word line, and a second unselect erasing voltage, which is lower than the first unselect erasing voltage, to the second word line.

2. The semiconductor memory device according to claim 1, wherein the second unselect erasing voltage is equal to the select erasing voltage.

3. The semiconductor memory device according to claim 1, wherein the control circuit is configured to:

receive a command for an instruction of the first erasing operation to execute the first erasing operation, and receive a command for an instruction of the second erasing operation to execute the second erasing operation.

4. The semiconductor memory device according to claim 1, wherein the control circuit is configured to execute a read-before-erasing operation on the second memory cell before executing either of the first erasing operation or the second erasing operation, and the control circuit, in the read-before-erasing operation, applies a read voltage to the second word line and a first unselect read voltage, which is higher than the read voltage, to the first word line.

5. The semiconductor memory device according to claim 1, wherein the first sub memory block includes:

a plurality of first conductive layers that are arranged in the first direction, a first semiconductor portion that extends in the first direction and that faces the plurality of first conductive layers, and a first charge storage between the plurality of first conductive layers and the first semiconductor portion, the second sub memory block includes:

a plurality of second conductive layers that are arranged in the first direction, a second semiconductor portion that extends in the first direction in the plurality of second conductive layers, the second semiconductor portion being electrically connected to the first semiconductor portion, and a second charge storage film between the plurality of second conductive layers and the second semiconductor portion, one of the plurality of first conductive layers functions as the first word line, and one of the plurality of second conductive layers functions as the second word line.

6. The semiconductor memory device according to claim 5, further comprising:

a semiconductor pillar that extends in the first direction, wherein the semiconductor pillar includes:

the first semiconductor portion, the second semiconductor portion, and a third semiconductor portion that is between the first sub memory block and the second sub memory block and connected to the first semiconductor portion and the second semiconductor portion.

7. The semiconductor memory device according to claim 6, wherein, when a width of an end portion of the first semiconductor portion on a side of the third semiconductor portion in a second direction intersecting the first direction is defined as a first width, a width of an end portion of the second semiconductor portion on a side of the third semiconductor portion in the second direction is defined as a second width, and a width of the third semiconductor portion in the second direction is defined as a third width, the third width is larger than the first width and the second width.

* * * * *